United States Patent
Yamazaki et al.

(10) Patent No.: US 9,142,679 B2
(45) Date of Patent: Sep. 22, 2015

(54) METHOD FOR MANUFACTURING SEMICONDUCTOR DEVICE USING OXIDE SEMICONDUCTOR

(71) Applicant: Semiconductor Energy Laboratory Co., Ltd., Atsugi-shi, Kanagawa-ken (JP)

(72) Inventors: Shunpei Yamazaki, Setagaya (JP); Atsuo Isobe, Isehara (JP); Yoshinori Ieda, Fuchu (JP); Masaharu Nagai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 20 days.

(21) Appl. No.: 13/686,281

(22) Filed: Nov. 27, 2012

(65) Prior Publication Data
US 2013/0140554 A1 Jun. 6, 2013

(30) Foreign Application Priority Data

| Dec. 2, 2011 | (JP) | 2011-264973 |
| Dec. 2, 2011 | (JP) | 2011-265036 |
| Dec. 2, 2011 | (JP) | 2011-265158 |
| Dec. 26, 2011 | (JP) | 2011-283789 |

(51) Int. Cl.
*H01L 21/00* (2006.01)
*H01L 29/786* (2006.01)
*H01L 29/66* (2006.01)

(52) U.S. Cl.
CPC ........ *H01L 29/786* (2013.01); *H01L 29/66742* (2013.01); *H01L 29/66969* (2013.01); *H01L 29/7869* (2013.01)

(58) Field of Classification Search
CPC .............................. H01L 27/12; H01L 29/786
USPC .......................................................... 438/149
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 1998086 | 7/2007 |
| CN | 101140398 | 3/2008 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Ajay K Arora
(74) *Attorney, Agent, or Firm* — Eric J. Robinson; Robinson Intellectual Property Law Office, P.C.

(57) ABSTRACT

A semiconductor device including a minute transistor with a short channel length is provided. A gate insulating layer is formed over a gate electrode layer; an oxide semiconductor layer is formed over the gate insulating layer; a first conductive layer and a second conductive layer are formed over the oxide semiconductor layer; a conductive film is formed over the first conductive layer and the second conductive layer; a resist mask is formed over the conductive film by performing electron beam exposure; and then a third conductive layer and a fourth conductive layer are formed over and in contact with the first conductive layer and the second conductive layer, respectively, by selectively etching the conductive film.

17 Claims, 25 Drawing Sheets

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,955,907 | B2 | 6/2011 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0036072 | A1* | 2/2004 | Tsujimura et al. ............ 257/72 |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0105513 | A1 | 5/2006 | Afzali-Ardakani et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252210 | A1* | 11/2007 | Ishikawa ............ 257/347 |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0062344 | A1 | 3/2008 | Yoshimoto |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182082 | A1* | 7/2008 | Nakao ............ 428/195.1 |
| 2008/0182358 | A1 | 7/2008 | Cowdery-Corvan et al. |
| 2008/0224133 | A1 | 9/2008 | Park et al. |
| 2008/0230849 | A1 | 9/2008 | Afzali-Ardakani et al. |
| 2008/0246036 | A1 | 10/2008 | Yamazaki et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0269880 | A1 | 10/2009 | Itagaki et al. |
| 2009/0278122 | A1 | 11/2009 | Hosono et al. |
| 2009/0280600 | A1 | 11/2009 | Hosono et al. |
| 2010/0025675 | A1* | 2/2010 | Yamazaki et al. ............ 257/43 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0259296 | A1* | 10/2010 | Or-Bach ............ 326/38 |
| 2011/0092017 | A1 | 4/2011 | Akimoto et al. |
| 2011/0101351 | A1 | 5/2011 | Yamazaki |
| 2011/0114944 | A1 | 5/2011 | Yamazaki et al. |
| 2011/0156022 | A1 | 6/2011 | Yamazaki et al. |
| 2011/0180796 | A1 | 7/2011 | Yamazaki et al. |
| 2011/0193080 | A1 | 8/2011 | Yamazaki et al. |
| 2011/0248266 | A1* | 10/2011 | Miyake et al. ............ 257/57 |
| 2012/0280230 | A1 | 11/2012 | Akimoto et al. |
| 2013/0277895 | A1 | 10/2013 | Yamazaki et al. |
| 2015/0136594 | A1 | 5/2015 | Yamazaki et al. |

FOREIGN PATENT DOCUMENTS

| | | |
|---|---|---|
| EP | 1737044 A | 12/2006 |
| EP | 1898461 A | 3/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-216069 A | 8/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2005-244203 A | 9/2005 |
| JP | 2006-286772 A | 10/2006 |
| JP | 2008-066494 A | 3/2008 |
| JP | 2010-192660 A | 9/2010 |
| JP | 2011-109080 A | 6/2011 |
| JP | 2011-171702 | 9/2011 |
| KR | 2007-0012352 A | 1/2007 |
| KR | 2008-0023109 A | 3/2008 |
| KR | 2012-0074309 A | 7/2012 |
| KR | 2012-0088883 A | 8/2012 |
| TW | 200828450 | 7/2008 |
| TW | 201133851 | 10/2011 |

(56) References Cited

FOREIGN PATENT DOCUMENTS

| WO | WO-2004/114391 | 12/2004 |
|---|---|---|
| WO | WO-2005/071756 | 8/2005 |
| WO | WO-2011/048925 | 4/2011 |

OTHER PUBLICATIONS

Dembo.H et al., "RFCPUS on Glass and Plastic Substrates Fabricated by TFT Transfer Technology,", IEDM 05: Technical Digest of Interantional Electron Devices Meeting, Dec. 5, 2005, pp. 1067-1069.
Ikeda.T et al., "Full-Functional System Liquid Crystal Display Using CG-Silicon Technology,", SID Digest '04 : SID Intenational Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Physics Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4-ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID Intenational Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFts With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
International Search Report (Application No. PCT/JP2012/080412) Dated Feb. 5, 2013.
Written Opinion (Application No. PCT/JP2012/080412) Dated Feb. 5, 2013.
Ihun Song et al., "Short Channel Characteristics of Gallium—Indium—Zinc—Oxide Thin Film Transistors for Three-Dimensional Stacking Memory," IEEE Electron Device Letters, vol. 29, No. 6, Jun. 2008, pp. 549-552.
European Search Report (Application No. 12853565.5) Dated Jun. 17, 2015.

* cited by examiner

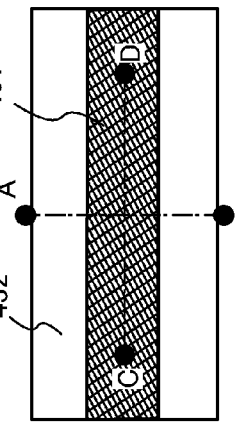
FIG. 4A1
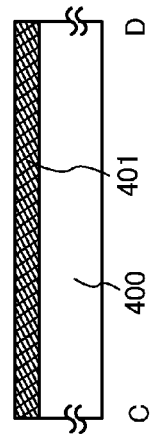
FIG. 4A2
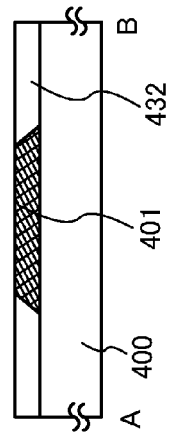
FIG. 4A3
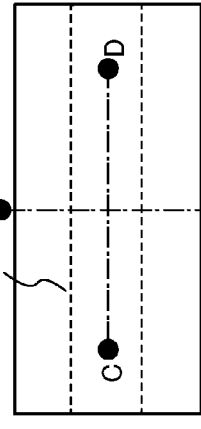
FIG. 4B1
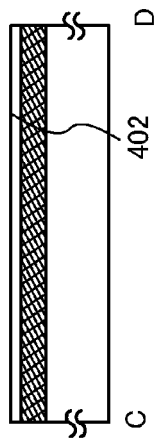
FIG. 4B2
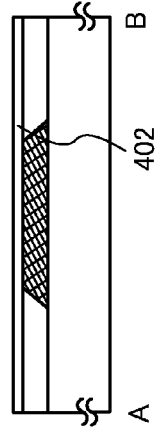
FIG. 4B3
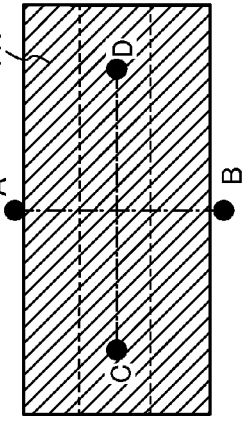
FIG. 4C1
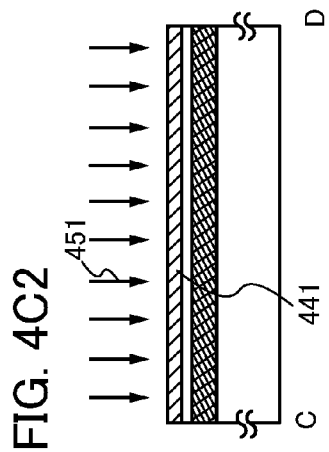
FIG. 4C2
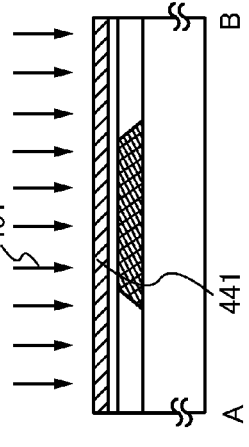
FIG. 4C3

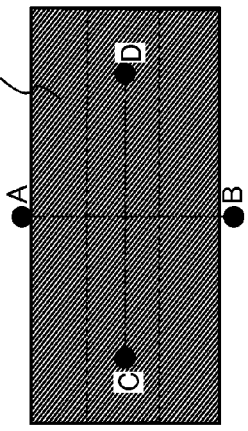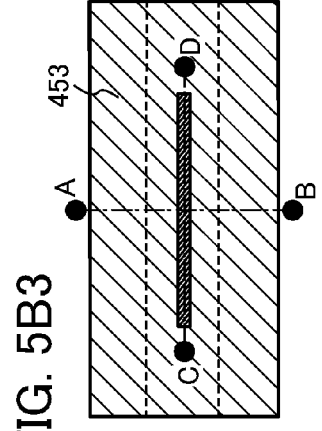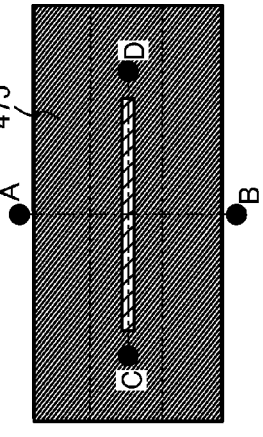
FIG. 5A3  FIG. 5B3  FIG. 5C3
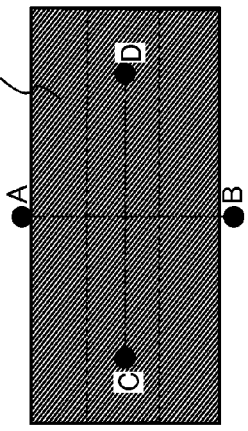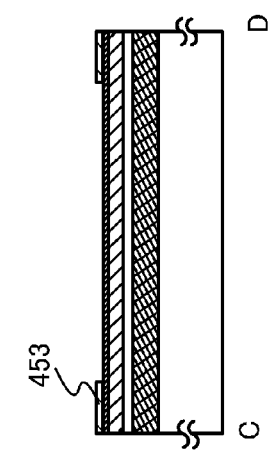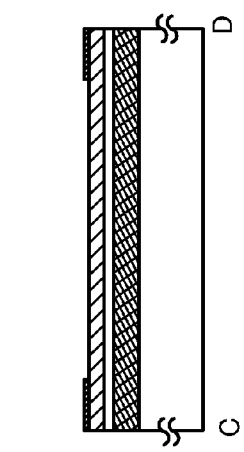
FIG. 5A2  FIG. 5B2  FIG. 5C2
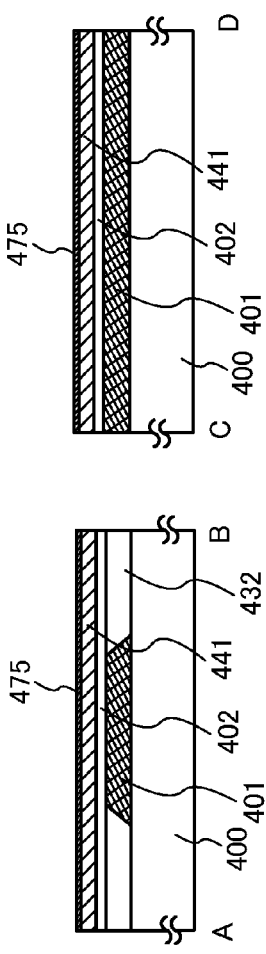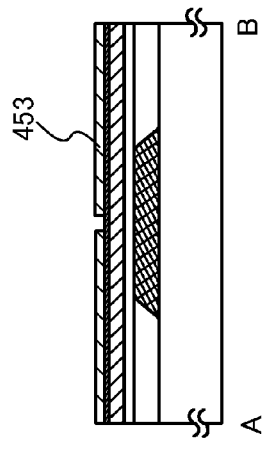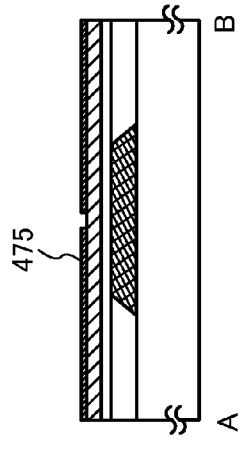
FIG. 5A1  FIG. 5B1  FIG. 5C1

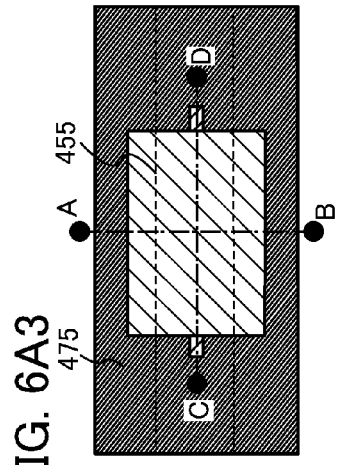
FIG. 6A1  FIG. 6A2  FIG. 6A3
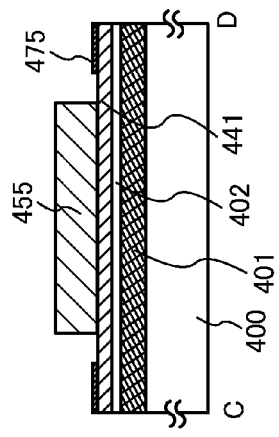
FIG. 6B1  FIG. 6B2  FIG. 6B3
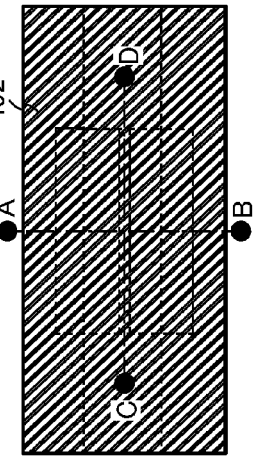
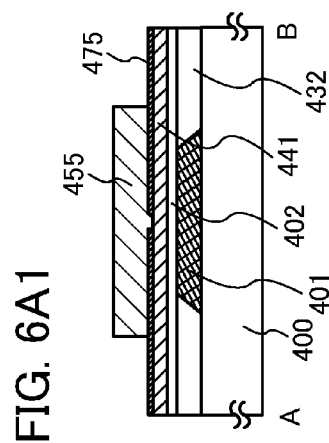
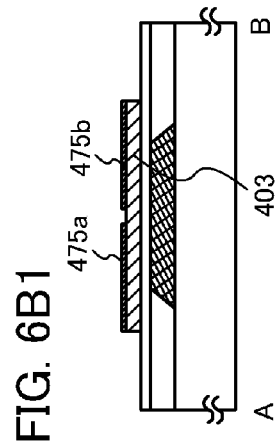
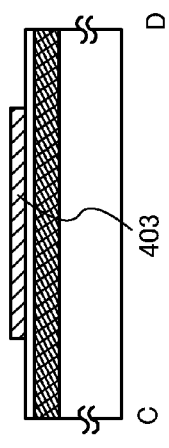
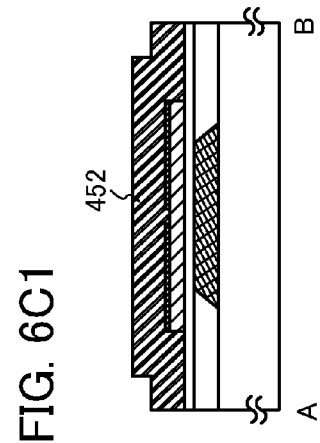
FIG. 6C1  FIG. 6C2  FIG. 6C3

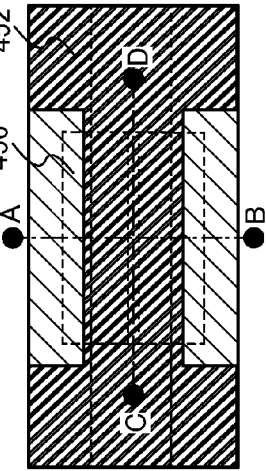
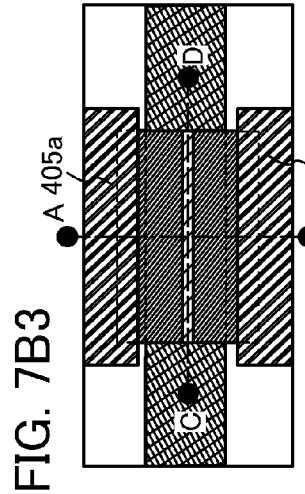
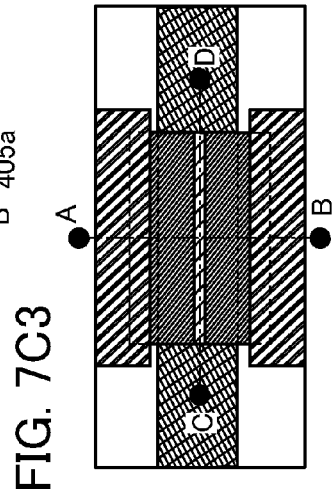
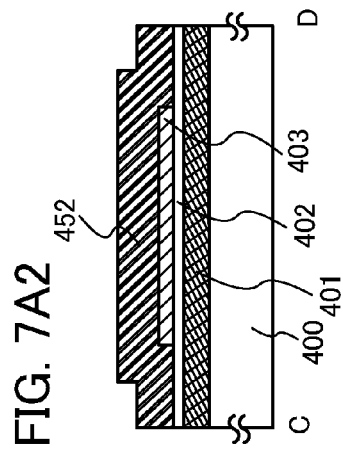
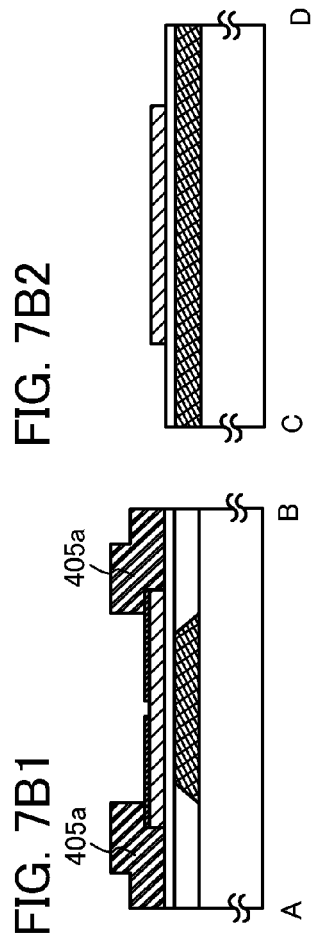
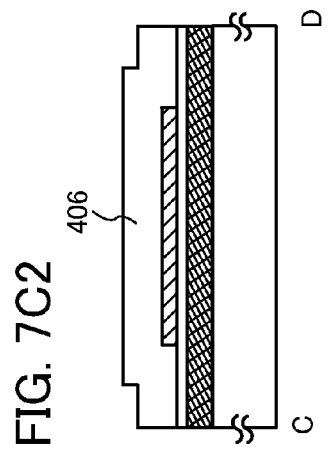
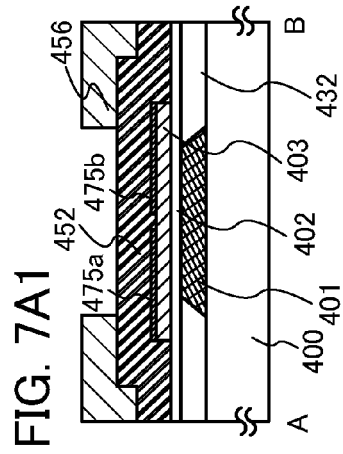

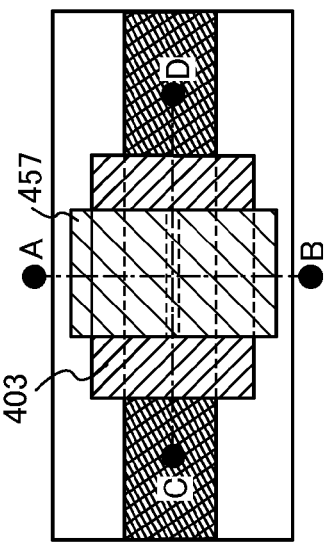
FIG. 16A3
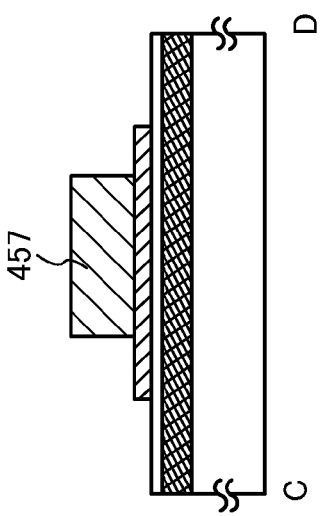
FIG. 16A2
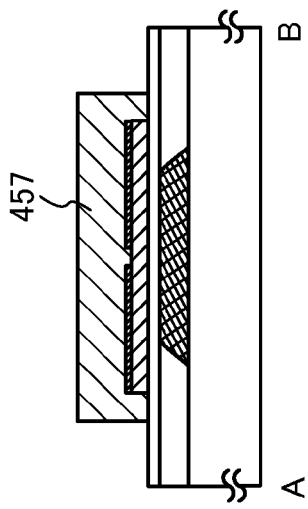
FIG. 16A1

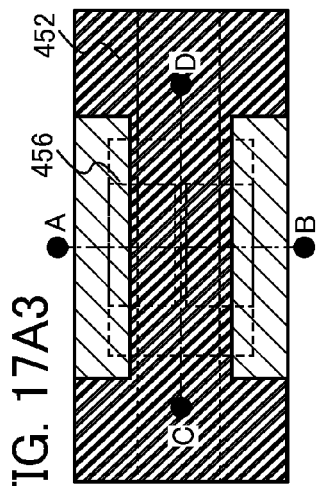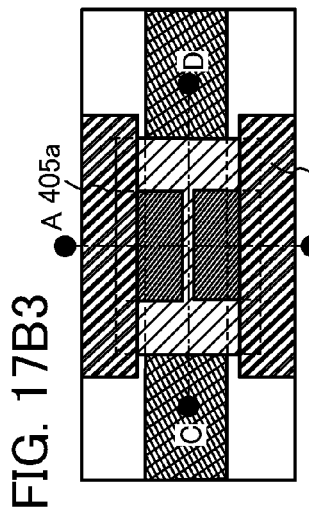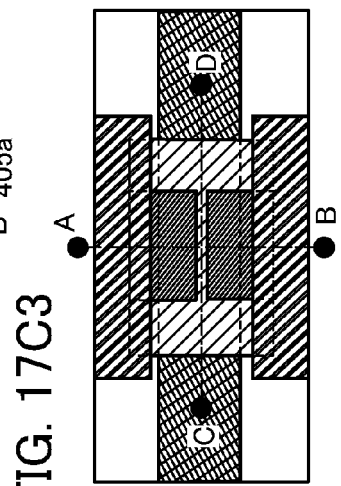
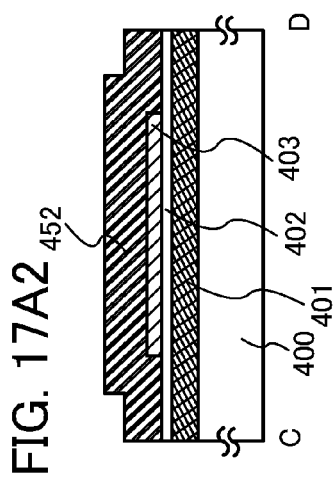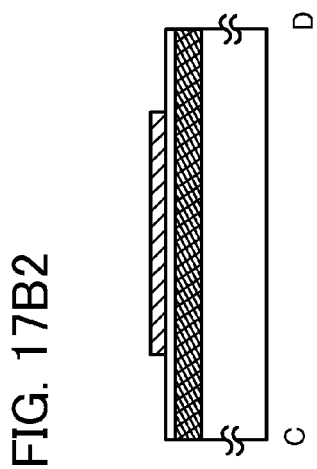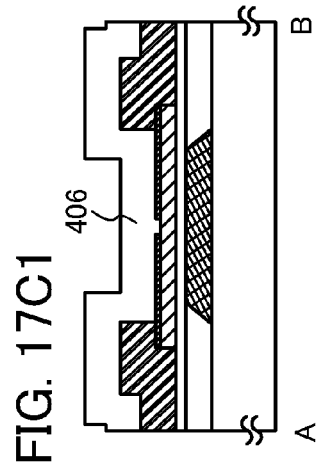
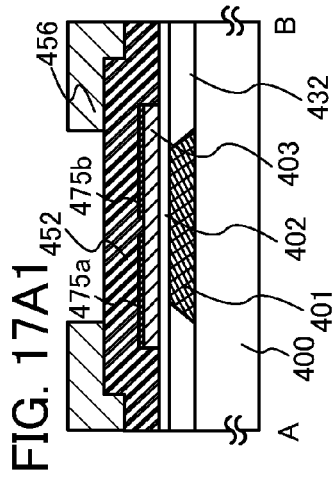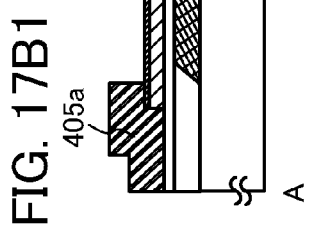

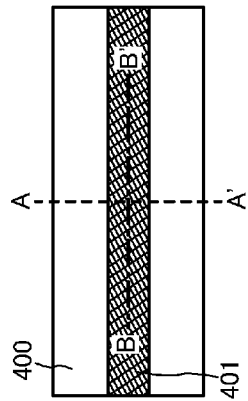 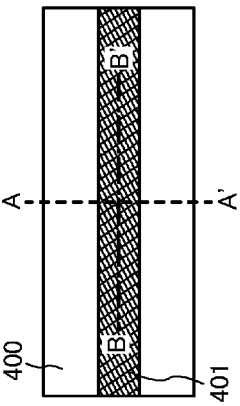 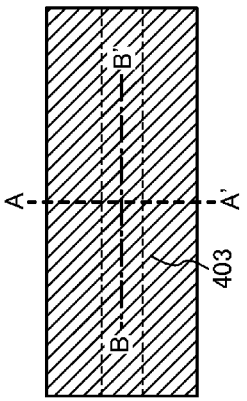
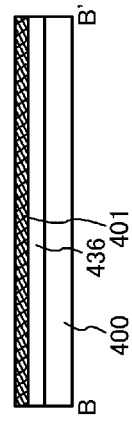 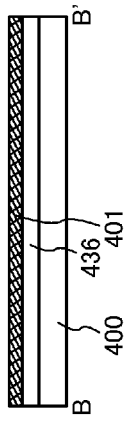 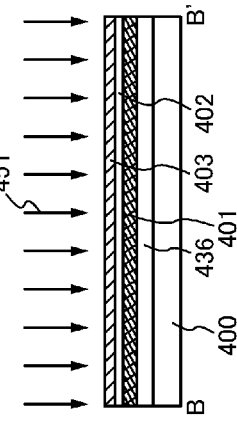
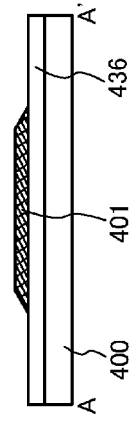 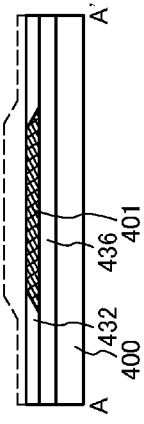

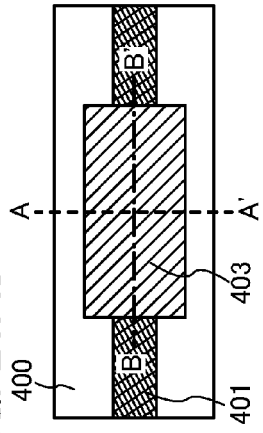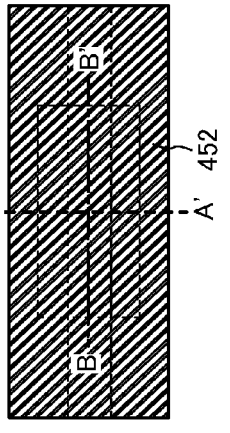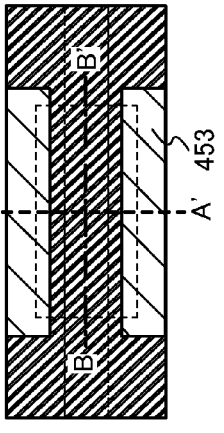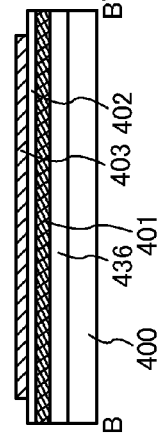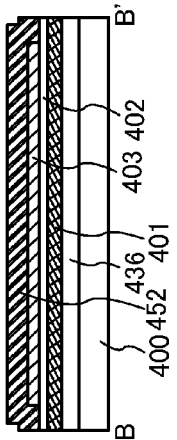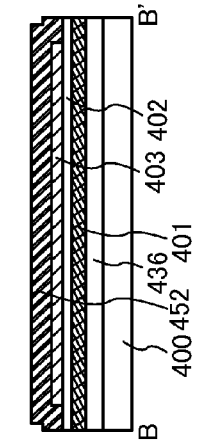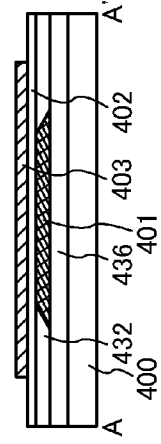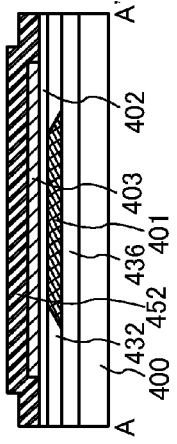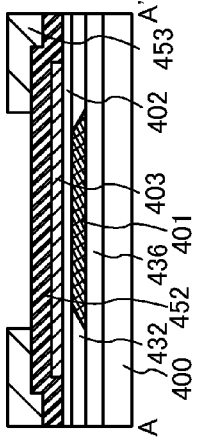

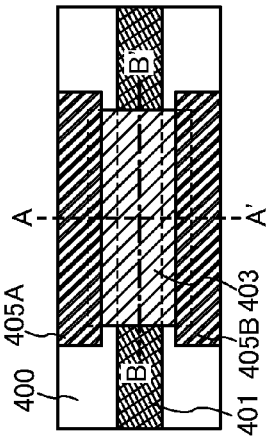
FIG. 22A1  FIG. 22A2  FIG. 22A3
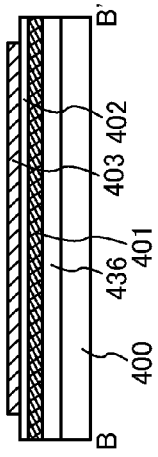
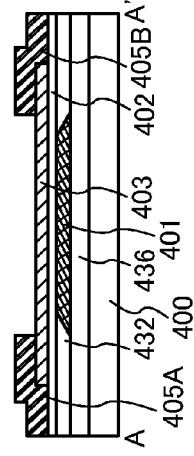
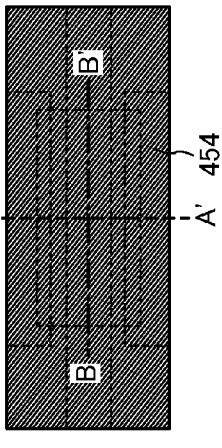
FIG. 22B1  FIG. 22B2  FIG. 22B3
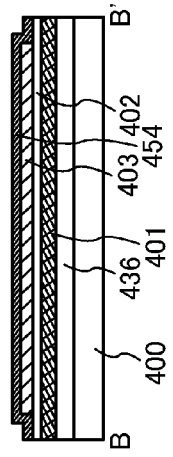
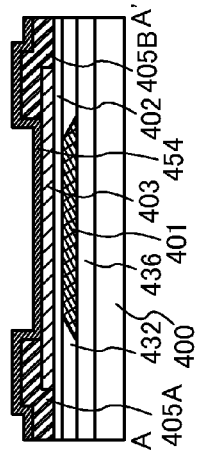
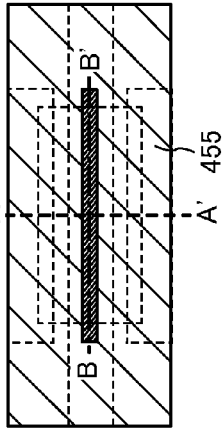
FIG. 22C1  FIG. 22C2  FIG. 22C3
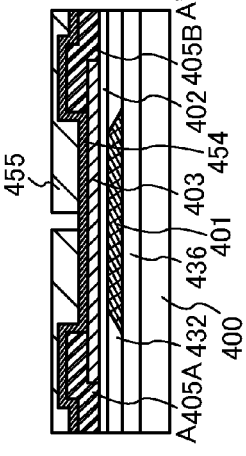

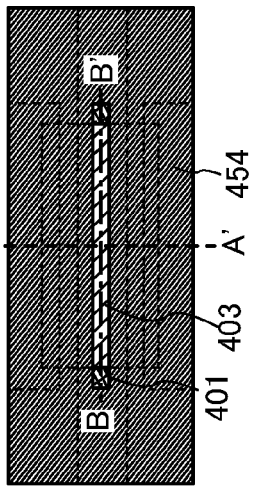
FIG. 23A3
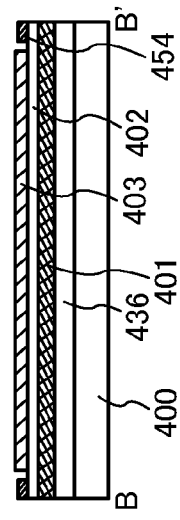
FIG. 23A2
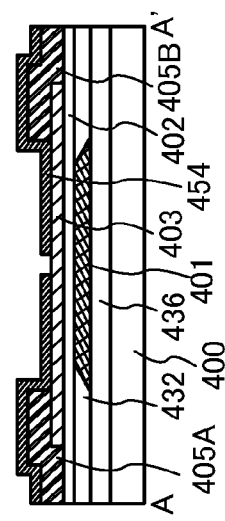
FIG. 23A1
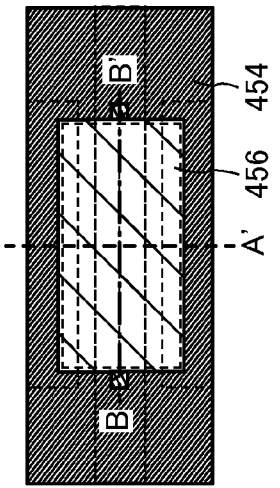
FIG. 23B3
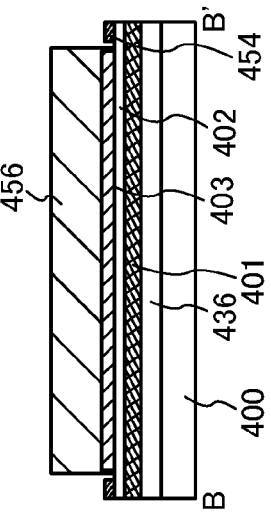
FIG. 23B2
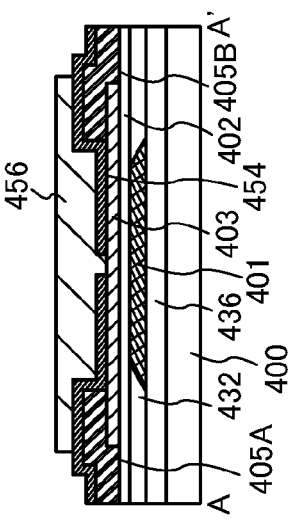
FIG. 23B1

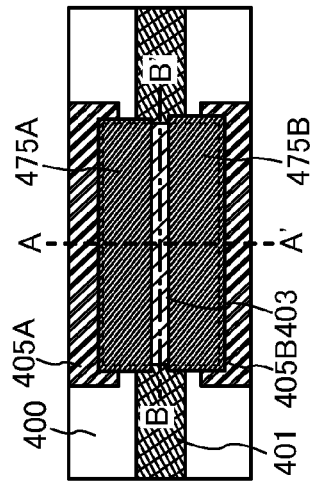
FIG. 24A3
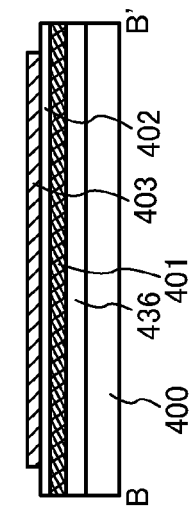
FIG. 24A2
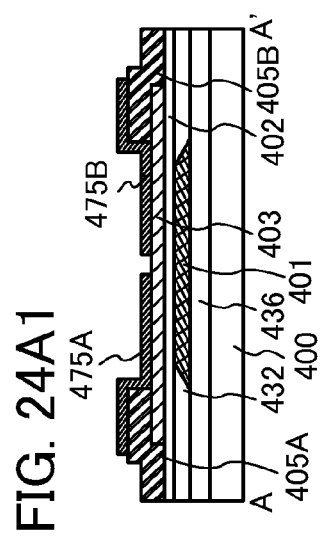
FIG. 24A1
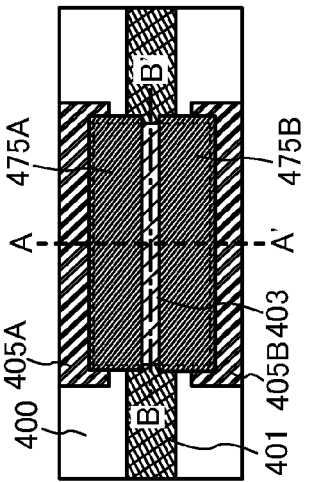
FIG. 24B3
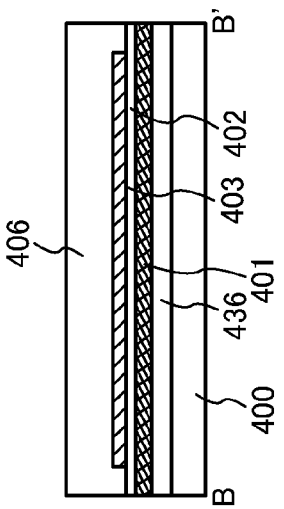
FIG. 24B2
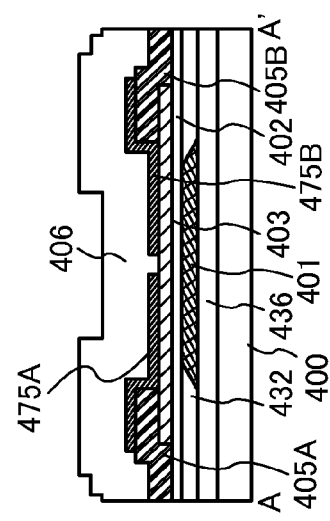
FIG. 24B1

METHOD FOR MANUFACTURING SEMICONDUCTOR DEVICE USING OXIDE SEMICONDUCTOR

TECHNICAL FIELD

The present invention relates to a technique for miniaturizing semiconductor integrated circuits. The invention disclosed in this specification includes in its scope an element formed using a compound semiconductor, in addition to that formed using a silicon semiconductor, as a component of a semiconductor integrated circuit, and discloses an element formed using a wide-gap semiconductor as an example.

In this specification, a semiconductor device generally means a device which can function by utilizing semiconductor characteristics, and an electro-optic device, a semiconductor circuit, and an electronic device are all semiconductor devices.

BACKGROUND ART

As semiconductor memory devices, dynamic RAMs (DRAMs) formed using a silicon substrate are well-known products and currently used in a variety of electronic devices. A memory cell which is a key component in a DRAM includes a reading and writing transistor and a capacitor.

DRAMs are an example of volatile memory devices, and another example of volatile memory devices is static random access memories (SRAMs). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

An example of nonvolatile memory devices is flash memories. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed.

However, in a flash memory, there is a problem in that a memory element becomes incapable of functioning after a large number of repeated write operations because a gate insulating layer included in the memory element deteriorates due to tunneling current generated in the write operations. In order to avoid this problem, a method in which the number of write operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In addition, high voltage is necessary in order to inject charge into the floating gate or remove the charge. Moreover, it takes a relatively long time to inject or remove charge, and it is not easy to increase the speed of writing or erasing data.

Volatile memory devices typified by DRAMs are formed using a silicon substrate, and their circuit patterns, like those for other semiconductor integrated circuits, have been miniaturized in accordance with the scaling law. There was a time when it was considered difficult to achieve a design rule of 100 nm or less. One of the reasons is that in a transistor having a channel length of 100 nm or less, a punch-through current is likely to flow due to a short-channel effect and the transistor becomes incapable of functioning as a switching element, which has been considered to be a problem. In order to prevent a punch-through current, a silicon substrate may be doped with an impurity at high concentration. However, this is not an appropriate solution to the problem because it makes a junction leakage current likely to flow between a source and the substrate or between a drain and the substrate and eventually causes a deterioration of memory retention characteristics.

Reference 1 discloses a technique in which a transistor formed using an oxide semiconductor layer is used as a memory.

Reference 2 discloses a transistor formed using amorphous IGZO and having a channel length of 50 nm.

REFERENCES

[Reference 1] Japanese Published Patent Application No. 2011-171702
[Reference 2] Ihun Song et al., "Short Channel Characteristics of Gallium-Indium-Zinc-Oxide Thin Film Transistors for Three-Dimensional Stacking Memory", IEEE ELECTRON DEVICE LETTERS, Vol. 29, No. 6, June 2008, pp. 549-552

DISCLOSURE OF INVENTION

It is an object to provide a semiconductor device including a transistor which is formed using an oxide semiconductor layer and has a channel length of less than 50 nm, and a method for manufacturing the semiconductor device.

A shorter channel length causes the problem of leakage due to a parasitic channel. Therefore, it is an object to provide a transistor structure for reducing the leakage due to a parasitic channel.

It is another object to provide a semiconductor device having a novel structure, which can hold stored data even when not powered and which has an unlimited number of write cycles.

Over a first transistor having a channel formation region in a substrate including a semiconductor material such as single crystal silicon, a second transistor having a channel formation region in an oxide semiconductor layer is provided. A source electrode layer and a drain electrode layer of the second transistor are formed by selectively etching a conductive film which is formed over and in contact with the oxide semiconductor layer.

The gap between the source electrode layer and the drain electrode layer of the second transistor is the channel length L of the second transistor. In order to achieve a channel length L of less than 50 nm, a mask obtained by exposing a resist to an electron beam and then developing the resist is used as an etching mask for the conductive film.

One embodiment of the invention disclosed in this specification is a method for manufacturing a semiconductor device, which includes the steps of: forming a gate insulating layer over a gate electrode layer; forming an oxide semiconductor layer over the gate insulating layer; forming a first conductive layer and a second conductive layer over the oxide semiconductor layer; forming a conductive film over the first conductive layer and the second conductive layer; forming a resist over the conductive film; and forming a third conductive layer over the first conductive layer and a fourth conductive layer over the second conductive layer by performing exposure to an electron beam (also referred to as electron beam exposure) and then by selectively etching the conductive film. The gap between the third conductive layer and the fourth conductive layer is narrower than the gap between the first conductive layer and the second conductive layer. The first conductive layer and the third conductive layer are a source electrode. The second conductive layer and the fourth conductive layer are a drain electrode.

A semiconductor device obtained by the above manufacturing method also has a feature, and the embodiment is a semiconductor device which includes: a gate electrode layer over a semiconductor substrate; an oxide semiconductor layer over the gate electrode layer and overlapping with the gate electrode layer; a first conductive layer over the oxide semiconductor layer, and a third conductive layer over and in contact with the first conductive layer; a second conductive layer over the oxide semiconductor layer, and a fourth conductive layer over and in contact with the second conductive layer; and an insulating layer over and in contact with the third conductive layer and the fourth conductive layer and partly in contact with the oxide semiconductor layer. The gap between the third conductive layer and the fourth conductive layer is narrower than the gap between the first conductive layer and the second conductive layer. The first conductive layer and the third conductive layer are a source electrode. The second conductive layer and the fourth conductive layer are a drain electrode.

Note that in the above semiconductor device, a conductive film may be stacked over the oxide semiconductor layer; the third conductive layer may be provided over and in contact with the first conductive layer and the fourth conductive layer may be provided over and in contact with the second conductive layer; a fifth conductive layer may be formed over the third conductive layer; and a sixth conductive layer may be formed over the fourth conductive layer. Another embodiment of the invention disclosed in this specification is a semiconductor device which includes: a gate electrode layer over a semiconductor substrate; an oxide semiconductor layer over the gate electrode layer and overlapping with the gate electrode layer; a first conductive layer over the oxide semiconductor layer, a third conductive layer over and in contact with the first conductive layer, and a fifth conductive layer over and in contact with the third conductive layer; a second conductive layer over the oxide semiconductor layer, a fourth conductive layer over and in contact with the second conductive layer, and a sixth conductive layer over and in contact with the fourth conductive layer; and an insulating layer over and in contact with the fifth conductive layer and the sixth conductive layer and partly in contact with the oxide semiconductor layer. The gap between the fifth conductive layer and the sixth conductive layer is narrower than the gap between the first conductive layer and the second conductive layer. The first conductive layer, the third conductive layer, and the fifth conductive layer are a source electrode. The second conductive layer, the fourth conductive layer, and the sixth conductive layer are a drain electrode.

A manufacturing method for the above semiconductor device is a method for manufacturing a semiconductor device, which includes the steps of: forming a gate insulating layer over the gate electrode layer; forming the oxide semiconductor layer over the gate insulating layer; forming the first conductive layer and the second conductive layer over the oxide semiconductor layer; forming a conductive film over the first conductive layer and the second conductive layer; forming a resist over the conductive film; and forming a fifth conductive layer over the first conductive layer and a sixth conductive layer over the second conductive layer by performing electron beam exposure and then by selectively etching the conductive film. The gap between the fifth conductive layer and the sixth conductive layer is narrower than the gap between the first conductive layer and the second conductive layer. The first conductive layer and the fifth conductive layer are a source electrode. The second conductive layer and the sixth conductive layer are a drain electrode. Note that in the above embodiment, a third conductive layer may be provided between the first conductive layer and the fifth conductive layer, and a fourth conductive layer may be provided between the second conductive layer and the sixth conductive layer.

In each of the above manufacturing methods, the gap between the third conductive layer and the fourth conductive layer may be determined by the electron beam exposure, and the gap between the first conductive layer and the second conductive layer may be determined by light exposure with a photomask.

The order of the steps in each of the above manufacturing methods may be changed; the first conductive layer and the second conductive layer may be formed using a mask obtained by electron beam exposure, and then, the third conductive layer and the fourth conductive layer may be formed by light exposure with a photomask. Another embodiment of the invention disclosed in this specification is a method for manufacturing a semiconductor device, which includes the steps of: forming a gate insulating layer over a gate electrode layer; forming an oxide semiconductor layer over the gate insulating layer; forming a conductive film over the oxide semiconductor layer; forming a positive resist over the conductive film; forming a first conductive layer and a second conductive layer by performing electron beam exposure and then by selectively etching the conductive film; and forming a third conductive layer over and partly in contact with the first conductive layer and a fourth conductive layer over and partly in contact with the second conductive layer. The gap between the first conductive layer and the second conductive layer is narrower than the gap between the third conductive layer and the fourth conductive layer. The first conductive layer and the third conductive layer are a source electrode. The second conductive layer and the fourth conductive layer are a drain electrode. In the above manufacturing steps, the width of the oxide semiconductor layer in the channel length direction may be larger than the width of the gate electrode layer in the channel length direction. This enables the oxide semiconductor layer to be supplied with oxygen more easily from an insulating layer below the oxide semiconductor layer, for example.

In the method for manufacturing a semiconductor device, the gap between the first conductive layer and the second conductive layer is determined by the electron beam exposure, and the gap between the third conductive layer and the fourth conductive layer may be determined by light exposure with a photomask. In the method for manufacturing a semiconductor device of the above embodiment, the channel length in the semiconductor device may be the gap between the first conductive layer and the second conductive layer.

In the case where the oxide semiconductor layer is processed by using a photolithography technique or the like so as to have a desired shape (a desired patterned shape, for example) such as an island shape, an end surface of the oxide semiconductor layer might become less resistive by being exposed to an etching gas, atmospheric constituents, moisture, or the like. Thus, a layout in which a channel formation region with a channel length of less than 50 nm is formed in the vicinity of the end surface of the oxide semiconductor layer might lead to an increase of leakage. Therefore, the channel formation region with a channel length L of less than 50 nm and a region with a gap L' which is larger than the channel length L are provided between the source electrode layer and the drain electrode layer. Such a layout can achieve a reduction of leakage due to a parasitic channel. Note that the channel formation region is a region with a size equal to the shortest distance between the source electrode layer and the drain electrode layer of the second transistor.

Another embodiment of the invention disclosed in this specification is a method for manufacturing a semiconductor device, which includes the steps of: forming a gate insulating layer over a gate electrode layer; forming an oxide semiconductor layer over the gate insulating layer; forming a conductive film over the oxide semiconductor layer; forming a positive resist over the conductive film; forming an opening with different widths by performing electron beam exposure and then by selectively etching the conductive film to form a first conductive layer and a second conductive layer with different gaps therebetween over the oxide semiconductor layer; and forming a third conductive layer over and partly in contact with the first conductive layer and a fourth conductive layer over and partly in contact with the second conductive layer. The gap between the first conductive layer and the second conductive layer is narrower than the gap between the third conductive layer and the fourth conductive layer. The first conductive layer and the third conductive layer are a source electrode. The second conductive layer and the fourth conductive layer are a drain electrode.

In the above embodiment, the different gaps between the first conductive layer and the second conductive layer over the oxide semiconductor layer may be determined by the electron beam exposure, or a photomask may be used for the larger gap. Another embodiment of the invention is a method for manufacturing a semiconductor device, which includes the steps of: forming a gate insulating layer over a gate electrode layer; forming an oxide semiconductor layer over the gate insulating layer; forming a conductive film over the oxide semiconductor layer; forming a positive resist over the conductive film; forming a first conductive layer and a second conductive layer by performing electron beam exposure, performing first etching, performing second etching of the conductive film using a first mask, and performing third etching using a second mask; and forming a third conductive layer over and partly in contact with the first conductive layer and a fourth conductive layer over and partly in contact with the second conductive layer. The gap between the first conductive layer and the second conductive layer is narrower than the gap between the third conductive layer and the fourth conductive layer. The first conductive layer and the third conductive layer are a source electrode. The second conductive layer and the fourth conductive layer are a drain electrode.

In the above embodiment, a first gap which is the narrowest gap between the first conductive layer and the second conductive layer is determined by the electron beam exposure, and a second gap between the first conductive layer and the second conductive layer may be determined by light exposure with a photomask. In the above embodiment, there are the first gap and the second gap wider than the first gap between the first conductive layer overlapping with the oxide semiconductor layer and the second conductive layer overlapping with the oxide semiconductor layer, and the first gap may be equal to the channel length of a transistor.

In each of the above embodiments, the gate insulating layer may be subjected to planarization treatment. When the gate insulating layer is flat, the resist formed over the gate insulating layer can be precisely exposed to an electron beam during the electron beam exposure.

The oxide semiconductor layer is preferably highly purified so as to contain hardly any impurities such as copper, aluminum, and chlorine. In the process for manufacturing the transistor, steps in which these impurities are not mixed or attached to the surface of the oxide semiconductor layer are preferably selected as appropriate. In the case where the impurities are attached to the surface of the oxide semiconductor layer, the impurities on the surface of the oxide semiconductor layer are preferably removed by exposure to oxalic acid, dilute hydrofluoric acid, or the like or by plasma treatment (such as $N_2O$ plasma treatment). Specifically, the copper concentration of the oxide semiconductor layer is lower than or equal to $1\times10^{18}$ atoms/cm$^3$, preferably lower than or equal to $1\times10^{17}$ atoms/cm$^3$. In addition, the aluminum concentration of the oxide semiconductor layer is lower than or equal to $1\times10^{18}$ atoms/cm$^3$. Further, the chlorine concentration of the oxide semiconductor layer is lower than or equal to $2\times10^{18}$ atoms/cm$^3$.

In addition, shortly after the oxide semiconductor layer is formed, it is preferable that the oxide semiconductor layer is supersaturated which contains oxygen in a proportion higher than that in the stoichiometric composition. For example, in the case where the oxide semiconductor layer is formed by a sputtering method, the formation is preferably performed in the state where the proportion of oxygen in a film formation gas is large, and in particular, the formation is preferably performed in an oxygen atmosphere (an oxygen gas: 100%). When the formation is performed in the state where the proportion of oxygen in the film formation gas is large, particularly in a 100% oxygen gas atmosphere, release of zinc from the film can be reduced even at a film formation temperature higher than or equal to 300° C., for example.

The oxide semiconductor layer is preferably an oxide semiconductor layer which is purified by sufficient removal of impurities such as hydrogen or by sufficient supply of oxygen so as to be supersaturated with oxygen. Specifically, the hydrogen concentration of the oxide semiconductor layer is $5\times10^{19}$ atoms/cm$^3$ or less, preferably $5\times10^{18}$ atoms/cm$^3$ or less, more preferably $5\times10^{17}$ atoms/cm$^3$ or less. Note that the above hydrogen concentration of the oxide semiconductor layer is measured by secondary ion mass spectrometry (SIMS). In order that the oxide semiconductor layer is supersaturated with oxygen by sufficient supply of oxygen, an insulating layer containing excess oxygen (such as a $SiO_x$ layer) is provided so as to surround and be in contact with the oxide semiconductor layer.

As the insulating layer containing excess oxygen, a $SiO_x$ or silicon oxynitride film containing much oxygen as a result of film formation under the conditions which are set as appropriate for a PCVD method or a sputtering method is used. In order to make the insulating layer contain much more excess oxygen, oxygen is added by an ion implantation method, an ion doping method, or plasma treatment.

In the case where the hydrogen concentration of the insulating layer containing excess oxygen is greater than or equal to $7.2\times10^{20}$ atoms/cm$^3$, variation in initial characteristics of transistors is increased, a channel length dependence of electrical characteristics of a transistor is increased, and a transistor is significantly deteriorated in the BT stress test; therefore, the hydrogen concentration of the insulating layer containing excess oxygen should be less than $7.2\times10^{20}$ atoms/cm$^3$. In other words, the hydrogen concentration of the oxide semiconductor layer is preferably less than or equal to $5\times10^{19}$ atoms/cm$^3$, and the hydrogen concentration of the insulating layer containing excess oxygen is preferably less than $7.2\times10^{20}$ atoms/cm$^3$.

In addition, a blocking layer (such as an $AlO_x$ layer) for preventing oxygen from being released from the oxide semiconductor layer is preferably provided so as to be positioned outside the insulating layer containing excess oxygen.

When the oxide semiconductor layer is surrounded by the insulating layer containing excess oxygen or the blocking layer, the oxide semiconductor layer can contain oxygen in a proportion which is substantially the same as that in the stoichiometric composition, or in a proportion higher than that in the stoichiometric composition i.e., the oxide semiconductor layer can be supersaturated with oxygen. For example, in the case where the oxide semiconductor layer is formed of IGZO although an example of stoichiometric composition is In:Ga:Zn:O=1:1:1:4 [atomic ratio], the ratio of oxygen atoms in the IGZO which is supersaturated with oxygen is larger than 4.

According to the present invention, a semiconductor device which includes a transistor formed using an oxide semiconductor layer and having a channel length of less than 50 nm can be obtained. In addition, a transistor structure for reducing leakage due to a parasitic channel can be obtained.

Furthermore, a semiconductor device including a memory which can hold stored data even when not powered and which has an unlimited number of write cycles can be obtained.

BRIEF DESCRIPTION OF DRAWINGS

FIGS. 4A1 to 4A3, 4B1 to 4B3, and 4C1 to 4C3 illustrate a method for manufacturing a semiconductor device of one embodiment of the present invention.

FIGS. 5A1 to 5A3, 5B1 to 5B3, and 5C1 to 5C3 illustrate a method for manufacturing a semiconductor device of one embodiment of the present invention.

FIGS. 6A1 to 6A3, 6B1 to 6B3, and 6C1 to 6C3 illustrate a method for manufacturing a semiconductor device of one embodiment of the present invention.

FIGS. 7A1 to 7A3, 7B1 to 7B3, and 7C1 to 7C3 illustrate a method for manufacturing a semiconductor device of one embodiment of the present invention.

FIGS. 16A1 to 16A3 illustrate a method for manufacturing a semiconductor device of one embodiment of the present invention.

FIGS. 17A1 to 17A3, 17B1 to 17B3, and 17C1 to 17C3 illustrate a method for manufacturing a semiconductor device of one embodiment of the present invention.

FIGS. 20A1 to 20A3, 20B1 to 20B3, and 20C1 to 20C3 illustrate a method for manufacturing a semiconductor device of one embodiment of the present invention.

FIGS. 21A1 to 21A3, 21B1 to 21B3, and 21C1 to 21C3 illustrate a method for manufacturing a semiconductor device of one embodiment of the present invention.

FIGS. 22A1 to 22A3, 22B1 to 22B3, and 22C1 to 22C3 illustrate a method for manufacturing a semiconductor device of one embodiment of the present invention.

FIGS. 23A1 to 23A3 and 23B1 to 23B3 illustrate a method for manufacturing a semiconductor device of one embodiment of the present invention.

FIGS. 24A1 to 24A3 and 24B1 to 24B3 illustrate a method for manufacturing a semiconductor device of one embodiment of the present invention.

BEST MODE FOR CARRYING OUT THE INVENTION

Embodiments of the invention disclosed in this specification will be described in detail below with reference to drawings. Note that the invention disclosed in this specification is not limited to the description below, and it is easily understood by those skilled in the art that modes and details of the present invention can be modified in various ways. In addition, the invention disclosed in this specification should not be construed as being limited to the description in the embodiments given below. Note that ordinal numbers such as "first" and "second" are used for convenience and do not denote the order of steps or the stacking order of layers. In addition, the ordinal numbers in this specification do not denote any particular names to define the invention.

Embodiment 1

In this embodiment, one embodiment of a semiconductor device will be described with reference to FIGS. 1A and 1B. FIG. 1B is a top view of a transistor 420, and FIG. 1A is a cross-sectional view taken along X-Y in FIG. 1B.

Figure 1A:
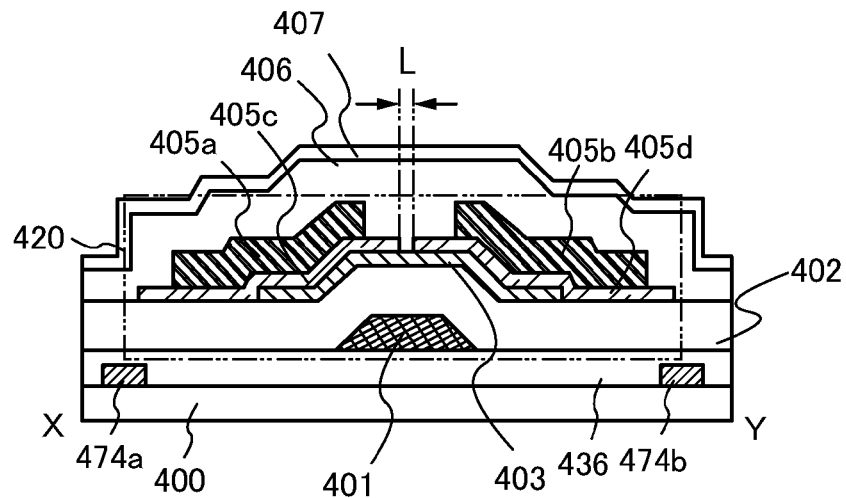
FIGS. 1A and 1B are a cross-sectional view and a top view illustrating one embodiment of the present invention.
Figure 1B:
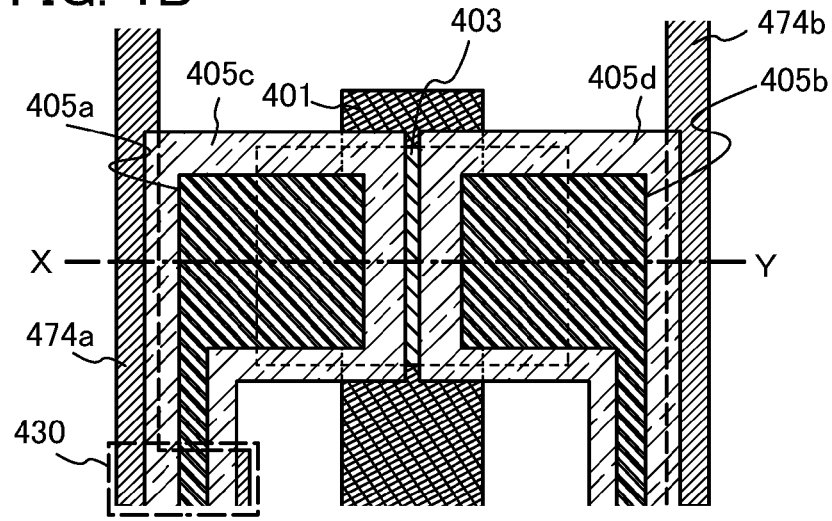

The transistor 420 illustrated in FIGS. 1A and 1B includes a base insulating layer 436 over a substrate 400, a gate electrode layer 401 over the base insulating layer 436, a gate insulating layer 402 over the gate electrode layer 401, an oxide semiconductor layer 403 over the gate electrode layer 401 with the gate insulating layer 402 provided therebetween, a drain electrode layer and a source electrode layer, and an insulating layer 406 and an insulating layer 407 over the oxide semiconductor layer 403. Note that portions in the oxide semiconductor layer 403, which the drain electrode layer and the source electrode layer are in contact with, and their vicinity may have lower resistivity than in other portions in the oxide semiconductor layer 403, and these portions having lower resistivity may be called a drain region and a source region, respectively.

The drain electrode layer includes a stack of a first barrier layer 405c and a first low-resistance material layer 405a, and the source electrode layer includes a stack of a second barrier layer 405d and a second low-resistance material layer 405b.

In the base insulating layer 436, a wiring layer 474a and a wiring layer 474b are buried, and the wiring layer 474a and the drain electrode layer (the first barrier layer 405c and the first low-resistance material layer 405a) form a capacitor 430.

A region where the first barrier layer 405c and the second barrier layer 405d overlap with the first low-resistance material layer 405a and the second low-resistance material layer 405b is thicker than a region where they do not.

The base insulating layer 436 can be formed using an oxide insulating film of silicon oxide, silicon oxynitride, aluminum oxide, aluminum oxynitride, hafnium oxide, gallium oxide, or the like, a nitride insulating film of silicon nitride, silicon nitride oxide, aluminum nitride, aluminum nitride oxide, or the like, or a mixed material thereof. Further, the base insulating layer 436 can be formed with a single-layer structure or a stacked-layer structure of two or more layers with the use of these compounds.

Here, silicon oxynitride means the one that contains more oxygen than nitrogen and for example, silicon oxynitride includes oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Note that the concentrations of oxygen, nitrogen, and silicon fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

The gate electrode layer 401 can be formed using a metal material such as molybdenum, titanium, tantalum, tungsten, aluminum, copper, chromium, neodymium, or scandium or an alloy material which contains any of these materials as a main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked-layer structure of the above conductive material and the above metal material.

As the gate electrode layer 401, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV (electronvolts) or higher, preferably 5.5 eV (electronvolts) or higher, which enable the threshold voltage of the transistor to be positive when used as the gate electrode layer. Accordingly, a so-called normally off switching element can be provided.

The gate insulating layer 402 can be formed using a silicon oxide film, a gallium oxide film, an aluminum oxide film, a silicon nitride film, a silicon oxynitride film, an aluminum oxynitride film, or a silicon nitride oxide film.

When the gate insulating layer 402 is formed using a high-k material such as hafnium oxide, yttrium oxide, hafnium silicate ($HfSi_xO_y$ (x>0, y>0)), hafnium silicate to which nitrogen is added, hafnium aluminate ($HfAl_xO_y$ (x>0, y>0)), or lanthanum oxide, gate leakage current can be reduced. Furthermore, the gate insulating layer 402 may have either a single-layer structure or a stacked-layer structure.

The gate insulating layer 402 is formed with an insulating layer containing excess oxygen. When the gate insulating layer 402 contains excess oxygen, the oxide semiconductor layer 403 can be supplied with oxygen.

The drain electrode layer includes the first barrier layer 405c and the first low-resistance material layer 405a over the first barrier layer 405c. The first low-resistance material layer 405a is formed using aluminum or the like, and the first barrier layer 405c is formed using titanium, tungsten, molybdenum, titanium nitride, tantalum nitride, or the like. The first barrier layer 405c prevents the first low-resistance material layer 405a from being oxidized by being in contact with the oxide semiconductor layer 403.

The source electrode layer includes the second barrier layer 405d and the second low-resistance material layer 405b over the second barrier layer 405d. The second low-resistance material layer 405b is formed using aluminum or the like, and the second barrier layer 405d is formed using titanium, tungsten, molybdenum, titanium nitride, tantalum nitride, or the like. The second barrier layer 405d prevents the second low-resistance material layer 405b from being oxidized by being in contact with the oxide semiconductor layer 403.

The channel length L of the transistor 420 is determined by the gap between the first barrier layer 405c and the second barrier layer 405d, and the gap between the first barrier layer 405c and the second barrier layer 405d is determined by etching with a resist mask obtained by performing exposure to an electron beam. Precise exposure and development using an electron beam can provide a precise pattern; thus, the gap between the first barrier layer 405c and the second barrier layer 405d, i.e., the channel length L, can be less than 50 nm, e.g., 20 nm or 30 nm. At a higher acceleration voltage, an electron beam can provide a more precise pattern. The use of multiple electron beams can shorten the process time per substrate. Note that the first barrier layer 405c and the second barrier layer 405d may be formed by etching with a photomask, except in the region which determines the channel length L. Note that the first barrier layer 405c and the second barrier layer 405d have a thickness of 5 nm to 30 nm, preferably 10 nm or less.

Here, a method for creating the gap between the first barrier layer 405c and the second barrier layer 405d by etching with a resist mask formed using an electron beam will be described with reference to FIGS. 12A to 12C. Note that a more specific method for manufacturing a transistor will be described in Embodiment 2.

Figure 12A:
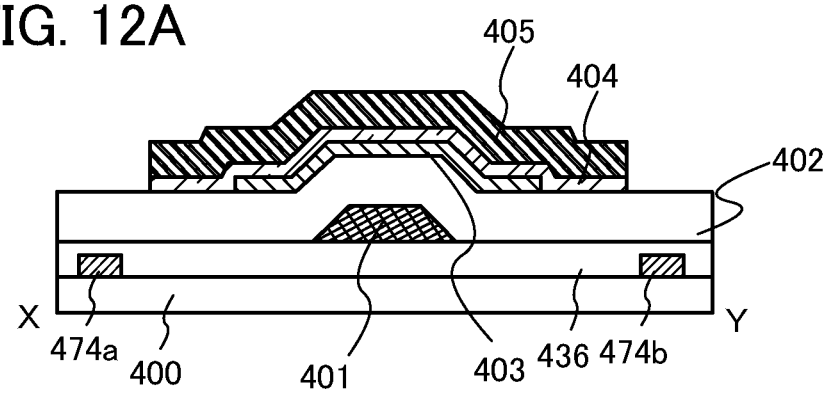
FIGS. 12A to 12C illustrate a method for manufacturing a semiconductor device of one embodiment of the present invention.
Figure 12B:
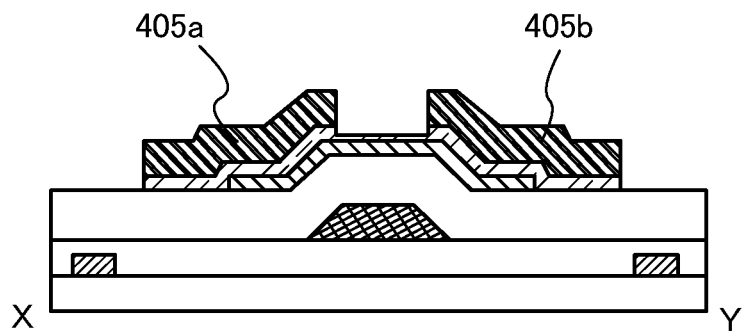
Figure 12C:
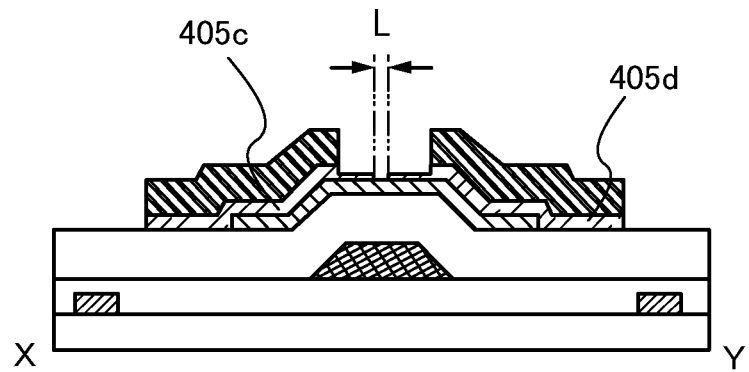

A conductive film 404 to be processed into the first barrier layer 405c and the second barrier layer 405d and a conductive film 405 to be processed into the first low-resistance material layer 405a and the second low-resistance material layer 405b are formed over the oxide semiconductor layer 403 (see FIG. 12A).

Next, a first resist mask is formed over the conductive film 405 through a photolithography process, and selective etching is performed. Thus, the first low-resistance material layer 405a and the second low-resistance material layer 405b are formed (see FIG. 12B).

In some cases, together with the conductive film 405, the conductive film 404 may also be etched and become thinner. Therefore, it is preferable to employ etching conditions where the etching selectivity of the conductive film 405 to the conductive film 404 is high. High etching selectivity of the conductive film 405 to the conductive film 404 can reduce the chance that when the conductive film 405 is etched, the conductive film 404 is also etched and becomes thinner.

Then, a resist is formed over the conductive film 404 and subjected to exposure to an electron beam; thus, a second resist mask is formed. The second resist mask is formed so as to overlap with a portion other than a channel region of the transistor 420. Using the second resist mask, the conductive film 404 is etched; thus, the first barrier layer 405c and the second barrier layer 405d are formed (see FIG. 12C). FIG. 12C differs from FIG. 1A in the pattern shape of the first barrier layer 405c and the second barrier layer 405d.

As a resist material, a siloxane-based resist, a polystyrene-based resist, or the like can be used, for example. Note that it is preferable to use a positive resist rather than a negative resist because a pattern with a small width is to be formed. For example, in the case where the width of the pattern is 30 nm, the thickness of the resist can be 30 nm.

Here, in an electron beam writing apparatus capable of electron beam irradiation, the acceleration voltage is preferably in the range from 5 kV to 50 kV, for example. The current intensity is preferably in the range from $5 \times 10^{-12}$ A to $1 \times 10^{-11}$ A. The minimum beam size is preferably 2 nm or less. The minimum possible pattern line width is preferably 8 nm or less.

Under the above conditions, a pattern with a width of, for example, 30 nm or less, preferably 20 nm or less, more preferably 8 nm or less, can be obtained.

Note that the method is described here in which after the first low-resistance material layer 405a and the second low-resistance material layer 405b are formed, the resist mask is formed by exposure to an electron beam and the first barrier layer 405c and the second barrier layer 405d are formed. However, the order of forming the first and second low-resistance material layers and the first and second barrier layers is not limited thereto.

After the resist mask is formed by exposure to an electron beam and a channel formation region is exposed by etching the conductive film 404, the resist mask is removed and then the exposed surface of the oxide semiconductor layer is preferably subjected to plasma treatment (with an $N_2O$ gas or an $O_2$ gas) or cleaning (with water, oxalic acid, or dilute hydrofluoric acid (diluted to 1/100)). Impurities on the surface of the oxide semiconductor layer are preferably removed by exposure to oxalic acid, dilute hydrofluoric acid, or the like or by plasma treatment (such as $N_2O$ plasma treatment). Specifically, the copper concentration of the oxide semiconductor layer is lower than or equal to $1 \times 10^{18}$ atoms/cm$^3$, preferably lower than or equal to $1 \times 10^{17}$ atoms/cm$^3$. In addition, the aluminum concentration of the oxide semiconductor layer is lower than or equal to $1 \times 10^{18}$ atoms/cm$^3$. Further, the chlorine concentration of the oxide semiconductor layer is lower than or equal to $2 \times 10^{18}$ atoms/cm$^3$.

Figure 2:
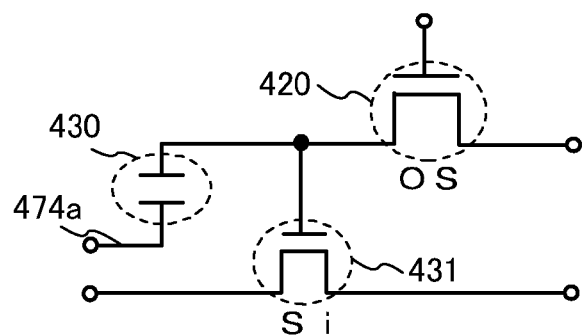
FIG. 2 is an equivalent circuit diagram illustrating one embodiment of the present invention.

Note that the substrate 400 is provided with a semiconductor element, which is not illustrated here for simplicity. The wiring layers 474a and 474b and the base insulating layer 436 covering the wiring layers 474a and 474b are provided over the substrate 400, part of which is a component of a memory illustrated in FIG. 2. FIG. 2 illustrates an example of an equivalent circuit, showing a connection between the transistor 420 and a transistor 431 formed using the substrate 400.

The capacitor 430 illustrated in FIG. 2 has the drain electrode layer (the first barrier layer 405c and the first low-resistance material layer 405a) of the transistor 420 and the wiring layer 474a as a pair of electrodes and has the base insulating layer 436 and the gate insulating layer 402 as a dielectric. As shown in FIG. 1A and FIG. 1B which is a partial cross-sectional view of FIG. 1A, the first low-resistance material layer 405a and the wiring 474a overlap with each other and form a capacitor. Note that although the first low-resistance material layer 405a and the wiring layer 474a do not overlap with each other in the cross-sectional view in FIG. 12C, a layout is employed in which the first low-resistance material layer 405a and the wiring layer 474a overlap with each other in a different place.

The memory configuration illustrated in FIG. 2 has the advantages of being capable of holding stored data even when not powered and having an unlimited number of write cycles. Note that the memory configuration illustrated in FIG. 2 will be described in detail in Embodiments 4 and 5.

An oxide semiconductor used for the oxide semiconductor layer 403 contains at least indium (In). It is preferable that In and zinc (Zn) be contained. As a stabilizer for reducing changes in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:

1:3 (=1/3:1/6:1/2), or In:Sn:Zn=2:1:5 (=1/4:1/8:5/8), or an oxide with an atomic ratio close to the above atomic ratios may be used.

However, the oxide semiconductor containing indium is not limited to those described above, and a material having an appropriate composition may be used in accordance with necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor layer 403 is in a single crystal state, a polycrystalline (also referred to as polycrystal) state, an amorphous state, or the like.

The oxide semiconductor layer is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light is small. Thus, the transistor has high reliability.

Note that nitrogen may be substituted for part of oxygen included in the oxide semiconductor film.

In an oxide semiconductor including crystal parts such as CAAC-OS, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm.

Note that $R_a$ is obtained by three-dimensionally expanding arithmetic mean roughness that is defined by JIS B 0601:2001 (ISO 4287:1997) so as to be able to be applied to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx\, dy \quad \text{[Formula 1]}$$

Here, the specific surface is a surface which is a target of roughness measurement, and is a quadrilateral region which is specified by four points represented by the coordinates $(x_1, y_1, f(x_1,y_1))$, $(x_1, y_2, f(x_1,y_2))$, $(x_2, y_1, f(x_2,y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

The oxide semiconductor layer 403 has a thickness of 1 nm to 30 nm (preferably 5 nm to 10 nm) and can be formed by a sputtering method, a molecular beam epitaxy (MBE) method, a CVD method, a pulse laser deposition method, an atomic layer deposition (ALD) method, or the like as appropriate. The oxide semiconductor layer 403 may be formed using a sputtering apparatus which performs film formation with surfaces of a plurality of substrates set substantially perpendicular to a surface of a sputtering target.

The insulating layer 406 preferably contains excess oxygen, and a $SiO_x$ or silicon oxynitride film containing much oxygen as a result of film formation under the conditions which are set as appropriate for a PECVD method or a sputtering method is used. In order to make the insulating layer contain much more excess oxygen, oxygen may be added as appropriate by an ion implantation method, an ion doping method, or plasma treatment.

The insulating layer 407 is a blocking layer (such as an AlO$_x$ layer) for preventing oxygen from being released from the oxide semiconductor layer. The aluminum oxide film (AlO$_x$) has a high shielding effect (blocking effect) of preventing penetration of both oxygen and impurities such as hydrogen and moisture. Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

The channel length of the transistor described in this embodiment is determined by the gap between the first barrier layer 405c and the second barrier layer 405d, and the gap between the first barrier layer 405c and the second barrier layer 405d is determined by etching with a resist mask obtained by exposure to an electron beam. Precise exposure and development using an electron beam can provide a precise pattern; thus, a minute transistor with a channel length L of less than 50 nm can be manufactured.

The configuration, method, and the like described in this embodiment can be combined as appropriate with any of the configurations, methods, and the like described in the other embodiments.

Embodiment 2

In this embodiment, a semiconductor device of another embodiment, which is different from the semiconductor device described in Embodiment 1, and a method for manufacturing the semiconductor device will be described.

Figure 3A:
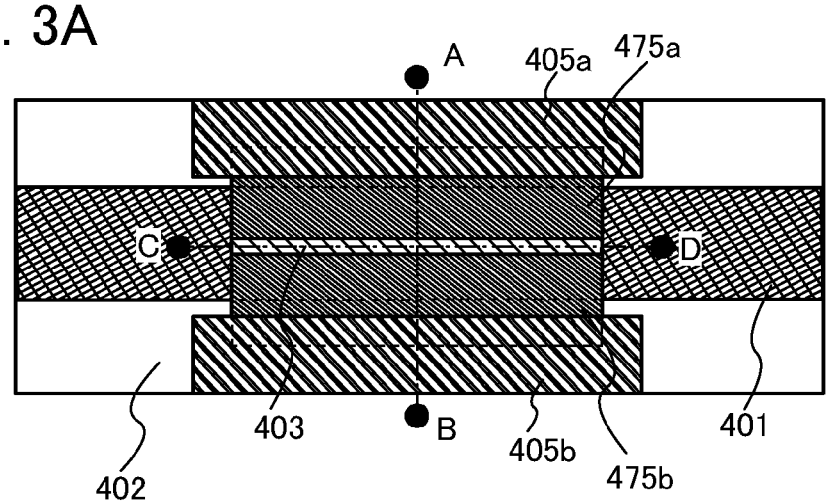
FIGS. 3A to 3C are a top view and cross-sectional views of a semiconductor device of one embodiment of the present invention.
Figure 3B:
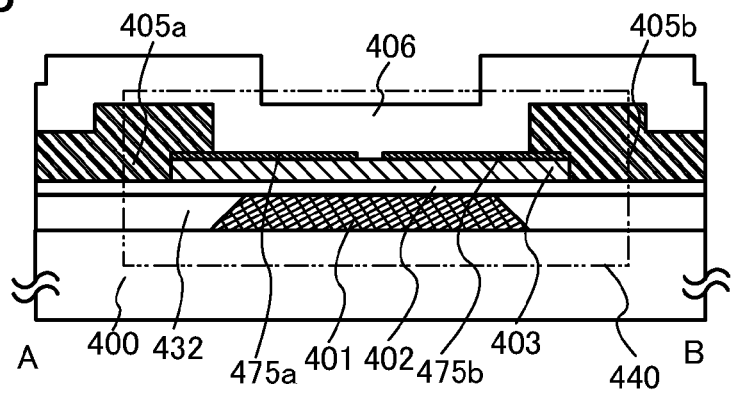
Figure 3C:
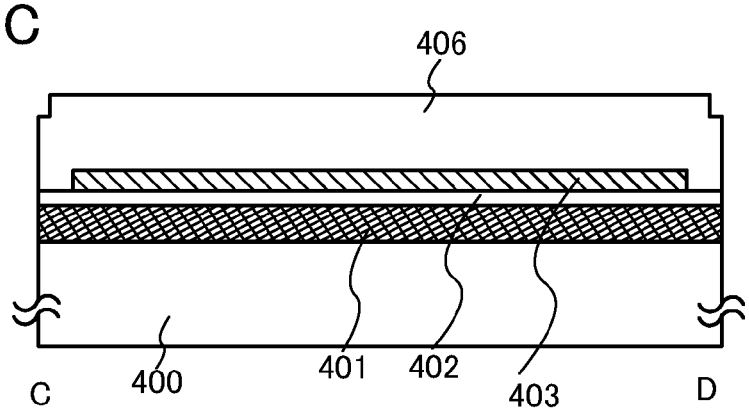

FIGS. 3A to 3C illustrate the semiconductor device of this embodiment. FIG. 3A is a top view of a transistor included in the semiconductor device of this embodiment. FIG. 3B is a cross-sectional view taken along A-B (channel length direction) in FIG. 3A. FIG. 3C is a cross-sectional view taken along C-D in FIG. 3A. Note that some components illustrated in FIG. 3B or 3C are not illustrated in FIG. 3A for simplicity of the drawing.

Note that, in this embodiment, portions that are similar to the portions in Embodiment 1 are denoted by the same reference numerals in the drawings, and detailed description thereof is omitted.

A transistor 440 illustrated in FIGS. 3A to 3C includes a gate electrode layer 401 over a substrate 400, an insulating layer 432 which is in contact with a side surface of the gate electrode layer 401 and in which the gate electrode layer 401 is buried, a gate insulating layer 402 over the insulating layer 432 and the gate electrode layer 401, an oxide semiconductor layer 403 over the gate insulating layer 402, a stacked source electrode layer and a stacked drain electrode layer over the oxide semiconductor layer 403, and an insulating layer 406 over the oxide semiconductor layer 403, the source electrode layer, and the drain electrode layer.

The drain electrode layer includes a first barrier layer 475a and a first low-resistance material layer 405a in contact with the first barrier layer 475a. The source electrode layer includes a second barrier layer 475b and a second low-resistance material layer 405b in contact with the second barrier layer 475b. The first barrier layer 475a and the second barrier layer 475b prevent the first low-resistance material layer 405a and the second low-resistance material layer 405b, respectively, from being oxidized by being in contact with the oxide semiconductor layer 403. Note that the first low-resistance material layer 405a and the second low-resistance material layer 405b are each in contact with a side surface of the oxide semiconductor layer 403; however, the first low-resistance material layer 405a and the second low-resistance material layer 405b can be prevented from being oxidized because the oxide semiconductor layer 403 is sufficiently thin.

The width of the oxide semiconductor layer in the channel length direction (the A-B direction in FIG. 3A) is larger than the width of the gate electrode layer in the channel length direction. This enables the oxide semiconductor layer 403 to be supplied with oxygen more easily from an insulating layer (e.g., the insulating layer 432) below the oxide semiconductor layer 403.

The gap between the first barrier layer 475a and the second barrier layer 475b is determined with a resist mask obtained by exposure to an electron beam. Precise exposure and development using an electron beam can provide a precise pattern.

The channel length of the transistor 440 is equal to the gap between the first barrier layer 475a and the second barrier layer 475b; thus, a minute transistor whose channel length can be determined precisely can be obtained.

An example of a method for manufacturing the semiconductor device including the transistor 440 is illustrated in FIGS. 4A1 to 4A3, 4B1 to 4B3, and 4C1 to 4C3, FIGS. 5A1 to 5A3, 5B1 to 5B3, and 5C1 to 5C3, FIGS. 6A1 to 6A3, 6B1 to 6B3, and 6C1 to 6C3, and FIGS. 7A1 to 7A3, 7B1 to 7B3, and 7C1 to 7C3.

Note that FIG. 4A3 is a top view for explaining a process for manufacturing the transistor. FIG. 4A1 is a cross-sectional view taken along A-B in FIG. 4A3. FIG. 4A2 is a cross-sectional view taken long C-D in FIG. 4A3. In the following description, FIG. 4A refers to FIGS. 4A1 to 4A3. The same applies to FIGS. 4B to 7C.

First, a conductive film is formed over the substrate 400 and is etched; thus, the gate electrode layer 401 is formed. Dry etching or wet etching, or both, may be usable for the etching of the conductive film.

Note that, as in the semiconductor device described in Embodiment 1, the substrate 400 is provided with a semiconductor element, a wiring layer, a base insulating layer 436 covering the wiring layer, and the like, which are not illustrated here for simplicity. Although there is no particular limitation on a substrate which can be used as the substrate 400, it is at least necessary that the substrate have heat resistance sufficient to withstand heat treatment performed later. For example, a single crystal semiconductor substrate or a polycrystalline semiconductor substrate of silicon, silicon carbide, or the like; a compound semiconductor substrate of silicon germanium or the like; an SOI substrate; or the like can be used. Alternatively, a glass substrate of barium borosilicate glass, aluminoborosilicate glass, or the like, a ceramic substrate, a quartz substrate, a sapphire substrate, or the like can be used.

The semiconductor device may be manufactured using a flexible substrate as the substrate 400. In order to manufacture a flexible semiconductor device, the transistor 440 may be directly formed over a flexible substrate. Alternatively, the transistor 440 may be formed over a formation substrate, and then, the transistor 440 may be separated and transferred to a flexible substrate. Note that in order to separate the transistor 440 from the formation substrate and transfer it to the flexible substrate, a separation layer may be provided between the formation substrate and the transistor 440.

The substrate 400 (or the substrate 400 and the base film, wiring, and the like) may be subjected to heat treatment. For example, the heat treatment may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to 1 hour.

After the formation of the gate electrode layer 401, the substrate 400 and the gate electrode layer 401 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to 1 hour.

Next, an insulating film to be processed into the insulating layer 432 is formed so as to cover the gate electrode layer 401 and the substrate 400. The insulating film can be formed by a sputtering method, an MBE method, a CVD method, a pulsed laser deposition method, an ALD method, or the like as appropriate.

The insulating film can be formed using a material and a method similar to those for the base insulating layer.

Next, the insulating film is subjected to polishing treatment (e.g., chemical mechanical polishing (CMP) treatment) or etching treatment, so that the upper surface of the gate electrode layer 401 becomes exposed and not covered with the insulating film. Thus, the insulating layer 432 whose upper surface is at the same height as the upper surface of the gate electrode layer 401 is formed (see FIG. 4A). The polishing treatment or etching treatment may be performed plural times, or these treatments may be performed in combination. When the polishing treatment and etching treatment are performed in combination, there is no particular limitation on the order of the steps.

When the insulating layer 432 is provided, the coverage of the gate electrode layer 401 with the gate insulating layer 402 can be improved. In addition, a surface on which a resist mask is to be formed in a later step through exposure to an electron beam can be flat; thus, the resist mask can be formed thin.

Note that in this embodiment, the method is described in which the insulating layer 432 is formed after the gate electrode layer 401 is formed; however, a method for forming the gate electrode layer 401 and the insulating layer 432 is not limited thereto. For example, the gate electrode layer 401 may be formed as follows: the insulating layer 432 is provided over the substrate 400, an opening is formed in the insulating layer 432 by an etching step or the like, and the opening is filled with a conductive material.

Next, the gate insulating layer 402 is formed over the gate electrode layer 401 and the insulating layer 432 (see FIG. 4B).

The gate insulating layer 402 has a thickness of 1 nm to 300 nm and can be formed by a CVD method using a film formation gas. As the CVD method, an LPCVD method, a plasma CVD method, or the like may be used, and as another method, a coating method or the like may also be used.

In this embodiment, for the gate insulating layer 402, a silicon oxynitride film having a thickness of 200 nm is formed by a plasma CVD method. For example, the gate insulating layer 402 may be formed under the conditions where the gas flow rate ratio of $SiH_4$ to $N_2O$ is $SiH_4$:$N_2O$=4 sccm: 800 sccm, the pressure is 40 Pa, the RF power (power output) is 50 W, and the substrate temperature is 350° C.

The gate insulating layer 402 may be subjected to heat treatment for dehydration or dehydrogenation treatment.

The temperature of the heat treatment is higher than or equal to 300° C. and lower than or equal to 700° C. or lower than the strain point of the substrate. The temperature of the heat treatment is preferably higher than the temperature for forming the gate insulating layer 402, in which case dehydration or dehydrogenation becomes more effective. For example, the substrate is put in an electric furnace which is one of heat treatment apparatuses, and the gate insulating layer 402 is subjected to heat treatment at 450° C. for one hour in vacuum.

Note that a heat treatment apparatus is not limited to an electric furnace, and a device for heating an object to be processed by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high-temperature gas, an inert gas that does not react with an object to be processed by heat treatment, for example, nitrogen or a rare gas such as argon, is used.

For example, as the heat treatment, GRTA may be performed as follows. The substrate is put in an inert gas heated to a high temperature of 650° C. to 700° C., is heated for several minutes, and is taken out of the inert gas.

The heat treatment may be performed under reduced pressure (in vacuum), in a nitrogen atmosphere, or in a rare gas atmosphere. It is preferable that water, hydrogen, and the like be not contained in the atmosphere of nitrogen, a rare gas, or the like. The purity of nitrogen or a rare gas introduced into a heat treatment apparatus is preferably set to 6N (99.9999%) or more, further preferably 7N (99.99999%) or more (i.e., the impurity concentration is 1 ppm or less, preferably 0.1 ppm or less).

Through the heat treatment, the gate insulating layer 402 can be dehydrated or dehydrogenated. Thus, the gate insulating layer 402 from which hydrogen, water, or the like causing a change in characteristics of the transistor has been eliminated can be formed.

In the heat treatment for dehydration or dehydrogenation treatment, it is preferable that a surface of the gate insulating layer 402 be not in a state where hydrogen, water, or the like is prevented from being released (for example, in a state where a film or the like which is not permeable to (or blocks) hydrogen, water, or the like is provided), but in a state where the surface of the gate insulating layer 402 is exposed.

The heat treatment for dehydration or dehydrogenation may be performed a plurality of times, and may also serve as another heat treatment.

Planarization treatment may be performed on a region of the gate insulating layer 402 which is to be in contact with the oxide semiconductor layer 403. The planarization treatment may be, but not particularly limited to, polishing treatment (e.g., chemical mechanical polishing (CMP)), dry etching treatment, or plasma treatment.

As plasma treatment, for example, reverse sputtering in which an argon gas is introduced and plasma is generated can be performed. The reverse sputtering is a method in which voltage is applied to a substrate side in an argon atmosphere by using an RF power supply and plasma is generated in the vicinity of the substrate to modify a surface. Note that instead of the argon atmosphere, a nitrogen atmosphere, a helium atmosphere, an oxygen atmosphere, or the like may be used. Powder substances (also referred to as particles or dust) which are attached to the surface of the gate insulating layer 402 can be removed by reverse sputtering.

As the planarization treatment, polishing treatment, dry etching treatment, or plasma treatment may be performed a plurality of times, or these treatments may be performed in combination. In the case where the treatments are combined, the order of the steps is not particularly limited and may be set as appropriate depending on the roughness of the surface of the gate insulating layer 402.

Next, an oxide semiconductor film 441 is formed in a film shape over the gate insulating layer 402. Note that in this embodiment, the oxide semiconductor film 441 is an oxide semiconductor film having a film shape, and the oxide semiconductor layer 403 included in the transistor 440 completed is an oxide semiconductor layer having an island shape.

Note that it is preferable that the oxide semiconductor film 441 be formed under such conditions that much oxygen is contained during the film formation (e.g., formed by a sputtering method in a 100% oxygen atmosphere), so as to be a film containing much oxygen (preferably having a region containing oxygen in excess of the stoichiometric composition in the oxide semiconductor in a crystalline state).

In this embodiment, an In—Ga—Zn-based oxide film (IGZO film) having a thickness of 35 nm is formed as the oxide semiconductor film 441 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the film formation conditions are as follows: an atmosphere of oxygen and argon (oxygen flow rate: 50%), a pressure of 0.6 Pa, a power of the power source of 5 kW, and a substrate temperature of 170° C. The deposition rate under the film formation conditions is 16 nm/min.

It is preferable that a high-purity gas in which an impurity such as hydrogen, water, a hydroxyl group, or hydride is reduced be used as the sputtering gas for the formation of the oxide semiconductor film 441.

The substrate is held in a deposition chamber kept under reduced pressure. Then, a sputtering gas in which hydrogen and moisture are reduced is introduced into the deposition chamber from which remaining moisture is removed, and the oxide semiconductor film 441 is formed over the substrate 400 using the above target. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. From the deposition chamber evacuated with a cryopump, hydrogen (a hydrogen atom), a compound including hydrogen (a hydrogen atom) such as water ($H_2O$) (preferably, also a compound including a carbon atom), and the like, for example, are removed; thus, the concentration of impurities in the oxide semiconductor film 441 formed in the deposition chamber can be reduced.

The gate insulating layer 402 and the oxide semiconductor film 441 are preferably formed successively without exposing the gate insulating layer 402 to the air. When the gate insulating layer 402 and the oxide semiconductor film 441 are formed successively without exposing the gate insulating layer 402 to the air, impurities such as hydrogen and moisture can be prevented from being adsorbed to the surface of the gate insulating layer 402.

Then, the oxide semiconductor film 441 and the gate insulating layer 402 are subjected to oxygen doping treatment; thus, the oxide semiconductor film 441 and the gate insulating layer 402 which contain excess oxygen are formed (see FIG. 4C). By the oxygen doping treatment of the gate insulating layer 402, oxygen 451 is supplied to the oxide semiconductor film 441 and the gate insulating layer 402, so that oxygen is contained in the oxide semiconductor film 441 and the gate insulating layer 402, or in the oxide semiconductor film 441 and the gate insulating layer 402 and in the vicinity of the interface.

The doping with the oxygen (an oxygen radical, an oxygen atom, an oxygen molecule, ozone, an oxygen ion (an oxygen molecular ion), and/or an oxygen cluster ion) 451 can be performed by an ion implantation method, an ion doping method, a plasma immersion ion implantation method, plasma treatment, or the like. For the ion implantation method, a gas cluster ion beam may be used. The oxygen doping treatment may be performed over the entire area at a time or may be performed using a moving (scanning) linear ion beam or the like.

The oxygen (an oxygen radical, an oxygen atom, an oxygen molecule, ozone, an oxygen ion (an oxygen molecular ion), and/or an oxygen cluster ion) 451 for the doping may be supplied from a plasma generating apparatus or an ozone generating apparatus with the use of a gas containing oxygen. Specifically, for example, the oxygen 451 can be generated with an apparatus for etching treatment on a semiconductor device, an apparatus for ashing on a resist mask, or the like to process the oxide semiconductor film 441 and the gate insulating layer 402.

For the oxygen doping treatment, a gas containing oxygen can be used. As the gas containing oxygen, oxygen, dinitrogen monoxide, nitrogen dioxide, carbon dioxide, carbon monoxide, or the like can be used. Alternatively, a rare gas may be used for the oxygen doping treatment.

For example, in the case where oxygen ions are implanted by an ion implantation method as the doping treatment with the oxygen 451, the dose may be greater than or equal to $1\times10^{13}$ ions/cm$^2$ and less than or equal to $5\times10^{16}$ ions/cm$^2$.

Since the gate insulating layer 402 in contact with the oxide semiconductor film 441 contains much (excess) oxygen which serves as an oxygen supply source, oxygen can be supplied from the gate insulating layer 402 to the oxide semiconductor film 441.

As a method for supplying oxygen from the gate insulating layer 402 to the oxide semiconductor film 441, heat treatment is performed in a state where the oxide semiconductor film 441 and the gate insulating layer 402 are in contact with each other. By the heat treatment, oxygen can be effectively supplied from the gate insulating layer 402 to the oxide semiconductor film 441.

Note that the heat treatment for supplying oxygen from the gate insulating layer 402 to the oxide semiconductor film 441 is preferably performed before the oxide semiconductor film 441 is processed into an island shape, in which case oxygen contained in the gate insulating layer 402 can be prevented from being released by the heat treatment.

By the supply of oxygen to the oxide semiconductor film 441, oxygen vacancies in the oxide semiconductor film 441 can be filled.

Then, a conductive film 475 is formed over the oxide semiconductor film 441 (see FIG. 5A).

The conductive film 475 is to be processed into the first barrier layer 475a and the second barrier layer 475b, which are one layer of the drain electrode layer and one layer of the source electrode layer, respectively.

As the conductive film 475, it is possible to use, for example, a metal layer containing an element selected from Al, Cr, Cu, Ta, Ti, Mo, and W, a metal nitride layer containing any of these elements as its component (a titanium nitride layer, a molybdenum nitride layer, or a tungsten nitride layer), or the like. Alternatively, a layer of a high-melting-point metal such as Ti, Mo, or W or a metal nitride layer thereof (e.g., a titanium nitride layer, a molybdenum nitride layer, or a tungsten nitride layer) may be formed over and/or under a metal layer of Al, Cu, or the like. Further alternatively, the conductive film 475 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

Then, a positive resist is formed over the conductive film 475 and subjected to exposure to an electron beam; thus, a resist mask 453 is formed (see FIG. 5B). The resist mask 453 is formed so as to overlap with a portion other than a channel region of the transistor 440. As is obvious from FIG. 5B, the resist mask 453 has a slit (or a slit-like groove). Note that the resist in the slit portion may remain as long as it is thinner than in the other portions although the resist in the slit portion is completely removed in FIG. 5B. Generally, the electron beam exposure takes a long time so that it is preferable that the shape of the portion to be irradiated with an electron beam (the shape of the groove formed in the resist mask 453) be as simple as possible, such as being linear, circular, or annular, for example. Further, it is preferable that the area of the portion to be irradiated with the electron beam (the area of the groove formed in the resist mask 453) be as small as possible, such as 5% of the total area of the resist mask or less, more preferably, 1% of the total area of the resist mask or less, for example. In addition, the area of the portion to be irradiated with the electron beam may be 0.01% of the total area of the resist mask or more.

A method for forming a resist mask by exposure to an electron beam is described in detail in Embodiment 1, and therefore the description is omitted here. Note that in Embodiment 1, the method is described in which after the first low-resistance material layer 405a and the second low-resistance material layer 405b are formed, the resist mask is formed by exposure to an electron beam and the first barrier layer 475a and the second barrier layer 475b are formed by etching with the mask. In Embodiment 2, a method is described in which etching for the first barrier layer 475a and the second barrier layer 475b is performed earlier.

For the exposure to an electron beam, it is preferable that the resist mask 453 be as thin as possible. In order to form the resist mask 453 thin, it is preferable that a surface on which the resist mask is formed be as flat as possible. In the method for manufacturing the semiconductor device of this embodiment, the unevenness due to the gate electrode layer 401 and the insulating layer 432 can be reduced by planarization treatment of the gate electrode layer 401 and the insulating layer 432; thus, the resist mask can be thin. This facilitates the exposure to an electron beam.

Next, the conductive film 475 is selectively etched using the resist mask 453 as a mask; thus, an opening is formed in a region where a channel is formed (see FIG. 5C). Here, the region from which the conductive film 475 has been removed serves as a channel formation region of the transistor 440. Since the channel length can be determined by the exposure to an electron beam, a transistor with a small channel length, e.g., a channel length of less than 50 nm, can be manufactured.

At that time, it is preferable to employ etching conditions where the etching selectivity of the conductive film 475 to the resist mask 453 is high. For example, it is preferable to employ dry etching using a mixed gas of $Cl_2$ and HBr as an etching gas with the flow rate of HBr higher than the flow rate of $Cl_2$. For example, it is preferable that the flow rate ratio be $Cl_2$:HBr=20:80. In the case of etching with inductively coupled plasma (also referred to as ICP etching) with an ICP power of 500 W, the etching selectivity of the conductive film 475 to the resist mask 453 can be high when the bias power is set to 30 W to 40 W.

Then, a resist mask 455 is provided over the oxide semiconductor film 441 and the conductive film 475 through a photolithography process (see FIG. 6A).

Note that the resist mask 455 may be formed by an inkjet method. Formation of the resist mask by an inkjet method needs no photomask; thus, manufacturing cost can be reduced.

Then, the conductive film 475 and the oxide semiconductor film 441 are sequentially etched using the resist mask 455. Thus, the first barrier layer 475a having an island shape, the second barrier layer 475b having an island shape, and the oxide semiconductor layer 403 having an island shape are formed (see FIG. 6B).

For the etching of the conductive film 475, a gas containing chlorine, for example, a gas containing chlorine ($Cl_2$), boron trichloride ($BCl_3$), silicon tetrachloride ($SiCl_4$), or carbon tetrachloride ($CCl_4$) can be used. Alternatively, a gas containing fluorine, for example, a gas containing carbon tetrafluoride ($CF_4$), sulfur hexafluoride ($SF_6$), nitrogen trifluoride ($NF_3$), or trifluoromethane ($CHF_3$) can be used. Alternatively, any of these gases to which a rare gas such as helium (He) or argon (Ar) is added, or the like can be used.

As an etching method, a parallel plate reactive ion etching (RIE) method, an inductively coupled plasma (ICP) etching method, or the like can be used. In order to etch the film into a desired shape, the etching conditions (the amount of electric power applied to a coil-shaped electrode, the amount of electric power applied to an electrode on a substrate side, the temperature of the electrode on the substrate side, or the like) are adjusted as appropriate.

In this embodiment, a titanium film is used as the conductive film 475. The conductive film is etched by a dry etching method; thus, the first barrier layer 475a and the second barrier layer 475b are formed.

Note that it is preferable that etching conditions be optimized so as not to etch and divide the oxide semiconductor film 441 when the conductive film 475 is etched. However, it is difficult to obtain conditions under which only the conductive film is etched and the oxide semiconductor film 441 is not etched at all. Therefore, in some cases, only part of the oxide semiconductor film 441 is etched to be an oxide semiconductor film having a groove (a depressed portion) at the time of etching of the conductive film.

Note that in the drawings, the first barrier layer 475a and the second barrier layer 475b are thinner than the first low-resistance material layer 405a and the second low-resistance material layer 405b; however, the present invention is not limited thereto. The first barrier layer 475a and the second barrier layer 475b are formed using the resist mask which is formed by the electron beam exposure, and are therefore preferably thin in terms of the manufacturing process. In addition, when the first low-resistance material layer 405a and the second low-resistance material layer 405b are formed thick, the resistance of the source electrode and the drain electrode can be lowered.

The gap between the first barrier layer 475a and the second barrier layer 475b is narrower than the gap between the first low-resistance material layer 405a and the second low-resistance material layer 405b. In particular, because the first barrier layer 475a and the second barrier layer 475b have higher resistance than the first low-resistance material layer 405a and the second low-resistance material layer 405b, the resistance between the source electrode, the oxide semiconductor layer 403, and the drain electrode can be lowered by decreasing the gap between the first low-resistance material layer 405a and the second low-resistance material layer 405b.

After that, the oxide semiconductor film 441 is etched; thus, the oxide semiconductor layer 403 having an island shape is formed. Note that dry etching or wet etching, or both, may be usable for the etching of the oxide semiconductor film 441. As an etchant used for wet etching of the oxide semiconductor film 441, for example, a mixed solution of phosphoric acid, acetic acid, and nitric acid, or the like can be used. In addition, ITO-07N (produced by KANTO CHEMICAL CO., INC.) may be used. It is also possible to employ dry etching using an inductively coupled plasma (ICP) etching method.

Next, the resist mask 455 is removed, and then a conductive film 452 is formed over the oxide semiconductor layer 403, the first barrier layer 475a, and the second barrier layer 475b (see FIG. 6C).

The conductive film 452 is to be processed into the first low-resistance material layer 405a and the second low-resistance material layer 405b.

A resist mask 456 is formed over the conductive film 452 through a photolithography process (see FIG. 7A), and selective etching is performed. Thus, the first low-resistance material layer 405a and the second low-resistance material layer 405b are formed. After the first low-resistance material layer 405a and the second low-resistance material layer 405b are formed, the resist mask is removed (see FIG. 7B).

The first barrier layer 475a and the first low-resistance material layer 405a function as the source electrode layer of the transistor 440. The second barrier layer 475b and the second low-resistance material layer 405b function as the drain electrode layer of the transistor 440.

The conductive film 452 can be etched under conditions similar to those for the conductive film 475.

Through the above-described process, the transistor 440 of this embodiment is manufactured.

In this embodiment, the insulating layer 406 is formed over the stacked source electrode layer, the stacked drain electrode layer, and the oxide semiconductor layer 403 (see FIG. 7C).

As the insulating layer 406, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

Note that the insulating layer 406 may be subjected to oxygen doping treatment. When the insulating layer 406 is subjected to the oxygen doping treatment, the oxide semiconductor layer 403 can be supplied with oxygen. The oxygen doping of the insulating layer 406 can be similar to the above-described oxygen doping treatment of the gate insulating layer 402 and the oxide semiconductor layer 403.

Note that another structure may be employed in which the insulating layer 406 is provided before the conductive film 452 is provided, and the first low-resistance material layer 405a and the second low-resistance material layer 405b are electrically connected to the first barrier layer 475a and the second barrier layer 475b, respectively, through openings formed in the insulating layer 406.

Further, a dense inorganic insulating film may be provided over the insulating layer 406. For example, an aluminum oxide film is formed over the insulating layer 406 by a sputtering method. When the aluminum oxide film has high density (the film density is higher than or equal to 3.2 $g/cm^3$, preferably higher than or equal to 3.6 $g/cm^3$), the transistor 440 can have stable electrical characteristics. The film density can be measured by Rutherford backscattering spectrometry or X-ray reflectometry.

The aluminum oxide film which can be used as the insulating film provided over the transistor 440 has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor layer 403 and release of oxygen, which is a main component material of the oxide semiconductor, from the oxide semiconductor layer 403.

In addition, a planarization insulating film may be formed in order to reduce surface roughness caused by the transistor 440. For the planarization insulating film, an organic material such as a polyimide resin, an acrylic resin, or a benzocyclobutene resin can be used. Other than such organic materials, it is also possible to use a low-dielectric constant material (low-k material) or the like. Note that the planarization insulating film may be formed by stacking a plurality of insulating films formed of any of these materials.

For example, an acrylic resin film having a thickness of 1500 nm may be formed as the planarization insulating film. The acrylic resin film can be formed in such a manner that an acrylic resin is applied by a coating method and then baked (e.g., at 250° C. in a nitrogen atmosphere for 1 hour).

Heat treatment may be performed after the planarization insulating film is formed. For example, the heat treatment is performed at 250° C. in a nitrogen atmosphere for 1 hour.

As described above, heat treatment may be performed after formation of the transistor 440. The heat treatment may be performed more than once.

The channel length of the transistor described in this embodiment is determined by the gap between the first barrier layer 475a and the second barrier layer 475b, and the gap between the first barrier layer 475a and the second barrier layer 475b is determined by etching with a resist mask obtained by exposure to an electron beam. Precise exposure and development using an electron beam can provide a precise pattern; thus, a minute transistor with a channel length L of less than 50 nm can be manufactured.

This embodiment can be implemented in appropriate combination with any of the other embodiments.

Embodiment 3

In this embodiment, a structure of a semiconductor device in one embodiment of the present invention, which is different from those in Embodiments 1 and 2, will be described.

Figure 13A:
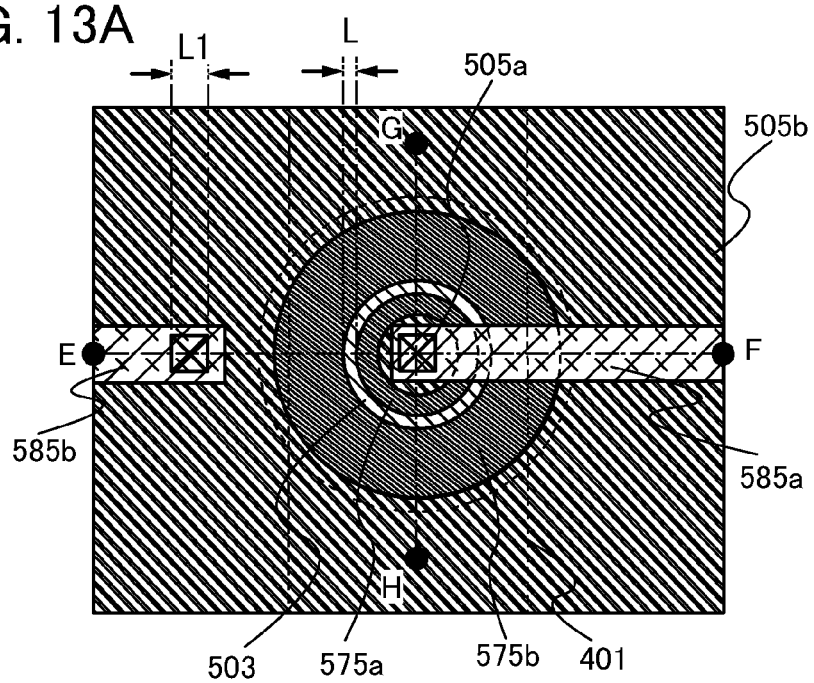
FIGS. 13A to 13C are cross-sectional views and a top view of a semiconductor device of one embodiment of the present invention.
Figure 13B:
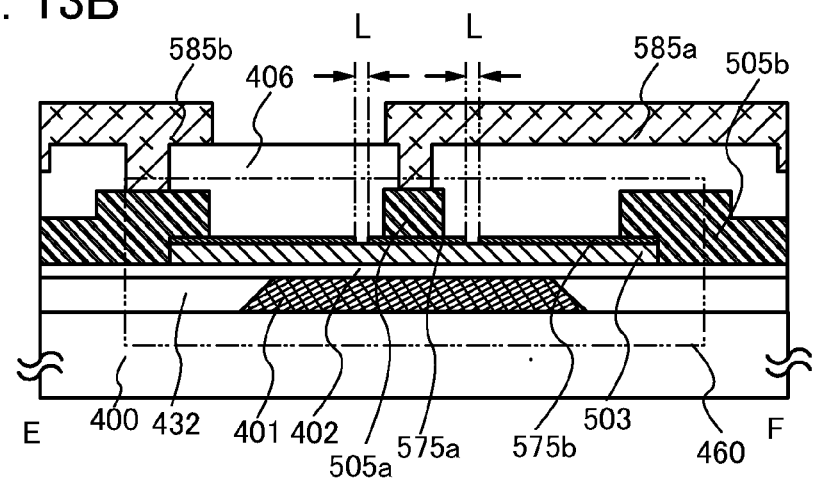
Figure 13C:
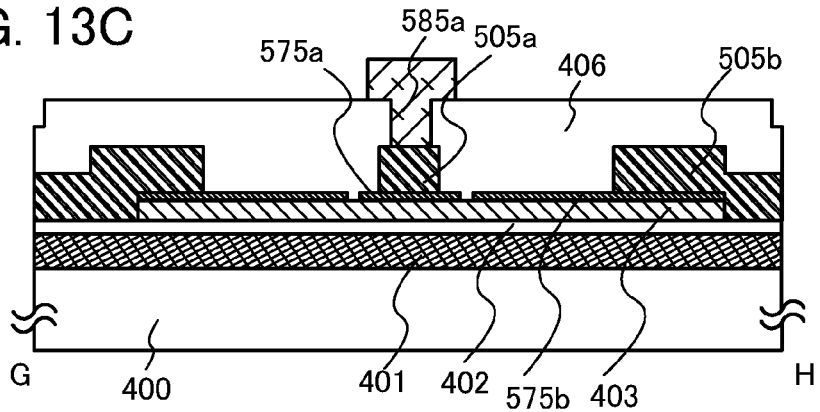

FIGS. 13A to 13C illustrate the semiconductor device of this embodiment. FIG. 13A is a top view of a transistor included in the semiconductor device of this embodiment. FIG. 13B is a cross-sectional view taken along E-F (channel length direction) in FIG. 13A. FIG. 13C is a cross-sectional view taken along G-H in FIG. 13A. Note that some components illustrated in FIG. 13B or 13C are not illustrated in FIG. 13A for simplicity of the drawing.

Note that, in this embodiment, portions that are similar to the portions in Embodiments 1 and 2 are denoted by the same reference numerals in the drawings, and detailed description thereof is omitted.

A transistor 460 illustrated in FIGS. 13A to 13C includes a gate electrode layer 401 over a substrate 400, an insulating layer 432 which is in contact with a side surface of the gate electrode layer 401 and in which the gate electrode layer 401 is buried, a gate insulating layer 402 over the insulating layer 432 and the gate electrode layer 401, an oxide semiconductor layer 503 over the gate insulating layer 402, a stacked source electrode layer and a stacked drain electrode layer over the oxide semiconductor layer 503, an insulating layer 406 over the oxide semiconductor layer 503, the source electrode layer, and the drain electrode layer, and a wiring layer 585a and a wiring layer 585b electrically connected to the drain electrode layer and the source electrode layer, respectively, through openings formed in the insulating layer 406.

The stacked drain electrode layer includes a first barrier layer 575a and a first low-resistance material layer 505a in contact with the first barrier layer 575a. The stacked source electrode layer includes a second barrier layer 575b and a second low-resistance material layer 505b in contact with the second barrier layer 575b. The first barrier layer 575a and the second barrier layer 575b prevent the first low-resistance material layer 505a and the second low-resistance material layer 505b, respectively, from being oxidized by being in contact with the oxide semiconductor layer 503. Note that the first low-resistance material layer 505a and the second low-resistance material layer 505b are each in contact with the side surface of the oxide semiconductor layer 503; however, the first barrier layer 575a and the second barrier layer 575b prevent the first low-resistance material layer 505a and the second low-resistance material layer 505b from being oxidized because the oxide semiconductor layer 503 is sufficiently thin. The wiring layer 585a and the wiring layer 585b are electrically connected to the first low-resistance material layer 505a and the second low-resistance material layer 505b, respectively.

The second barrier layer 575b is formed so as to surround the first barrier layer 575a. The second low-resistance material layer 505b is formed so as to surround the first low-resistance material layer 505a. A channel formation region of the transistor 460 is sandwiched between the first barrier layer 575a and the second barrier layer 575b.

The gap (L in the diagrams) between the first barrier layer 575a and the second barrier layer 575b is determined with a resist mask obtained by exposure to an electron beam. Precise exposure and development using an electron beam can provide a precise pattern. Thus, a minute transistor whose channel length L can be determined precisely can be obtained as the transistor 460. The semiconductor device of this embodiment can be employed not only in the case where the outer edge of the channel formation region is circular as illustrated in FIG. 13A but also in the case where the channel formation region is rectangular.

Note that in FIGS. 13A to 13C, the size of the openings in which the wiring layer 585a and the wiring layer 585b are formed (L1 in the drawing) is illustrated as being only several times as large as the gap between the first barrier layer 575a and the second barrier layer 575b; L1 is actually several tens of times as large as L. Since the gap between the first barrier layer 575a and the second barrier layer 575b is determined with a resist mask obtained by exposure to an electron beam, the channel formation region can be formed much more precisely than by etching with a resist mask formed through a photolithography process.

In general, in an end portion of the oxide semiconductor layer, an impurity (such as chlorine, fluorine, boron, or hydrogen) is easily mixed during the step of forming (etching) the oxide semiconductor layer and oxygen is easily released from the oxide semiconductor layer. Therefore, the end portion of the oxide semiconductor layer tends to become less resistive, where a parasitic channel is easily formed.

The reason why the parasitic channel is formed in the end portion of the oxide semiconductor layer is because of the presence of the source electrode layer and the drain electrode layer of the transistor which are electrically connected to the end portion. In the transistor 460 described in this embodiment, the first barrier layer 575a and the first low-resistance material layer 505a which serve as the drain electrode layer are surrounded by the second barrier layer 575b and the second low-resistance material layer 505b which serve as the source electrode layer, and the drain electrode layer is not electrically connected to the end portion of the oxide semiconductor layer 503. Therefore, a transistor in which a parasitic channel is not easily formed can be obtained.

Next, a method for manufacturing the transistor 460 will be described. Note that the description of points similar to those in Embodiments 1 and 2 is omitted.

The gate electrode layer 401, the gate insulating layer 402, the insulating layer 432, and the oxide semiconductor layer 503 which are included in the transistor 460 can be formed using materials and methods similar to those in Embodiments 1 and 2. Note that the substrate 400 is provided with a semiconductor element, which is not illustrated in FIGS. 13A to 13C for simplicity.

A conductive film to be processed into the first barrier layer 575a and the second barrier layer 575b is provided over the oxide semiconductor layer 503. The conductive film can be formed using a material and a method similar to those in Embodiments 1 and 2.

A resist is formed over the conductive film which is to be processed into the first barrier layer 575a and the second barrier layer 575b, and the resist is patterned through exposure to an electron beam; thus, a mask is formed. The resist mask is formed so as to overlap with a portion other than a channel formation region in the oxide semiconductor layer. That is, the resist mask has an annular groove or a ring-like groove. Using the resist mask, etching is performed; thus, the first barrier layer 575a and the second barrier layer 575b are formed.

The channel length of the transistor 460 is preferably equal in any part of the transistor. Since the shape of the channel formation region of the transistor of this embodiment includes a curved line, it is preferable to form the curved line by exposure to an electron beam so as to be smooth and so as to have an equal the line width.

In order to form a smooth curved line with an equal line width by exposure to an electron beam, there is a method for exposure of a curved line by rotating a stage with a substrate thereon, for example. With a linearly movable stage, a resist mask can also be patterned so that the channel length of the transistor becomes equal, by using a method in which the size or direction of a plurality of divided regions of a figure for electron beam writing is optimized, a multi-pass writing method in which a figure is shifted by a uniform width and writing is performed with an overlap so that the amount of light exposure of a pattern becomes equal, or the like. It is preferable to use the above method or the like to form a resist mask with an equal line width so that the channel length of the transistor 460 becomes equal.

The semiconductor device of this embodiment which is manufactured in the above manner can be employed not only in the case where the channel formation region is rectangular but also in the case where the channel formation region is circular.

A conductive film which is to be processed into the first low-resistance material layer 505a and the second low-resistance material layer 505b is formed over the first barrier layer 575a and the second barrier layer 575b and etched using photolithography; thus, the first low-resistance material layer 505*a* and the second low-resistance material layer 505*b* are formed.

Note that the etching for forming the first low-resistance material layer 505*a* and the second low-resistance material layer 505*b* may be performed before the etching for the first barrier layer 575*a* and the second barrier layer 575*b*, as described in Embodiment 1. Alternatively, the etching for forming the first low-resistance material layer 505*a* and the second low-resistance material layer 505*b* may be performed after the formation of the oxide semiconductor layer 503, the first barrier layer 575*a*, and the second barrier layer 575*b*, as described in Embodiment 2.

Next, the insulating layer 406 is formed over the first barrier layer 575*a*, the second barrier layer 575*b*, the first low-resistance material layer 505*a*, and the second low-resistance material layer 505*b*. The insulating layer 406 can be formed using a method and a material similar to those in Embodiments 1 and 2.

Then, the insulating layer 406 is etched; thus, the openings reaching the first low-resistance material layer 505*a* and the second low-resistance material layer 505*b* are formed. The insulating layer 406 can be etched by an etching method similar to those described in Embodiments 1 and 2.

Then, a conductive film is formed over the openings and the insulating layer 406 and is then etched; thus, the wiring layer 585*a* and the wiring layer 585*b* can be formed. The wiring layer 585*a* and the wiring layer 585*b* are electrically connected to the first low-resistance material layer 505*a* and the second low-resistance material layer 505*b*, respectively.

In the transistor 460 described in this embodiment, the gap between the first barrier layer 575*a* and the second barrier layer 575*b* is determined with a resist mask obtained by exposure to an electron beam. Precise exposure and development using an electron beam can provide a precise pattern.

Furthermore, in the transistor 460, only one of the source and drain electrode layers is connected to the end portion of the oxide semiconductor layer which tends to become less resistive; thus, a transistor in which a parasitic channel is not easily formed and which has excellent electrical characteristics can be provided.

This embodiment can be implemented in appropriate combination with any of the other embodiments.

Embodiment 4

In this embodiment, an example of a semiconductor device (memory device) which includes the transistor described in this specification, which can hold stored data even when not powered, and which has an unlimited number of write cycles will be described with reference to drawings.

Figure 8A:
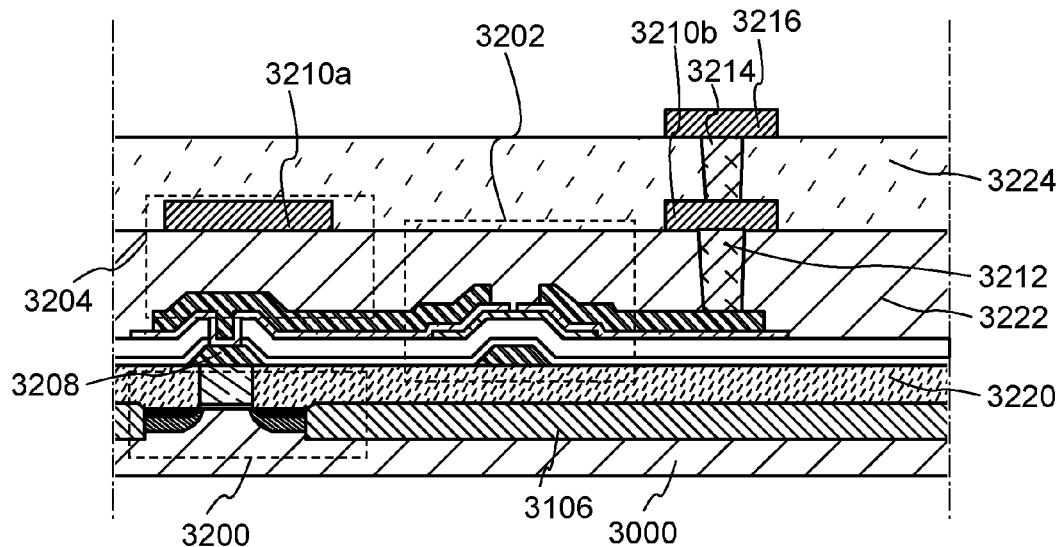
FIGS. 8A and 8B are a cross-sectional view and a circuit diagram illustrating one embodiment of a semiconductor device.
Figure 8B:
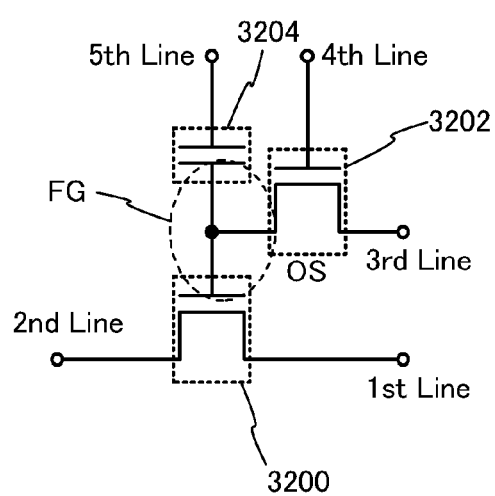

FIGS. 8A and 8B illustrate an example of a configuration of the semiconductor device. FIG. 8A is a cross-sectional view of the semiconductor device, and FIG. 8B is a circuit diagram of the semiconductor device. Note that FIG. 8B illustrates a circuit configuration similar to that in FIG. 2.

The semiconductor device illustrated in FIGS. 8A and 8B includes a transistor 3200 including a first semiconductor material in a lower portion, and a transistor 3202 including a second semiconductor material in an upper portion. The structure of the transistor 420 described in Embodiment 1 is applied to the transistor 3202.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor enables charge to be held for a long time owing to its characteristics.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to those described here except for the use of the transistor described in Embodiment 1 or 2, which is formed using an oxide semiconductor for holding data.

The transistor 3200 in FIG. 8A includes a channel formation region provided in a substrate 3000 including a semiconductor material (such as silicon), impurity regions provided such that the channel formation region is sandwiched therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3106 is formed on the substrate 3000 so as to surround the transistor 3200, and an insulating layer 3220 is formed so as to cover the transistor 3200.

The transistor 3200 formed using a single crystal semiconductor substrate can operate at high speed. Thus, when the transistor is used as a reading transistor, data can be read at high speed. As treatment prior to formation of the transistor 3202 and a capacitor 3204, CMP treatment is performed on the insulating layer 3220 covering the transistor 3200, whereby the insulating layer 3220 is planarized and, at the same time, an upper surface of the gate electrode layer of the transistor 3200 is exposed.

The transistor 3202 shown in FIG. 8A is a bottom-gate transistor including an oxide semiconductor in the channel formation region. Here, an oxide semiconductor layer included in the transistor 3202 is preferably highly purified. By using a purified oxide semiconductor, the transistor 3202 which has extremely favorable off-state characteristics can be obtained.

Since the off-state current of the transistor 3202 is small, stored data can be held for a long time owing to such a transistor. In other words, refresh operation becomes unnecessary or the frequency of the refresh operation can be extremely lowered, which leads to a sufficient reduction in power consumption.

One of source and drain electrode layers of the transistor 3202 is electrically connected to an electrode 3208 through an opening provided in a gate insulating layer and is electrically connected to the gate electrode layer of the transistor 3200 via the electrode 3208. The electrode 3208 can be formed through a process similar to that for a gate electrode layer of the transistor 3202.

An insulating layer 3222 having a single-layer structure or a stacked-layer structure is provided over the transistor 3202. In addition, a conductive layer 3210*a* is provided in a region overlapping with the one of the source and drain electrode layers of the transistor 3202 with the insulating layer 3222 provided therebetween, and the one of the source and drain electrode layers of the transistor 3202, the insulating layer 3222, and the conductive layer 3210a form the capacitor 3204. That is, the one of the source and drain electrode layers of the transistor 3202 functions as one electrode of the capacitor 3204, and the conductive layer 3210a functions as the other electrode of the capacitor 3204. Note that in the case where no capacitor is needed, a structure in which the capacitor 3204 is not provided is also possible. Alternatively, the capacitor 3204 may be separately provided above the transistor 3202.

An insulating layer 3224 is provided over the capacitor 3204. In addition, a wiring 3216 for connecting the transistor 3202 to another transistor is provided over the insulating layer 3224. The wiring 3216 is electrically connected to the other of the source and drain electrode layers of the transistor 3202 through an electrode 3214 provided in an opening formed in the insulating layer 3224, a conductive layer 3210b formed using the same layer as the conductive layer 3210a, and an electrode 3212 provided in an opening formed in the insulating layer 3222.

In FIGS. 8A and 8B, the transistors 3200 and 3202 are provided so as to at least partly overlap each other, and the source region or the drain region of the transistor 3200 is preferably provided to partly overlap with the oxide semiconductor layer included in the transistor 3202. In addition, the transistor 3202 and the capacitor 3204 are provided so as to overlap with at least part of the transistor 3200. For example, the conductive layer 3210a of the capacitor 3204 is provided so as to at least partly overlap with the gate electrode layer of the transistor 3200. When such a planar layout is employed, the area occupied by the semiconductor device can be reduced; thus, the degree of integration can be increased.

Next, an example of a circuit configuration corresponding to FIG. 8A is illustrated in FIG. 8B.

In FIG. 8B, a first wiring (1st Line) is electrically connected to a source electrode layer of the transistor 3200. A second wiring (2nd Line) is electrically connected to a drain electrode layer of the transistor 3200. A third wiring (3rd Line) is electrically connected to one of the source and drain electrode layers of the transistor 3202, and a fourth wiring (4th Line) is electrically connected to the gate electrode layer of the transistor 3202. The gate electrode layer of the transistor 3200 and the one of the source and drain electrode layers of the transistor 3202 are electrically connected to one electrode of the capacitor 3204. A fifth wiring (5th Line) is electrically connected to the other electrode of the capacitor 3204.

The semiconductor device in FIG. 8B utilizes a characteristic in which the potential of the gate electrode layer of the transistor 3200 can be held, and thus enables data writing, holding, and reading as follows.

Writing and holding of data will be described. First, the potential of the fourth wiring is set to a potential at which the transistor 3202 is turned on, so that the transistor 3202 is turned on. Accordingly, the potential of the third wiring is supplied to the gate electrode layer of the transistor 3200 and to the capacitor 3204. That is, predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode layer of the transistor 3200 is held (holding).

Since the off-state current of the transistor 3202 is significantly small, the charge of the gate electrode layer of the transistor 3200 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$, in the case where the low-level charge is given to the gate electrode layer of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode layer of the transistor 3200 can be determined. For example, in the case where the high-level charge is supplied in writing, when the potential of the fifth wiring is $V_0$ ($>V_{th\_H}$), the transistor 3200 is turned on. In the case where the low-level charge is supplied in writing, even when the potential of the fifth wiring is $V_0$ ($<V_{th\_L}$), the transistor 3200 remains off. Therefore, the data held can be read by measuring the potential of the second wiring.

Note that in the case where memory cells are arrayed, it is necessary that data of only a desired memory cell can be read. In that case, the fifth wirings of memory cells from which data is not read may be supplied with a potential at which the transistor 3200 is turned off regardless of the state of the gate electrode layer, that is, a potential lower than $V_{th\_H}$. Alternatively, the fifth wirings may be supplied with a potential at which the transistor 3200 is turned on regardless of the state of the gate electrode layer, that is, a potential higher than $V_{th\_L}$.

When including a transistor having a channel formation region formed using an oxide semiconductor and having extremely small off-state current, the semiconductor device described in this embodiment can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, since data are written by turning on or off the transistors, high-speed operation can be easily achieved.

As described above, a miniaturized and highly integrated semiconductor device having favorable electrical characteristics and a method for manufacturing the semiconductor device can be provided.

The configuration, method, and the like described above in this embodiment can be combined as appropriate with any of the configurations, methods, and the like described in the other embodiments.

Embodiment 5

In this embodiment, one embodiment of a structure of a memory device which is different from that in Embodiment 4 will be described.

Figure 9:
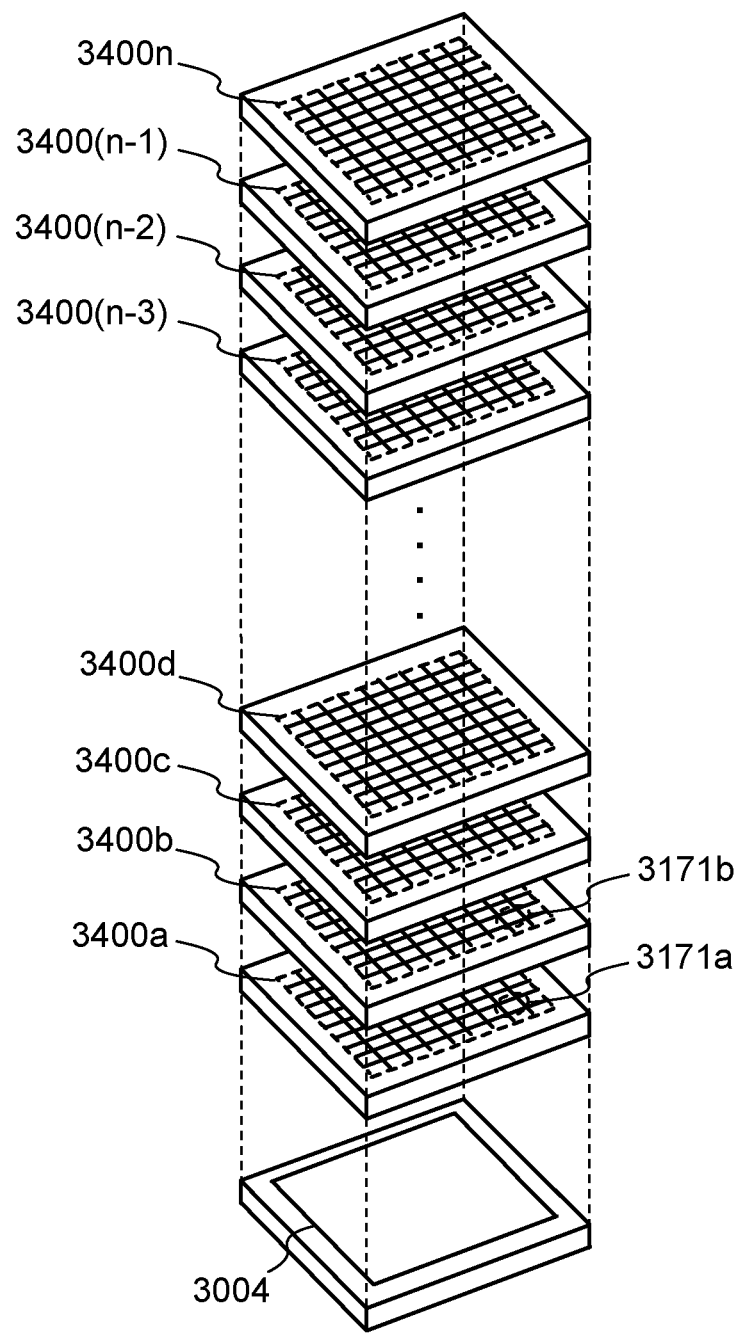
FIG. 9 is a perspective view illustrating one embodiment of a semiconductor device.

FIG. 9 is a perspective view of a memory device. The memory device illustrated in FIG. 9 includes a plurality of layers of memory cell arrays (memory cell arrays 3400a to 3400n (n is an integer greater than or equal to 2)) each including a plurality of memory cells as memory circuits in the upper portion, and a logic circuit 3004 in the lower portion which is necessary for operating the memory cell arrays.

Figure 10:
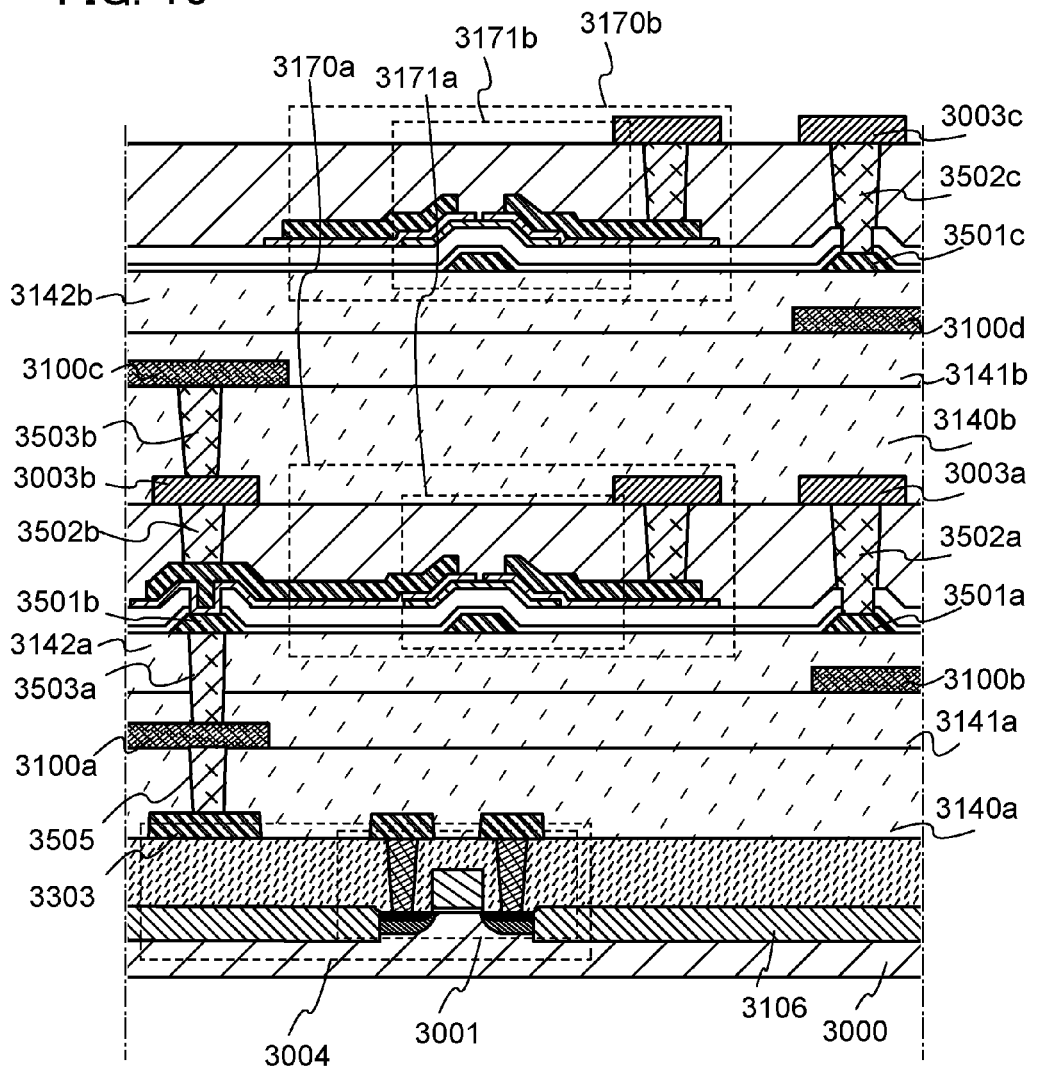
FIG. 10 is a cross-sectional view illustrating one embodiment of a semiconductor device.

FIG. 10 is a partial enlarged view of the memory device illustrated in FIG. 9. FIG. 10 illustrates the logic circuit 3004, the memory cell array 3400a, and the memory cell array 3400b, and illustrates a memory cell 3170a and a memory cell 3170b as typical examples among the plurality of memory cells included in the memory cell array 3400a and the memory cell array 3400b. The memory cell 3170a and the memory cell 3170b can have a configuration similar to the circuit configuration described in the above embodiment and illustrated in FIG. 8B or FIG. 2, for example.

Note that a transistor 3171a included in the memory cell 3170a is illustrated as a typical example. A transistor 3171b included in the memory cell 3170b is illustrated as a typical example. Each of the transistors 3171a and 3171b includes a channel formation region in an oxide semiconductor layer. The structure of the transistor in which the channel formation region is formed in the oxide semiconductor layer is the same as the structure described in any of the other embodiments, and thus the description of the structure is omitted.

An electrode 3501a which is formed using the same layer as a gate electrode layer of the transistor 3171a is electrically connected to an electrode 3003a via an electrode 3502a. An electrode 3501c which is formed using the same layer as a gate electrode layer of the transistor 3171b is electrically connected to an electrode 3003c via an electrode 3502c.

The logic circuit 3004 includes a transistor 3001 in which a semiconductor material other than an oxide semiconductor is used for a channel formation region. The transistor 3001 can be a transistor obtained in such a manner that an element isolation insulating layer 3106 is provided on a substrate 3000 including a semiconductor material (e.g., silicon) and a region serving as the channel formation region is formed in a region surrounded by the element isolation insulating layer 3106. Note that the transistor 3001 may be a transistor obtained in such a manner that the channel formation region is formed in a semiconductor film such as a silicon film formed on an insulating surface or in a silicon film of an SOI substrate. A known structure can be used as the structure of the transistor 3001 and thus the description is omitted.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed. An insulating film 3141a is provided between the wiring 3100a and the wiring 3100b. An insulating film 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating film 3140b is provided between the wiring 3100c and the layers in which the transistor 3171a is formed. An insulating film 3141b is provided between the wiring 3100c and the wiring 3100d. An insulating film 3142b is provided between the wiring 3100d and the layers in which the transistor 3171b is formed.

The insulating films 3140a, 3141a, 3142a, 3140b, 3141b, and 3142b each function as an interlayer insulating film whose surface can be planarized.

The wirings 3100a, 3100b, 3100c, and 3100d enable electrical connection between the memory cells, electrical connection between the logic circuit 3004 and the memory cells, and the like.

An electrode 3303 included in the logic circuit 3004 can be electrically connected to a circuit provided in the upper portion.

For example, as illustrated in FIG. 10, the electrode 3303 can be electrically connected to the wiring 3100a via an electrode 3505. The wiring 3100a can be electrically connected to an electrode 3501b which is formed using the same layer as the gate electrode layer of the transistor 3171a via an electrode 3503a. In this manner, the wiring 3100a and the electrode 3303 can be electrically connected to the source or the drain of the transistor 3171a. The electrode 3501b can be electrically connected to an electrode 3003b via the source or the drain of the transistor 3171a and an electrode 3502b. The electrode 3003b can be electrically connected to the wiring 3100c via an electrode 3503b.

FIG. 10 illustrates an example in which the electrode 3303 and the transistor 3171a are electrically connected to each other via the wiring 3100a; however, one embodiment of the disclosed invention is not limited thereto. The electrode 3303 may be electrically connected to the transistor 3171a via the wiring 3100b, via both the wiring 3100a and the wiring 3100b, or via another electrode without using the wiring 3100a nor the wiring 3100b.

FIG. 10 illustrates the structure where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer or three or more wiring layers may be provided between the layers in which the transistor 3171a is formed and the layers in which the transistor 3001 is formed.

FIG. 10 illustrates the structure where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the number of wiring layers provided therebetween is not limited to two. One wiring layer or three or more wiring layers may be provided between the layers in which the transistor 3171b is formed and the layers in which the transistor 3171a is formed.

The configuration, method, and the like described above in this embodiment can be combined as appropriate with any of the configurations, methods, and the like described in the other embodiments.

Embodiment 6

A semiconductor device disclosed in this specification can be applied to a variety of electronic devices. Examples of electronic devices include a television device (also referred to as a television or a television receiver), a monitor of a computer or the like, a camera such as a digital camera or a digital video camera, a digital photo frame, a mobile phone, a portable game machine, a portable information terminal, an audio reproducing device, a game machine (such as a pachinko machine or a slot machine), and a game console, and the like.

Figure 11A:
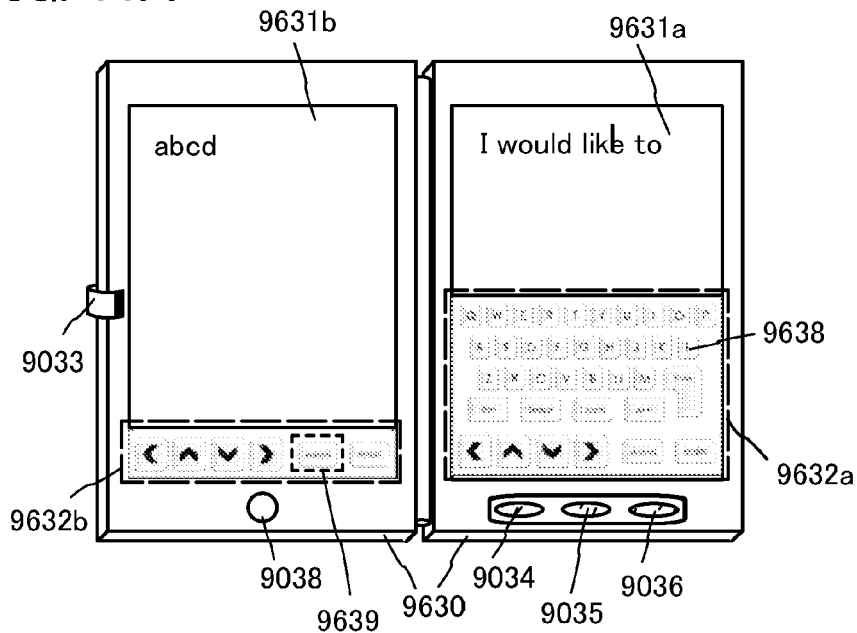
FIGS. 11A to 11C illustrate an electronic device of one embodiment of the present invention.
Figure 11B:
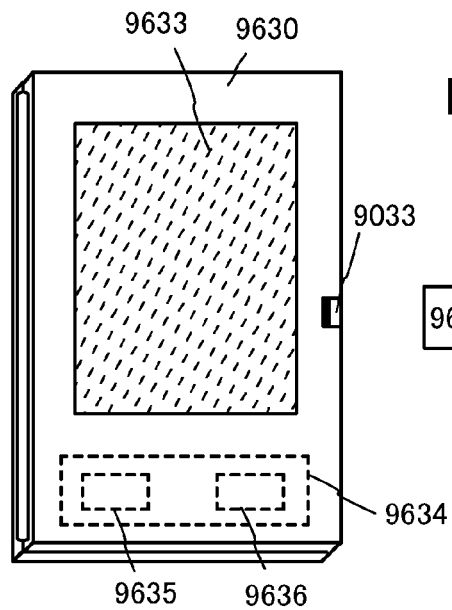
Figure 11C:
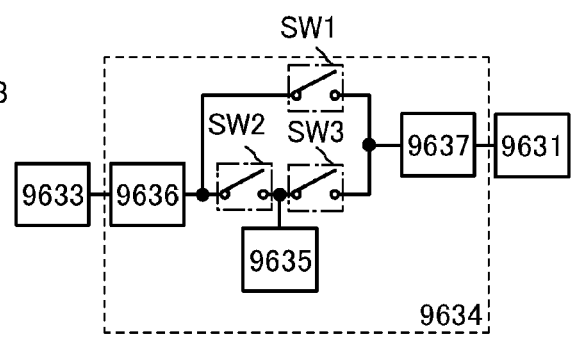

FIGS. 11A to 11C illustrate a specific example of an electronic device. FIGS. 11A and 11B illustrate a foldable tablet terminal. The tablet terminal is opened in FIG. 11A. The tablet terminal includes a housing 9630, a display portion 9631a, a display portion 9631b, a display mode switch 9034, a power switch 9035, a power saver switch 9036, a clasp 9033, and an operation switch 9038.

The semiconductor device described in Embodiment 1 or 2 can be used for the display portion 9631a and the display portion 9631b, so that the tablet terminal can have high reliability. In addition, the memory device described in Embodiment 4 or 5 may be applied to the semiconductor device of this embodiment.

Part of the display portion 9631a can be a touch panel region 9632a and data can be input when a displayed operation key 9638 is touched. Although a structure in which a half region in the display portion 9631a has only a display function and the other half region also has a touch panel function is shown as an example, the display portion 9631a is not limited to the structure. The display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Note that FIG. 11A shows an example in which the display portion 9631a and the display portion 9631b have the same display area; however, without limitation thereon, one of the display portions may be different from the other display portion in size and display quality. For example, one display panel may be capable of higher-definition display than the other display panel.

The tablet terminal is closed in FIG. 11B. The tablet terminal includes the housing 9630, a solar cell 9633, a charge and discharge control circuit 9634, a battery 9635, and a DCDC converter 9636. In FIG. 11B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 11A and 11B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

The structure and the operation of the charge and discharge control circuit 9634 illustrated in FIG. 11B will be described with reference to a block diagram in FIG. 11C. The solar cell 9633, the battery 9635, the DCDC converter 9636, a converter 9637, switches SW1 to SW3, and a display portion 9631 are illustrated in FIG. 11C, and the battery 9635, the DCDC converter 9636, the converter 9637, and the switches SW1 to SW3 correspond to the charge and discharge control circuit 9634 illustrated in FIG. 11B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation thereon, the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

The configuration, method, and the like described in this embodiment can be combined as appropriate with any of the configurations, methods, and the like described in the other embodiments.

Embodiment 7

In this embodiment, an example of a structure whose top view is partly different from that in Embodiment 1 will be described. Note that a cross-sectional structure thereof is the same as that in Embodiment 1, so the detailed description is omitted here.

Figure 14:
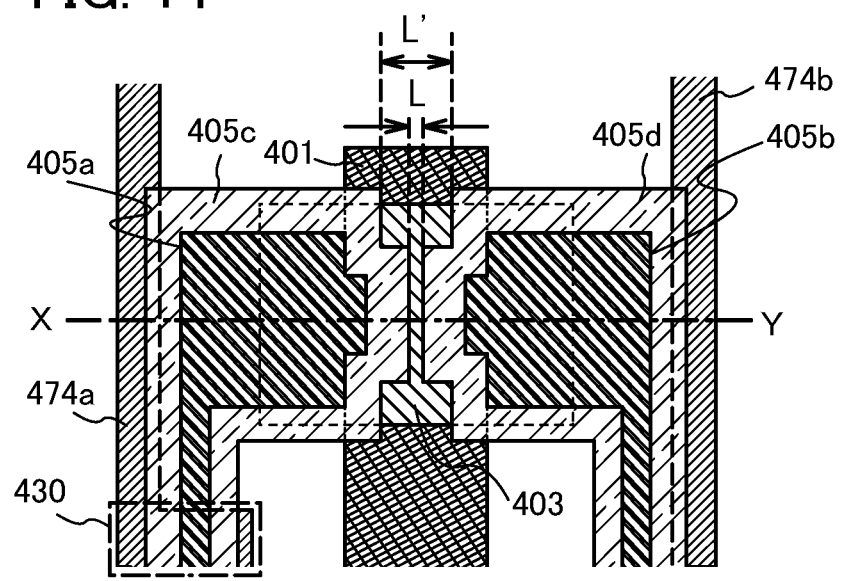
FIG. 14 is a top view of a semiconductor device of one embodiment of the present invention.

FIG. 14 illustrates a top view which is partly different from that in FIG. 1B. Note that the cross-sectional view taken along line X-Y in FIG. 14 is the same as that in FIG. 1A, and the same reference numerals are used for explanation.

The channel length L of the transistor 420 is determined by the narrowest gap between the first barrier layer 405c and the second barrier layer 405d, and the narrowest gap between the first barrier layer 405c and the second barrier layer 405d is determined by etching with a resist mask obtained by exposure to an electron beam. Precise exposure and development using an electron beam can provide a precise pattern; thus, the narrowest gap between the first barrier layer 405c and the second barrier layer 405d, i.e., the channel length L, can be less than 50 nm, e.g., 20 nm or 30 nm. That is, by forming an opening with different widths in a mask for the first barrier layer 405c and the second barrier layer 405d, for example, providing an opening having a portion with a width of 20 nm and a portion with a width of 30 nm, a transistor with a channel length L of 20 nm and a wider gap L' of 30 nm can be obtained. At a higher acceleration voltage, an electron beam can provide a more precise pattern. In addition, the use of multiple electron beams can shorten the process time per substrate. Note that the first barrier layer 405c and the second barrier layer 405d may be formed by etching using a photomask, except in the region which determines the channel length L. Note that the first barrier layer 405c and the second barrier layer 405d have a thickness of 5 nm to 30 nm, preferably 10 nm or less.

Here, a method will be described in which an electron beam is used for exposure of a resist which determines the gap between the first barrier layer 405c and the second barrier layer 405d.

First, the gate electrode layer 401 is formed through a first photolithography process, and the gate insulating layer 402 and an oxide semiconductor film are formed. Then, a resist mask is provided over the oxide semiconductor film through a second photolithography process and etching is performed; thus, the oxide semiconductor layer 403 is formed. After that, a first conductive film to be processed into the first barrier layer 405c and the second barrier layer 405d is formed over the oxide semiconductor layer 403 having an island shape, and a second conductive film to be processed into the first low-resistance material layer 405a and the second low-resistance material layer 405b is formed over the first conductive film.

Next, a resist mask is provided over the second conductive film through a third photolithography process and the second conductive film is etched; thus, the first low-resistance material layer 405a and the second low-resistance material layer 405b are formed with the first conductive film remaining as an etching stopper.

Then, a resist mask is formed so as to cover side surfaces of the first low-resistance material layer 405a and the second low-resistance material layer 405b through a fourth photolithography process, and part of the first conductive film is removed by etching. At that time, the first conductive film overlapping with the oxide semiconductor layer 403 is left remaining.

Next, the resist mask is removed, and then a resist is formed over the first conductive film so as to cover the side surfaces of the first low-resistance material layer 405a and the second low-resistance material layer 405b and is exposed to an electron beam; thus, a resist mask is formed. The resist mask is formed so as to overlap with a region other than a channel formation region of the transistor 420.

As a resist material, a siloxane-based resist, a polystyrene-based resist, or the like can be used, for example. Note that it is preferable to use a positive resist rather than a negative resist because a pattern with a small width is to be formed. For example, in the case where the width of the pattern is 30 nm, the thickness of the resist can be 30 nm.

Here, in an electron beam writing apparatus capable of electron beam irradiation, the acceleration voltage is preferably in the range from 5 kV to 50 kV, for example. The current intensity is preferably in the range from $5 \times 10^{-12}$ A to $1 \times 10^{-11}$ A. The minimum beam size is preferably 2 nm or less. The minimum possible pattern line width is preferably 8 nm or less.

Under the above conditions, a pattern with a width of 30 nm or less, preferably 20 nm or less, more preferably 8 nm or less, can be obtained, for example.

A method for forming the first barrier layer 405c and the second barrier layer 405d by forming a resist mask by exposure to an electron beam after forming the first low-resistance material layer 405a and the second low-resistance material layer 405b and by etching the first conductive film covering the channel formation region of the oxide semiconductor layer 403 has the advantages of minimizing the chance of exposure of the channel formation region of the oxide semiconductor layer 403 to a plurality of treatments and preventing the mixture of an impurity.

Note that the method is described here in which after the first low-resistance material layer 405a and the second low-resistance material layer 405b are formed, the resist mask is formed by exposure to an electron beam and the first barrier layer 405c and the second barrier layer 405d are formed. However, the order of forming the first and second low-resistance material layers and the first and second barrier layers is not limited thereto. For example, the resist mask may be formed by exposure to an electron beam, the first barrier layer 405c and the second barrier layer 405d may be formed, and then the first low-resistance material layer 405a and the second low-resistance material layer 405b may be formed by etching.

After the resist mask is formed by exposure to an electron beam and a channel formation region is exposed by etching the first conductive film, the resist mask is removed and then the exposed surface of the oxide semiconductor layer is preferably subjected to plasma treatment (with an $N_2O$ gas or an $O_2$ gas) or cleaning (with water, oxalic acid, or dilute hydrofluoric acid (diluted to 1/100)). Impurities on the surface of the oxide semiconductor layer are preferably removed by exposure to oxalic acid, dilute hydrofluoric acid, or the like or by plasma treatment (such as $N_2O$ plasma treatment). Specifically, the copper concentration of the oxide semiconductor layer is lower than or equal to $1 \times 10^{18}$ atoms/cm$^3$, preferably lower than or equal to $1 \times 10^{17}$ atoms/cm$^3$. In addition, the aluminum concentration of the oxide semiconductor layer is lower than or equal to $1 \times 10^{18}$ atoms/cm$^3$. Further, the chlorine concentration of the oxide semiconductor layer is lower than or equal to $2 \times 10^{18}$ atoms/cm$^3$.

The channel length L of the transistor described in this embodiment is determined by the narrowest gap between the first barrier layer 405c and the second barrier layer 405d, and the narrowest gap between the first barrier layer 405c and the second barrier layer 405d is determined by etching with a resist mask obtained by exposure to an electron beam. Precise exposure and development using an electron beam can provide a precise pattern; thus, a minute transistor with a channel length L of less than 50 nm can be manufactured.

Parasitic channel leakage can be reduced by setting electron beam exposure as appropriate for the first barrier layer 405c and the second barrier layer 405d to decrease the channel width W of the channel formation region. In a specific layout, a channel formation region with a channel length L of less than 50 nm and a region with a gap L' which is wider than the channel length L are provided between a source electrode layer and a drain electrode layer as illustrated in FIG. 14. Leakage between the source electrode layer and the drain electrode layer is also reduced by distancing the position of the channel formation region from the end surface of the oxide semiconductor layer.

In addition, the oxide semiconductor layer illustrated in FIG. 14 has a rectangular upper surface shape, so that as large a portion of the end surface of the oxide semiconductor layer as possible is covered with the first barrier layer 405c and the second barrier layer 405d. In other words, two of the four sides of the rectangle are covered with the first barrier layer 405c and the second barrier layer 405d. This prevents the entry of an impurity from the end surface of the oxide semiconductor layer.

The upper surface shape of the oxide semiconductor layer illustrated in FIG. 14 is not limited to the rectangular shape and may be a polygonal shape, a circular shape, an elliptical shape, or the like.

Embodiment 8

In this embodiment, a semiconductor device of another embodiment, which is different from the semiconductor device described in Embodiment 2, and a method for manufacturing the semiconductor device will be described.

Figure 15A:
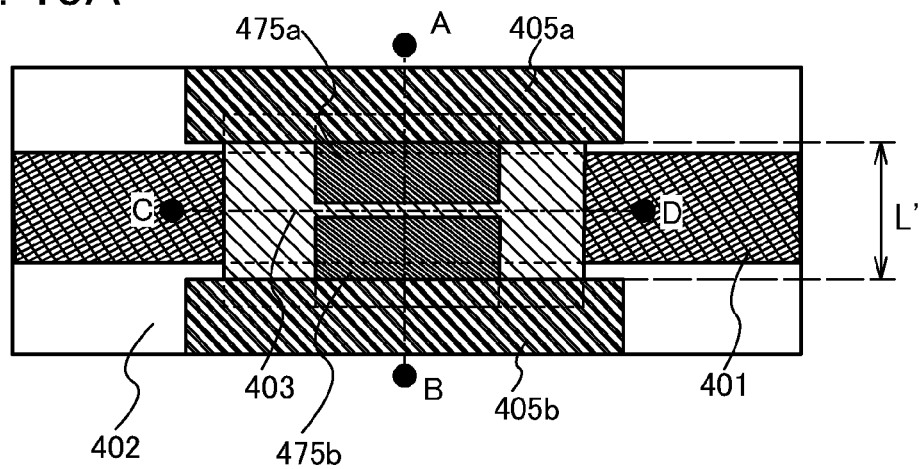
FIGS. 15A to 15C are a top view and cross-sectional views of a semiconductor device of one embodiment of the present invention.
Figure 15B:
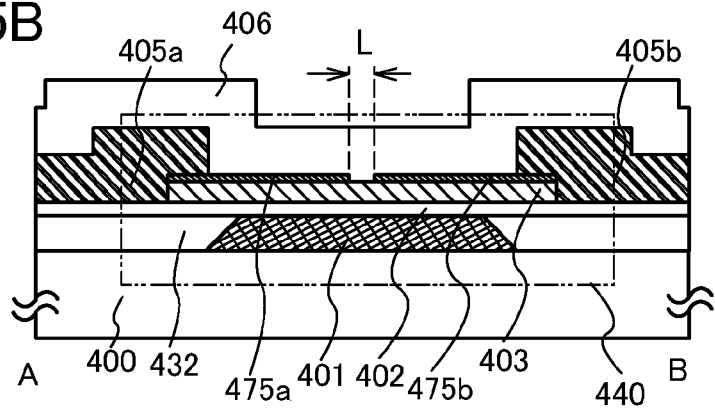
Figure 15C:
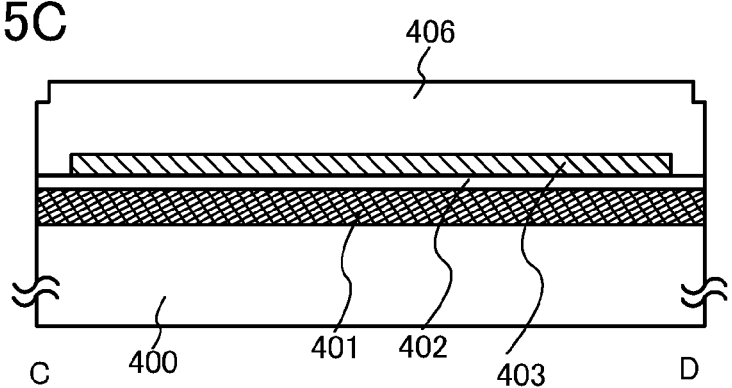

FIGS. 15A to 15C illustrate the semiconductor device of this embodiment. FIG. 15A is a top view of a transistor included in the semiconductor device of this embodiment. FIG. 15B is a cross-sectional view taken along A-B (channel length direction) in FIG. 15A. FIG. 15C is a cross-sectional view taken along C-D in FIG. 15A. Note that some components illustrated in FIG. 15B or 15C are not illustrated in FIG. 15A for simplicity of the drawing.

Note that, in this embodiment, portions that are similar to the portions in Embodiments 1 and 2 are denoted by the same reference numerals in the drawings, and detailed description thereof is omitted.

A transistor 440 illustrated in FIGS. 15A to 15C includes a gate electrode layer 401 over a substrate 400, an insulating layer 432 which is in contact with a side surface of the gate electrode layer 401 and in which the gate electrode layer 401 is buried, a gate insulating layer 402 over the insulating layer 432 and the gate electrode layer 401, an oxide semiconductor layer 403 over the gate insulating layer 402, a stacked source electrode layer and a stacked drain electrode layer over the oxide semiconductor layer 403, and an insulating layer 406 over the oxide semiconductor layer 403, the source electrode layer, and the drain electrode layer.

The stacked drain electrode layer includes a first barrier layer 475a and a first low-resistance material layer 405a in contact with the first barrier layer 475a. The stacked source electrode layer includes a second barrier layer 475b and a second low-resistance material layer 405b in contact with the second barrier layer 475b. The first barrier layer 475a and the second barrier layer 475b prevent the first low-resistance material layer 405a and the second low-resistance material layer 405b, respectively, from being oxidized by being in contact with the oxide semiconductor layer 403. Note that the first low-resistance material layer 405a and the second low-resistance material layer 405b are each in contact with the side surface of the oxide semiconductor layer 403; however, the first barrier layer 475a and the second barrier layer 475b prevent the first low-resistance material layer 405a and the second low-resistance material layer 405b from being oxidized because the oxide semiconductor layer 403 is sufficiently thin.

The width of the oxide semiconductor layer 403 in the channel length direction (the A-B direction in FIG. 15A) is larger than the width of the gate electrode layer in the channel length direction. This enables the oxide semiconductor layer 403 to be supplied with oxygen more easily from an insulating layer below the oxide semiconductor layer 403.

The gap between the first barrier layer 475a and the second barrier layer 475b is determined with a resist mask obtained by exposure to an electron beam. Precise exposure and development using an electron beam can provide a precise pattern.

The channel length L of the transistor 440 is equal to the narrowest gap between the first barrier layer 475a and the second barrier layer 475b; thus, a minute transistor whose channel length can be determined precisely can be obtained.

An example of a method for manufacturing the semiconductor device including the transistor 440 is illustrated in FIGS. 16A1 to 16A3 and FIGS. 17A1 to 17A3, 17B1 to 17B3, and 17C1 to 17C3. Note that FIG. 16A3 is a top view for explaining a process for manufacturing the transistor. FIG. 16A1 is a cross-sectional view taken along A-B in FIG. 16A3. FIG. 16A2 is a cross-sectional view taken long C-D in FIG. 16A3. Furthermore, FIG. 17A3 is a top view for explaining a process for manufacturing the transistor. FIG. 17A1 is a cross-sectional view taken along A-B in FIG. 17A3. FIG. 17A2 is a cross-sectional view taken long C-D in FIG. 17A3. In the following description, FIG. 17A refers to FIGS. 17A1 to 17A3. The same applies to FIGS. 17B and 17C.

Note that for the process of manufacturing the transistor 440, FIGS. 4A to 4C, FIGS. 5A to 5C, and FIGS. 6A and 6B can also be referred to. The process up to and including the step in FIG. 6B is the same as in Embodiment 2 and therefore not described in detail here.

According to Embodiment 2, after the state in FIG. 6B is obtained, through a photolithography process, a resist mask 457 is formed over the first barrier layer 475a and the second barrier layer 475b, and an end portion of the oxide semiconductor layer 403 is exposed by removing part of the first barrier layer 475a and part of the second barrier layer 475b (see FIGS. 16A1 to 16A3).

Next, the resist mask 457 is removed, and then a conductive film 452 is formed over the oxide semiconductor layer 403, the first barrier layer 475a, and the second barrier layer 475b.

The conductive film 452 is to be processed into the first low-resistance material layer 405a and the second low-resistance material layer 405b.

A resist mask 456 is formed over the conductive film 452 through a photolithography process (see FIG. 17A), and selective etching is performed. Thus, the first low-resistance material layer 405a and the second low-resistance material layer 405b are formed. After the first low-resistance material layer 405a and the second low-resistance material layer 405b are formed, the resist mask is removed (see FIG. 17B).

The first barrier layer 475a and the first low-resistance material layer 405a function as the drain electrode layer of the transistor 440. The second barrier layer 475b and the second low-resistance material layer 405b function as the source electrode layer of the transistor 440. The first barrier layer 475a and the second barrier layer 475b are formed using the resist mask which is formed by the electron beam exposure, and are therefore preferably thin in terms of the manufacturing process.

In addition, when the first low-resistance material layer 405a and the second low-resistance material layer 405b are formed thick, the resistance of the source electrode and the drain electrode can be lowered. Note that in this embodiment, as illustrated in FIG. 17C, the first barrier layer 475a and the second barrier layer 475b are thinner than the first low-resistance material layer 405a and the second low-resistance material layer 405b.

The conductive film 452 can be etched under conditions similar to those for the conductive film 475.

Through the above-described process, the transistor 440 of this embodiment is manufactured. In the transistor 440, the gap between the first barrier layer 475a and the second barrier layer 475b is narrower than the gap between the first low-resistance material layer 405a and the second low-resistance material layer 405b. In particular, because the first barrier layer 475a and the second barrier layer 475b have higher resistance than the first low-resistance material layer 405a and the second low-resistance material layer 405b, the resistance between the source electrode layer, the oxide semiconductor layer 403, and the drain electrode layer can be lowered by decreasing the gap between the first low-resistance material layer 405a and the second low-resistance material layer 405b.

In this embodiment, the insulating layer 406 is formed over the stacked source electrode layer, the stacked drain electrode layer, and the oxide semiconductor layer 403 (see FIG. 17C).

As the insulating layer 406, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

Further, a dense inorganic insulating film may be provided over the insulating layer 406. For example, an aluminum oxide film is formed over the insulating layer 406 by a sputtering method. When the aluminum oxide film has high density (the film density is higher than or equal to 3.2 g/cm$^3$, preferably higher than or equal to 3.6 g/cm$^3$), the transistor 440 can have stable electrical characteristics. The film density can be measured by Rutherford backscattering spectrometry or X-ray reflectometry.

The aluminum oxide film which can be used as the insulating film provided over the transistor 440 has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor layer 403 and release of oxygen, which is a main component material of the oxide semiconductor, from the oxide semiconductor layer 403.

In addition, the planarization insulating film may be formed in order to reduce surface roughness caused by the transistor 440. For the planarization insulating film, an organic material such as a polyimide resin, an acrylic resin, or a benzocyclobutene resin can be used. Other than such organic materials, it is also possible to use a low-dielectric constant material (low-k material) or the like. Note that the planarization insulating film may be formed by stacking a plurality of insulating films formed of any of these materials.

For example, an acrylic resin film having a thickness of 1500 nm may be formed as the planarization insulating film. The acrylic resin film can be formed in such a manner that an acrylic resin is applied by a coating method and then baked (e.g., at 250° C. in a nitrogen atmosphere for 1 hour).

Heat treatment may be performed after the planarization insulating film is formed. For example, the heat treatment is performed at 250° C. in a nitrogen atmosphere for 1 hour.

As described above, heat treatment may be performed after formation of the transistor 440. The heat treatment may be performed more than once.

The channel length L of the transistor 440 described in this embodiment is determined by the narrowest gap between the first barrier layer 475a and the second barrier layer 475b, and the narrowest gap between the first barrier layer 475a and the second barrier layer 475b is determined by etching with a resist mask obtained by exposure to an electron beam. Precise exposure and development using an electron beam can provide a precise pattern; thus, a minute transistor with a channel length L of less than 50 nm can be manufactured.

The gap wider than the narrowest gap between the first barrier layer 475a and the second barrier layer 475b is determined using a photomask. The leakage of the transistor 440 can be reduced because the gap wider than the narrowest gap between the first barrier layer 475a and the second barrier layer 475b is provided.

This embodiment can be implemented in appropriate combination with any of the other embodiments.

Embodiment 9

Figure 18A:
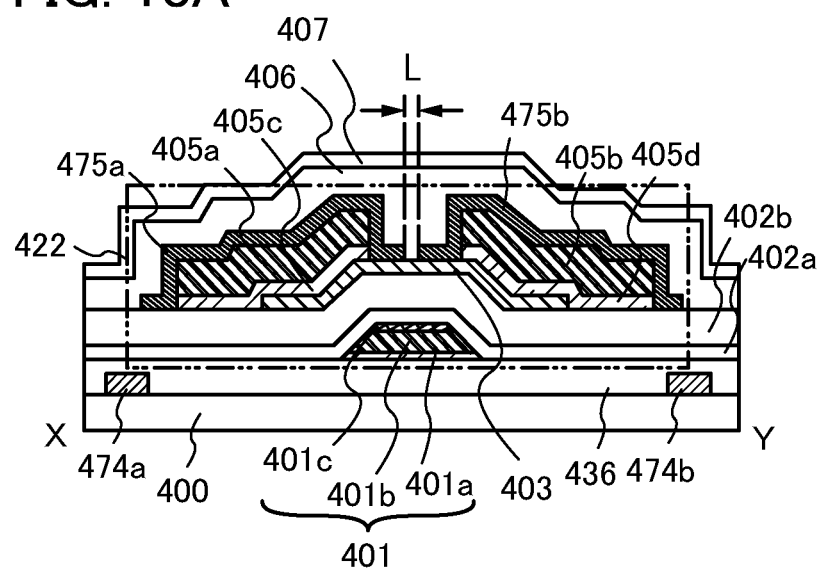
FIGS. 18A and 18B are a cross-sectional view and a top view illustrating one embodiment of the present invention.
Figure 18B:
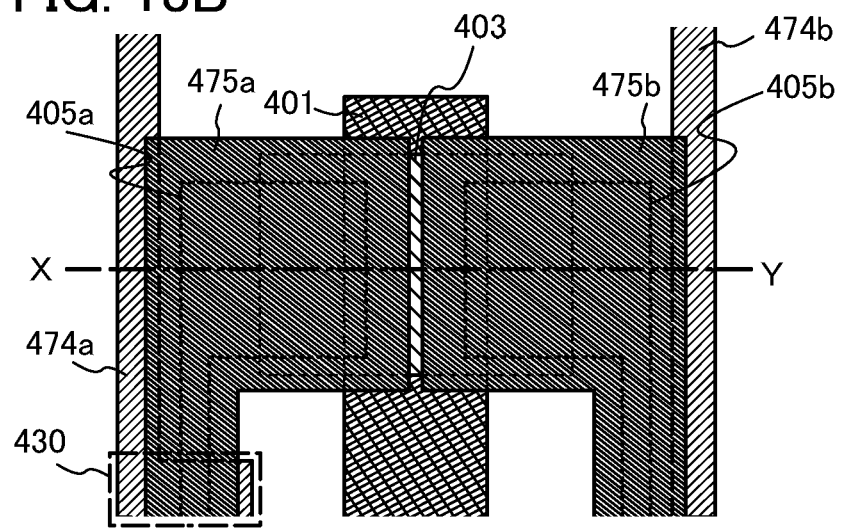

In this embodiment, an example which is partly different from Embodiment 1 will be described. A transistor 422 in which a gate electrode has a stacked structure and a fourth barrier layer 475a and a sixth barrier layer 475b are provided over an oxide semiconductor layer 403 is illustrated in FIGS. 18A and 18B. FIG. 18B is a plan view of the transistor 422, and FIG. 18A is a cross-sectional view taken along X-Y in FIG. 18B.

The transistor 422 illustrated in FIGS. 18A and 18B includes a base insulating layer 436 over a substrate 400, a stacked gate electrode layer 401 over the base insulating layer 436, a stacked gate insulating layer 402 over the gate electrode layer 401, the oxide semiconductor layer 403 over the gate electrode layer 401 with the gate insulating layer 402 provided therebetween, a stacked drain electrode layer and a stacked source electrode layer, and an insulating layer 406 and an insulating layer 407 over the oxide semiconductor layer 403.

The stacked gate electrode layer 401 includes a first barrier layer 401a, a first low-resistance material layer 401b, and a second barrier layer 401c, and the diffusion from the first low-resistance material layer 401b formed of copper or the like is prevented by the first barrier layer 401a and the second barrier layer 401c. The first barrier layer 401a and the second barrier layer 401c are formed using titanium, tungsten, molybdenum, titanium nitride, tantalum nitride, or the like. Note that the gate electrode layer 401 is not limited to this example and may be formed with at least one conductive layer.

The stacked gate insulating layer 402 includes a stack of a first gate insulating layer 402a which prevents the diffusion from the first low-resistance material layer 401b and a second gate insulating layer 402b which contains excess oxygen.

The stacked drain electrode layer includes a third barrier layer 405c, a second low-resistance material layer 405a, and a fourth barrier layer 475a, and the diffusion from the second low-resistance material layer 405a formed of copper or the like is prevented by the third barrier layer 405c and the fourth barrier layer 475a. The third barrier layer 405c and the fourth barrier layer 475a are formed using titanium, tungsten, molybdenum, titanium nitride, tantalum nitride, or the like. Note that the drain electrode layer is not limited to this example and may be formed with at least one conductive layer. The third barrier layer 405c preferably covers part of the side surface of the oxide semiconductor layer 403, which can protect the oxide semiconductor layer 403. In addition, the fourth barrier layer 475a may cover the side surfaces of the third barrier layer 405c and the second low-resistance material layer 405a.

The stacked source electrode layer includes a fifth barrier layer 405d, a third low-resistance material layer 405b, and a sixth barrier layer 475b, and the diffusion from the third low-resistance material layer 405b formed of copper or the like is prevented by the fifth barrier layer 405d and the sixth barrier layer 475b. The fifth barrier layer 405d and the sixth barrier layer 475b are formed using titanium, tungsten, molybdenum, titanium nitride, tantalum nitride, or the like. Note that the source electrode layer is not limited to this example and may be formed with at least one conductive layer. The fifth barrier layer 405d preferably covers part of the side surface of the oxide semiconductor layer 403, which can protect the oxide semiconductor layer 403. In addition, the side surfaces of the fifth barrier layer 405d and the third low-resistance material layer 405b may be covered with the sixth barrier layer 475b.

The channel length L of the transistor 422 is determined by the gap between the fourth barrier layer 475a and the sixth barrier layer 475b, and the gap between the fourth barrier layer 475a and the sixth barrier layer 475b is determined by etching with a resist mask obtained by performing exposure to an electron beam (also referred to as electron beam exposure). Precise exposure and development using an electron beam can provide a precise pattern; thus, the gap between the fourth barrier layer 475a and the sixth barrier layer 475b, i.e., the channel length L, can be less than 50 nm, e.g., 20 nm or 30 nm. At a higher acceleration voltage, an electron beam can provide a more precise pattern. In addition, the use of multiple electron beams can shorten the process time per substrate. Note that the fourth barrier layer 475a and the sixth barrier layer 475b may be formed by etching using a photomask, except in the region which determines the channel length L. Note that the fourth barrier layer 475a and the sixth barrier layer 475b have a thickness of 5 nm to 30 nm, preferably 5 nm to 10 nm. Furthermore, through a plurality of etching steps, the channel formation region in the oxide semiconductor layer 403 may have a first region with a first thickness and a second region with a second thickness which is smaller than the first thickness.

Note that the substrate 400 is provided with a semiconductor element, which is not illustrated here for simplicity. Wiring layers 474a and 474b and the base insulating layer 436 covering the wiring layers 474a and 474b are provided over the substrate 400, part of which can be a memory component.

The insulating layer 406 preferably contains excess oxygen, and a $SiO_x$ or silicon oxynitride film containing much oxygen as a result of film formation under the conditions which are set as appropriate for a PCVD method or a sputtering method is used. In order to make the insulating layer contain much more excess oxygen, oxygen may be added as appropriate by an ion implantation method, an ion doping method, or a plasma treatment.

The insulating layer 407 is a blocking layer (such as an $AlO_x$ layer) for preventing oxygen from being released from the oxide semiconductor layer. The aluminum oxide film ($AlO_x$) has a high shielding effect (blocking effect) of preventing penetration of both oxygen and impurities such as hydrogen and moisture. Therefore, in and after the manufacturing process, the aluminum oxide film functions as a protective film for preventing entry of an impurity such as hydrogen or moisture into the oxide semiconductor film and release of oxygen, which is a main component material of the oxide semiconductor, from the oxide semiconductor film.

Embodiment 10

In this embodiment, another embodiment of a semiconductor device and a method for manufacturing the semiconductor device will be described with reference to FIGS. 19A to 19C, FIGS. 20A1 to 20A3, 20B1 to 20B3, and 20C1 to 20C3, FIGS. 21A1 to 21A3, 21B1 to 21B3, and 21C1 to 21C3, FIGS. 22A1 to 22A3, 22B1 to 22B3, and 22C1 to 22C3, FIGS. 23A1 to 23A3 and 23B1 to 23B3, and FIGS. 24A1 to 24A3 and 24B1 to 24B3. Note that for components denoted by the same reference numerals as those in FIGS. 18A and 18B, the description in Embodiment 9 can be referred to as appropriate.

A transistor of the semiconductor device of this embodiment has a channel length of less than 50 nm as in Embodiment 9. For example, when a resist mask is formed by exposure to an electron beam and a source electrode and a drain electrode are formed using the resist mask as an etching mask, a transistor with a narrow gap between the source electrode and the drain electrode can be manufactured.

Figure 19A:
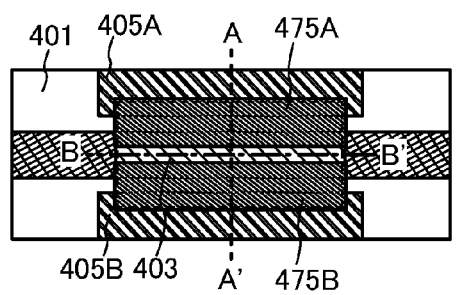
FIGS. 19A to 19C are a top view and cross-sectional views of a semiconductor device of one embodiment of the present invention.
Figure 19B:
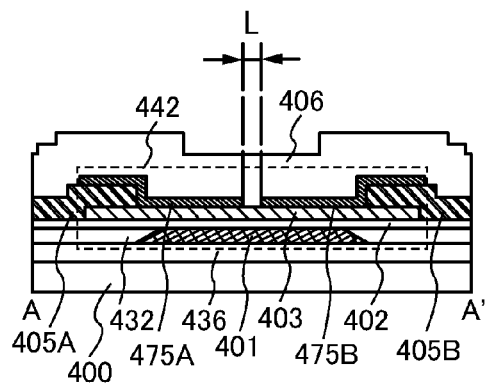
Figure 19C:
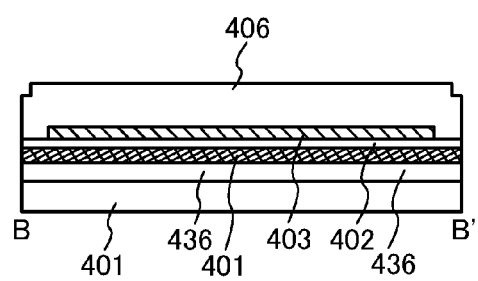

First, an example of a structure of the semiconductor device of this embodiment will be described with reference to FIGS. 19A to 19C. FIG. 19A is a schematic plan view. FIG. 19B is a schematic cross-sectional view taken along line A-A' (in the direction of the channel length L of a transistor 442) in FIG. 19A. FIG. 19C is a schematic cross-sectional view taken along line B-B' (in the direction of the channel width of the transistor 442) in FIG. 19A. Note that the components illustrated in FIGS. 19A to 19C include those having sizes different from the actual sizes.

The transistor 442 illustrated in FIGS. 19A to 19C is a transistor having a bottom-gate structure. The semiconductor device including the transistor 442 illustrated in FIGS. 19A to 19C includes a gate electrode layer 401 provided over a base insulating layer 436 formed over a surface of a substrate 400 so as to be buried in an insulating layer 432, a gate insulating layer 402 over the gate electrode layer 401, an oxide semiconductor layer 403 over the gate insulating layer 402, a conductive layer 405A and a conductive layer 405B over the oxide semiconductor layer 403, a conductive layer 475A over and in contact with the conductive layer 405A, a conductive layer 475B over and in contact with the conductive layer 405B, and an insulating layer 406 over the conductive layers 405A, 405B, 475A, and 475B.

Next, components will be described below.

The gate electrode layer 401 can be formed using a metal material such as molybdenum, titanium, tantalum, tungsten, aluminum, copper, chromium, neodymium, or scandium or an alloy material which contains any of these materials as a main component, for example. Alternatively, a semiconductor layer typified by a polycrystalline silicon layer doped with an impurity element such as phosphorus, or a silicide layer such as a nickel silicide layer may be used as the gate electrode layer 401. The gate electrode layer 401 may have either a single-layer structure or a stacked-layer structure.

The gate electrode layer 401 can also be a layer of a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of a layer of the above conductive material and a layer of the above metal material.

In addition, as in the transistor 422 illustrated in FIGS. 18A and 18B, the gate electrode layer 401 may be a stack of the first barrier layer 401a, the first low-resistance material layer 401b, and the second barrier layer 401c.

The base insulating layer 436 and the gate insulating layer 402 can be formed using a silicon oxide layer, a gallium oxide layer, an aluminum oxide layer, a silicon nitride layer, a silicon oxynitride layer, an aluminum oxynitride layer, or a silicon nitride oxide layer.

When the base insulating layer 436 and the gate insulating layer 402 are each a layer of a high-k material such as hafnium oxide, yttrium oxide, hafnium silicate (HfSi$_x$O$_y$ (x>0, y>0)), hafnium silicate to which nitrogen is added, hafnium aluminate (HfAl$_x$O$_y$ (x>0, y>0)), or lanthanum oxide, gate leakage current can be reduced. Furthermore, the gate insulating layer 402 may have either a single-layer structure or a stacked-layer structure.

Note that the base insulating layer 436 and the gate electrode layer 401 are preferably subjected to planarization treatment.

An oxide semiconductor used for the oxide semiconductor layer 403 is a wide-gap semiconductor which has a wider band gap than silicon.

The thickness of the oxide semiconductor layer 403 is, for example, 1 nm to 30 nm (preferably 5 nm to 10 nm).

The width of the oxide semiconductor layer 403 in the channel length L direction is larger than the width of the gate electrode layer 401 in the channel length L direction. This enables the oxide semiconductor layer 403 to be supplied with oxygen more easily from an insulating layer below the oxide semiconductor layer 403, for example.

Furthermore, the channel formation region of the oxide semiconductor layer 403 may have a first region with a first thickness and a second region with a second thickness which is smaller than the first thickness.

The conductive layer 405A and the conductive layer 475A are the drain electrode layer of the transistor 442, and the conductive layer 405B and the conductive layer 475B are the source electrode layer of the transistor 442.

As the conductive layer 405A and the conductive layer 405B, it is possible to use, for example, a metal layer containing an element selected from Al, Cr, Cu, Ta, Ti, Mo, and W, a metal nitride layer containing any of these elements as its component (a titanium nitride layer, a molybdenum nitride layer, or a tungsten nitride layer), or the like. Alternatively, a layer of a high-melting-point metal such as Ti, Mo, or W or a metal nitride layer thereof (e.g., a titanium nitride layer, a molybdenum nitride layer, or a tungsten nitride layer) may be formed over and/or under a metal layer of Al, Cu, or the like. Further alternatively, the conductive layers used as the source electrode layer and the drain electrode layer may be formed using a conductive metal oxide. As the conductive metal oxide, indium oxide (In$_2$O$_3$), tin oxide (SnO$_2$), zinc oxide (ZnO), indium oxide-tin oxide (In$_2$O$_3$—SnO$_2$, abbreviated to ITO), indium oxide-zinc oxide (In$_2$O$_3$—ZnO), or any of these metal oxide materials containing silicon oxide can be used.

As the conductive layer 475A and the conductive layer 475B, it is possible to use, for example, a metal layer containing an element selected from Al, Cr, Cu, Ta, Ti, Mo, and W, a metal nitride layer containing any of these elements as its component (a titanium nitride layer, a molybdenum nitride layer, or a tungsten nitride layer), or the like. Alternatively, a layer of a high-melting-point metal such as Ti, Mo, or W or a metal nitride layer thereof (e.g., a titanium nitride layer, a molybdenum nitride layer, or a tungsten nitride layer) may be formed over and/or under a metal layer of Al, Cu, or the like. Further alternatively, the conductive layers used as the source electrode layer and the drain electrode layer may be formed using a conductive metal oxide. As the conductive metal oxide, indium oxide (In$_2$O$_3$), tin oxide (SnO$_2$), zinc oxide (ZnO), indium oxide-tin oxide (In$_2$O$_3$—SnO$_2$, abbreviated to ITO), indium oxide-zinc oxide (In$_2$O$_3$—ZnO), or any of these metal oxide materials containing silicon oxide can be used.

As in the transistor 422 illustrated in FIGS. 18A and 18B, the conductive layer 405A may be a stack of the third barrier layer 405c and the second low-resistance material layer 405a, and the conductive layer 475A may be the fourth barrier layer 475a. In addition, as in the transistor 422 illustrated in FIGS. 18A and 18B, the conductive layer 405B may be a stack of the fifth barrier layer 405d and the third low-resistance material layer 405b, and the conductive layer 475B may be the sixth barrier layer 475b.

Note that the conductive layer 475A and the conductive layer 475B are thinner than the conductive layer 405A and the conductive layer 405B; however, the present invention is not limited to this example. The conductive layer 475A and the conductive layer 475B are formed using the resist mask which is formed by the electron beam exposure, and are therefore preferably thin in terms of the manufacturing process. In addition, when the conductive layer 405A and the conductive layer 405B are formed thick, the resistance of the source electrode and the drain electrode can be lowered.

The gap between the conductive layer 475A and the conductive layer 475B is narrower than the gap between the conductive layer 405A and the conductive layer 405B. Particularly when the conductive layer 475A and the conductive layer 475B have higher resistance than the conductive layer 405A and the conductive layer 405B, the resistance between the source electrode, the oxide semiconductor layer 403, and the drain electrode can be lowered by decreasing the gap between the conductive layer 475A and the conductive layer 475B.

Furthermore, as in the transistor 422 illustrated in FIGS. 18A and 18B, the conductive layer 475A may cover upper and side surfaces of the conductive layer 405A, and the conductive layer 475B may cover upper and side surfaces of the conductive layer 405B. Accordingly, the conductive layers 475A and 475B, for example, can protect the conductive layers 405A and 405B.

In that case, the channel length L of the transistor is equal to the gap between the conductive layer 475A and the conductive layer 475B. The channel length L is short, for example, less than 50 nm. For example, when the gap between the conductive layer 475A and the conductive layer 475B is made narrow by using a resist mask formed by exposure to an electron beam as an etching mask, the channel length L can be short.

As the insulating layer 406, a single layer or a stack of one or more inorganic insulating layers, typical examples of which are a silicon oxide layer, a silicon oxynitride layer, an aluminum oxide layer, an aluminum oxynitride layer, a hafnium oxide layer, a gallium oxide layer, a silicon nitride layer, an aluminum nitride layer, a silicon nitride oxide layer, and an aluminum nitride oxide layer, can be used, for example.

Further, a dense inorganic insulating layer may be provided over the insulating layer 406. For example, as in the semiconductor device illustrated in FIGS. 1A and 1B, an aluminum oxide layer serving as the insulating layer 407 is formed over the insulating layer 406 by a sputtering method. When the aluminum oxide layer has high density (the layer density is higher than or equal to 3.2 g/cm$^3$, preferably higher than or equal to 3.6 g/cm$^3$), the transistor 442 can have stable electrical characteristics.

The aluminum oxide layer which can be used as the insulating layer provided over the transistor 442 has a high shielding effect (blocking effect) of preventing penetration of both oxygen and impurities such as hydrogen and moisture.

Therefore, in and after the manufacturing process, the aluminum oxide layer functions as a protective layer for preventing entry of an impurity such as hydrogen or moisture, which causes a change in characteristics, into the oxide semiconductor layer 403 and release of oxygen, which is a main component material of the oxide semiconductor, from the oxide semiconductor layer 403.

In addition, a planarization insulating layer may be formed as one layer of the insulating layer 406 in order to reduce surface roughness caused by the transistor 442. For the planarization insulating layer, an organic material such as a polyimide resin, an acrylic resin, or a benzocyclobutene resin can be used. Other than such organic materials, it is also possible to use a layer of a low-dielectric constant material (low-k material) or the like. Note that the planarization insulating layer may be formed by stacking a plurality of insulating layers formed of any of these materials.

Next, as an example of a method for manufacturing the semiconductor device of this embodiment, a method for manufacturing the semiconductor device illustrated in FIGS. 19A to 19C will be described with reference to FIGS. 20A1 to 20A3, 20B1 to 20B3, and 20C1 to 20C3, FIGS. 21A1 to 21A3, 21B1 to 21B3, and 21C1 to 21C3, FIGS. 22A1 to 22A3, 22B1 to 22B3, and 22C1 to 22C3, FIGS. 23A1 to 23A3 and 23B1 to 23B3, and FIGS. 24A1 to 24A3 and 24B1 to 24B3, which illustrate a method for manufacturing the semiconductor device illustrated in FIGS. 19A to 19C, which are schematic cross-sectional views taken along line A-A', schematic cross-sectional views taken along line B-B', and schematic plan views corresponding to FIGS. 19A to 19C, and which include components having sizes different from the actual sizes.

First, the substrate 400 is prepared, the base insulating layer 436 is formed over the substrate 400, and the gate electrode layer 401 is formed over the base insulating layer 436 (see FIGS. 20A1 to 20A3).

For example, a conductive film is formed by a sputtering method using a material which can be used for the gate electrode layer 401, and part of the conductive film is selectively etched; thus, the gate electrode layer 401 is formed. Note that dry etching or wet etching, or both, may be usable for the etching. At that time, impurities on the surface of the gate electrode layer 401 may be removed by exposure of the gate electrode layer 401 to oxalic acid, dilute hydrofluoric acid, or the like or by plasma treatment (such as $N_2O$ plasma treatment).

After the formation of the gate electrode layer 401, the substrate 400 and the gate electrode layer 401 may be subjected to heat treatment.

Next, the insulating layer 432 is formed over the base insulating layer 436 and the gate electrode layer 401, and planarization treatment is performed; thus, the gate electrode layer 401 is exposed and the base insulating layer 436 and the gate electrode layer 401 are planarized (see FIGS. 20B1 to 20B3).

For example, for the base insulating layer 436, a film of a material which can be used for the base insulating layer 436 can be formed by a PCVD method. The base insulating layer 436 may be formed by a sputtering method.

As an example of the planarization treatment, CMP treatment or the like can be given.

Next, the gate insulating layer 402 is formed over the gate electrode layer 401, and the oxide semiconductor layer 403 is formed over the gate insulating layer 402.

For example, for the gate insulating layer 402, a film of a material which can be used for the gate insulating layer 402 can be formed by a PCVD method.

Note that before the oxide semiconductor layer 403 is formed, heat treatment may be performed for dehydration or dehydrogenation of the gate insulating layer 402. For example, heat treatment at 350° C. to 450° C. may be performed.

In addition, the gate insulating layer 402 which has been dehydrated or dehydrogenated may be subjected to oxygen doping treatment for supplying oxygen to the gate insulating layer 402 so that excess oxygen is contained in the gate insulating layer 402, or in the gate insulating layer 402 and in the vicinity of the interface. By the supply of oxygen to the gate insulating layer 402 after dehydration or dehydrogenation, the release of oxygen can be reduced and the concentration of oxygen in the gate insulating layer 402 can be increased.

Moreover, for the oxide semiconductor layer 403, an oxide semiconductor film can be formed under such conditions that much oxygen is contained during the film formation (e.g., formed by a sputtering method in a 100% oxygen atmosphere). It is preferable that the oxide semiconductor film contain much oxygen (preferably have a region containing oxygen in excess of the stoichiometric composition in the oxide semiconductor in a crystalline state).

It is preferable that a high-purity gas in which an impurity such as hydrogen, water, a hydroxyl group, or hydride is reduced be used as the sputtering gas for the formation of the oxide semiconductor film.

The substrate 400 is held in a deposition chamber kept under reduced pressure. Then, a sputtering gas in which hydrogen and moisture are reduced is introduced into the deposition chamber from which remaining moisture is removed, and the oxide semiconductor film is formed over the substrate 400 using the above target. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. From the deposition chamber evacuated with a cryopump, hydrogen (a hydrogen atom), a compound including hydrogen (a hydrogen atom) such as water ($H_2O$) (preferably, also a compound including a carbon atom), or the like, for example, is removed; thus, the concentration of impurities in the oxide semiconductor film formed in the deposition chamber can be reduced.

The gate insulating layer 402 and the oxide semiconductor film may be formed successively without exposing the gate insulating layer 402 to the air. When the gate insulating layer 402 and the oxide semiconductor film are successively formed without exposing the gate insulating layer 402 to the air, impurities such as hydrogen and moisture can be prevented from being adsorbed to the surface of the gate insulating layer 402.

In the case where the gate insulating layer 402 in contact with the oxide semiconductor layer 403 contains much oxygen, oxygen can be supplied from the gate insulating layer 402 to the oxide semiconductor layer 403.

Furthermore, heat treatment may be performed in a state where the oxide semiconductor layer 403 and the gate insulating layer 402 are in contact with each other. By the heat treatment, oxygen can be effectively supplied from the gate insulating layer 402 to the oxide semiconductor layer 403.

Note that the heat treatment for supplying oxygen from the gate insulating layer 402 to the oxide semiconductor layer 403 is preferably performed before the oxide semiconductor film is processed into an island shape, in which case oxygen contained in the gate insulating layer 402 can be prevented from being released by the heat treatment.

For example, the heat treatment is performed at a temperature higher than or equal to 350° C. and lower than the strain point of the substrate, preferably higher than or equal to 350° C. and lower than or equal to 450° C. Heat treatment may be further performed in a later step. A heat treatment apparatus for the above heat treatment can be an electric furnace or an apparatus for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used.

Further, after the heat treatment is performed and while the heating temperature is being maintained or being decreased, a high-purity oxygen gas, a high-purity $N_2O$ gas, or ultra-dry air (having a dew point of −40° C. or lower, preferably −60° C. or lower) may be introduced into the furnace where the heat treatment has been performed. It is preferable that water, hydrogen, and the like be not contained in the oxygen gas or the $N_2O$ gas. The purity of the oxygen gas or the $N_2O$ gas that is introduced into the heat treatment apparatus is preferably greater than or equal to 6N, more preferably greater than or equal to 7N; that is, the concentration of impurities in the oxygen gas or the $N_2O$ gas is preferably less than or equal to 1 ppm, more preferably less than or equal to 0.1 ppm. By the action of the oxygen gas or the $N_2O$ gas, oxygen is supplied to the oxide semiconductor layer, and defects due to oxygen vacancies in the oxide semiconductor layer can be reduced. Note that the high-purity oxygen gas, high-purity $N_2O$ gas, or ultra-dry air may be introduced during the heat treatment.

In addition, oxygen doping is performed; thus, the oxide semiconductor layer 403 is doped with oxygen 451 (see FIGS. 20C1 to 20C3).

For example, the doping with the oxygen 451 (an oxygen radical, an oxygen atom, an oxygen molecule, ozone, an oxygen ion (an oxygen molecular ion), and/or an oxygen cluster ion) can be performed by an ion implantation method, an ion doping method, a plasma immersion ion implantation method, plasma treatment, or the like. For the ion implantation method, a gas cluster ion beam may be used.

By the supply of oxygen to the oxide semiconductor layer 403, oxygen vacancies in the oxide semiconductor layer 403 can be filled.

Next, the oxide semiconductor layer 403 is processed into an oxide semiconductor layer 403 having an island shape by a photolithography process (see FIGS. 21A1 to 21A3).

A resist mask for forming the oxide semiconductor layer 403 having an island shaped may be formed by an inkjet method. Formation of the resist mask by an inkjet method needs no photomask; thus, manufacturing cost can be reduced.

Note that dry etching or wet etching, or both, may be usable for forming the oxide semiconductor layer 403. As an etchant used for wet etching of the oxide semiconductor layer 403, for example, a mixed solution of phosphoric acid, acetic acid, and nitric acid, or the like can be used. In addition, ITO-07N (produced by KANTO CHEMICAL CO., INC.) may be used. It is also possible to employ dry etching using an ICP etching method.

Next, a conductive film 452 is formed over the gate electrode layer 401, the gate insulating layer 402, and the oxide semiconductor layer 403 (see FIGS. 21B1 to 21B3).

For example, as the conductive film 452, a film of a material which can be used for the conductive layer 405A and the conductive layer 405B is formed by a sputtering method or the like.

Next, a resist mask 453 is formed over part of the conductive film 452 by a photolithography method (see FIGS. 21C1 to 21C3).

Then, the conductive film 452 is selectively etched using the resist mask 453 as a mask; thus, the conductive layer 405A and the conductive layer 405B are formed (see FIGS. 22A1 to 22A3). The gap between the conductive layer 405A and the conductive layer 405B is determined by a photomask used to form the resist mask 453. Note that the oxide semiconductor layer 403 is preferably not etched at that time; however, part of the oxide semiconductor layer 403 may be etched and a first region with a first thickness may be formed. In the case where impurities are attached to the surface of the oxide semiconductor layer 403 at that time, the impurities on the surface of the oxide semiconductor layer 403 are preferably removed by exposure to oxalic acid, dilute hydrofluoric acid, or the like or by plasma treatment (such as $N_2O$ plasma treatment).

Next, a conductive film 454 is formed so as to cover the conductive layer 405A and the conductive layer 405B (see FIGS. 22B1 to 22B3).

For example, as the conductive film 454, a film of a material which can be used for the conductive layer 475A and the conductive layer 475B is formed by a sputtering method or the like.

Next, a resist is formed over the conductive film 454 and subjected to exposure to an electron beam; thus, a resist mask 455 is formed (see FIGS. 22C1 to 22C3). As is obvious from FIGS. 22C1 to 22C3, the resist mask 455 has a slit (or a slit-like groove). Alternatively, the resist mask 455 may have a ring-like groove as shown in Embodiment 3.

As a resist material, a siloxane-based resist, a polystyrene-based resist, or the like can be used, for example. Note that it is preferable to use a positive resist rather than a negative resist because a pattern with a small width is to be formed. The thickness of the resist material is preferably set such that the ratio of the thickness of the resist material to the width of the manufactured pattern becomes 1:1 to 1:2. For example, in the case where the width of the pattern is 30 nm, the thickness of the resist can be 30 nm.

For the exposure to an electron beam, the resist mask 455 is preferably thinner than the resist mask 453. In order to form the resist mask 455 thin, it is preferable that a surface on which the resist mask is formed be as flat as possible. In the method for manufacturing the semiconductor device of this embodiment, the unevenness due to the gate electrode layer 401 and the insulating layer 432 can be reduced by planarization treatment of the gate electrode layer 401 and the base insulating layer 436; thus, the resist mask can be thin. This enables the exposure to an electron beam to be performed precisely.

Here, in an electron beam writing apparatus capable of electron beam irradiation, the acceleration voltage is preferably in the range from 5 kV to 50 kV, for example. The current intensity is preferably in the range from $5 \times 10^{-12}$ A to $1 \times 10^{-11}$ A. The minimum beam size is preferably 2 nm or less. The minimum possible pattern line width is preferably 8 nm or less.

Under the above conditions, a pattern with a width of 30 nm or less, preferably 20 nm or less, more preferably 8 nm or less, can be obtained, for example.

Then, the conductive film 454 is selectively etched using the resist mask 455 as a mask; thus, an opening is formed in a region where a channel is formed (see FIGS. 23A1 to 23A3). Note that the oxide semiconductor layer 403 is preferably not etched at that time; however, part of the oxide semiconductor layer 403 may be etched and a second region with a second thickness which is smaller than the first thickness may be formed. In the case where impurities are attached to the surface of the oxide semiconductor layer 403 at that time, the impurities on the surface of the oxide semiconductor layer 403 are preferably removed by exposure to oxalic acid, dilute hydrofluoric acid, or the like or by plasma treatment (such as $N_2O$ plasma treatment).

It is preferable to employ etching conditions where the etching selectivity of the conductive film 454 to the thin resist mask 455 is high. For example, it is preferable to employ dry etching using a mixed gas of $Cl_2$ and HBr as an etching gas with the flow rate of HBr higher than the flow rate of $Cl_2$. For example, it is preferable that the flow rate ratio be $Cl_2$: HBr=20:80. In the case of etching with inductively coupled plasma (also referred to as ICP etching) with an ICP power of 500 W, the etching selectivity of the conductive film 454 to the resist mask 455 can be high when the bias power is set to 30 W to 40 W.

Next, a resist mask 456 is formed over the conductive film 454 by a photolithography method (see FIGS. 23B1 to 23B3). At that time, the oxide semiconductor layer 403 is preferably covered with the resist mask 456 and not exposed. In the channel width direction, the resist mask 456 may be formed over the conductive film 454.

Next, the conductive film 454 is selectively etched using the resist mask 456 as a mask; thus, the conductive layer 475A and the conductive layer 475B are formed (see FIGS. 24A1 to 24A3). The gap between the conductive layer 475A and the conductive layer 475B is determined by the exposure to an electron beam used to form the resist mask 455.

For example, the conductive film 454 can be etched by dry etching.

Next, the insulating layer 406 is formed over the oxide semiconductor layer 403, the conductive layers 405A and 405B, and the conductive layers 475A and 475B (see FIGS. 24B1 to 24B3).

For example, for the insulating layer 406, a film of a material which can be used for the insulating layer 406 can be formed by a PCVD method. Note that the insulating layer 406 may be formed by a sputtering method.

Note that the insulating layer 406 may be subjected to oxygen doping treatment. For example, treatment similar to the above oxygen doping of the gate insulating layer 402 or the oxide semiconductor layer 403 can be performed.

Furthermore, heat treatment may be performed after the insulating layer 406 is formed. For example, the heat treatment is performed at 250° C. in a nitrogen atmosphere for 1 hour.

Through the above steps, the transistor 442 can be manufactured. The channel length L of the transistor 442 manufactured at that time is shorter than 50 nm.

With the use of the oxide semiconductor layer which is dehydrated or dehydrogenated, supplied with oxygen, and highly purified for the transistor 442, the carrier density of the oxide semiconductor layer can be lower than $1\times10^{14}/cm^3$, preferably lower than $1\times10^{12}/cm^3$, further preferably lower than $1\times10^{11}/cm^3$. The off-state current per micrometer of channel width of a transistor with a channel length of 50 nm is preferably less than or equal to 10 aA ($1\times10^{-17}$ A), more preferably less than or equal to 1 aA ($1\times10^{-18}$ A), further preferably less than or equal to 10 zA ($1\times10^{-20}$ A), still further preferably less than or equal to 1 zA ($1\times10^{-21}$ A), yet still further preferably less than or equal to 100 yA ($1\times10^{-22}$ A). It is preferable that the off-state current of the transistor be as small as possible, but the lower limit of the off-state current of the transistor is estimated at about $10^{-30}$ A/μm.

After the transistor 442 is manufactured, heat treatment may be performed. The heat treatment may be performed more than once.

The above is the method for manufacturing the semiconductor device of this embodiment.

As described with reference to FIGS. 19A to 19C, FIGS. 20A1 to 20C3, FIGS. 21A1 to 21C3, FIGS. 22A1 to 22C3, FIGS. 23A1 to 23B3, and FIGS. 24A1 to 24B3, in the example of the semiconductor device of this embodiment, a stack of a plurality of conductive layers functions as a source electrode or a drain electrode, and the upper conductive layer is selectively etched using a resist mask which is formed by exposure to an electron beam. Thus, the gap between the resulting conductive layers can be narrow, and the width thereof in the channel length direction can be short.

The configuration, method, and the like described in this embodiment can be combined as appropriate with any of the configurations, methods, and the like described in the other embodiments.

Embodiment 11

Figure 25A:
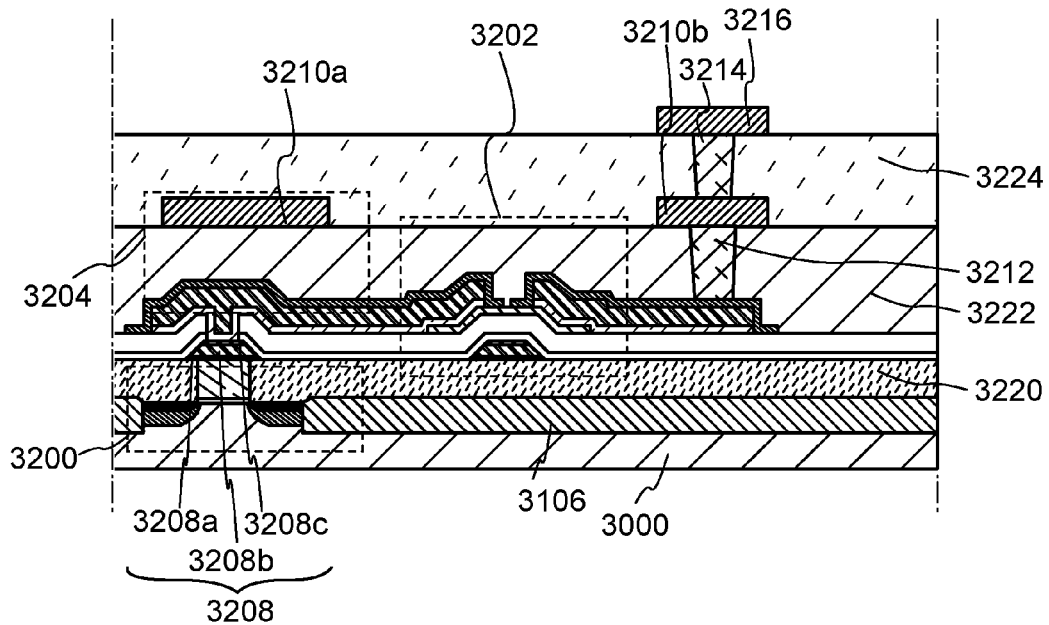
FIGS. 25A and 25B are a cross-sectional view and a circuit diagram illustrating one embodiment of a semiconductor device.
Figure 25B:
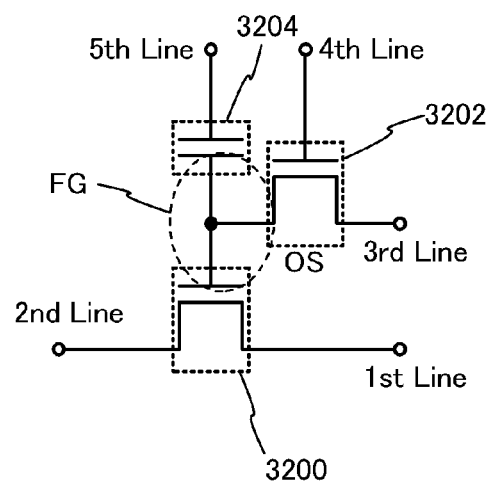

In this embodiment, an example of a semiconductor device (memory device) which includes the transistor described in Embodiment 9 or 10, which can hold stored data even when not powered, and which has an unlimited number of write cycles will be described with reference to drawings. FIG. 25A is a cross-sectional view of the semiconductor device, and FIG. 25B is a circuit diagram of the semiconductor device.

Note that the semiconductor device is the same as that in Embodiment 4 except that the transistor has a different structure; thus, detailed description is omitted here. The semiconductor device illustrated in FIGS. 25A and 25B includes a transistor 3200 including a first semiconductor material in a lower portion, and a transistor 3202 including a second semiconductor material in an upper portion. One of the source and drain electrode layers of the transistor 3202 is electrically connected to an electrode 3208 through an opening provided n the gate insulating layer, and the electrode 3208 is electrically connected to the gate electrode layer of the transistor 3200. The electrode 3208 includes a conductive layer 3208a, a conductive layer 3208b, and a conductive layer 3208c, each of which can be formed in the same process as the gate electrode layer of the transistor 3202. The structure of the transistor 422 described in Embodiment 9 is applied to the transistor 3202.

When including a transistor having a channel formation region formed using an oxide semiconductor and having extremely small off-state current, the semiconductor device described in this embodiment can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, since data are written by turning on or off the transistors, high-speed operation can be easily achieved.

As described above, a miniaturized and highly integrated semiconductor device having favorable electrical characteristics and a method for manufacturing the semiconductor device can be provided.

The configuration, method, and the like described above in this embodiment can be combined as appropriate with any of the configurations, methods, and the like described in the other embodiments.

Embodiment 12

In this embodiment, one embodiment of a structure of a memory device which is different from that in Embodiment 11 will be described. FIG. 9 is a perspective view of the memory device, which is described in Embodiment 5 and therefore not described in detail here. The memory device illustrated in FIG. 9 includes a plurality of layers of memory cell arrays each including a plurality of memory cells as memory circuits in the upper portion, and a logic circuit 3004 in the lower portion which is necessary for operating the memory cell arrays.

Figure 26:
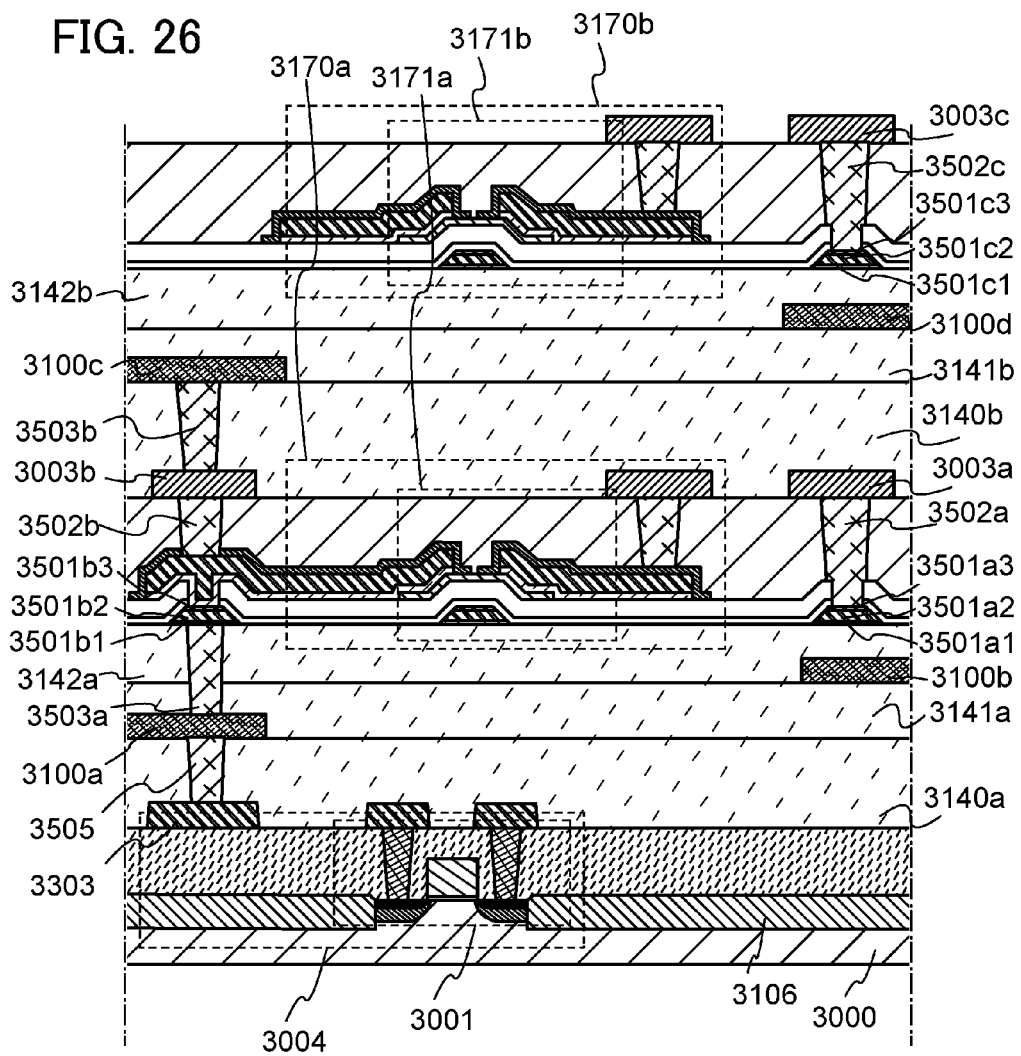
FIG. 26 is a cross-sectional view illustrating one embodiment of a semiconductor device.

FIG. 26 is a partial enlarged view of the memory device illustrated in FIG. 9. FIG. 26 illustrates the logic circuit 3004, the memory cell array 3400a, and the memory cell array 3400b, and illustrates a memory cell 3170a and a memory cell 3170b as typical examples among the plurality of memory cells included in the memory cell array 3400a and the memory cell array 3400b. The memory cell 3170a and the memory cell 3170b can have a configuration similar to the circuit configuration described in the above embodiment, for example.

Note that a transistor 3171a included in the memory cell 3170a is illustrated as a typical example. An electrode comprising a conductive layer 3501a1, a conductive layer 3501a2, and a conductive layer 3501a3, which is formed using the same layer as the gate electrode layer of the transistor 3171a, is electrically connected to an electrode 3003a via an electrode 3502a. A wiring 3100a can be electrically connected to an electrode comprising a conductive layer 3501b1, a conductive layer 3501b2, and a conductive layer 3501b3, which is formed using the same layer as the gate electrode layer of the transistor 3171a, via an electrode 3503a. Therefore, the wiring 3100a and the electrode 3303 can be electrically connected to the source electrode layer or the drain electrode layer of the transistor 3171a. In addition, the electrode comprising the conductive layer 3501b1, the conductive layer 3501b2, and the conductive layer 3501b3 can be electrically connected to electrode 3003b via the source electrode layer or the drain electrode layer of the transistor 3171a, and via an electrode 3502b. A transistor 3171b included in the memory cell 3170b is illustrated as a typical example. An electrode comprising a conductive layer 3501c1, a conductive layer 3501c2, and a conductive layer 3501c3, which is formed using the same layer as the gate electrode layer of the transistor 3171b, is electrically connected to an electrode 3003c via an electrode 3502c. Each of the transistors 3171a and 3171b includes a channel formation region in an oxide semiconductor layer. The structure of the transistor in which the channel formation region is formed in the oxide semiconductor layer is the same as the structure described in Embodiment 9 or 10, and thus the description of the structure is omitted.

FIG. 26 illustrates the structure where two wiring layers, i.e., a wiring layer in which the wiring 3100a is formed and a wiring layer in which a wiring 3100b is formed are provided between layers in which the transistor 3171a is formed and layers in which a transistor 3001 is formed; however, the number of wiring layers provided therebetween is not limited to two. One wiring layer or three or more wiring layers may be provided between the layers in which the transistor 3171a is formed and the layers in which the transistor 3001 is formed.

FIG. 26 illustrates the structure where two wiring layers, i.e., a wiring layer in which a wiring 3100c is formed and a wiring layer in which a wiring 3100d is formed are provided between layers in which the transistor 3171b is formed and the layers in which the transistor 3171a is formed; however, the number of wiring layers provided therebetween is not limited to two. One wiring layer or three or more wiring layers may be provided between the layers in which the transistor 3171b is formed and the layers in which the transistor 3171a is formed.

The configuration, method, and the like described above in this embodiment can be combined as appropriate with any of the configurations, methods, and the like described in the other embodiments.

EXPLANATION OF REFERENCE

400: substrate, 401: gate electrode layer, 402: gate insulating layer, 403: oxide semiconductor layer, 404: conductive film, 405: conductive film, 405A: conductive layer, 405B: conductive layer, 405a: low-resistance material layer, 405b: low-resistance material layer, 405c: barrier layer, 405d: barrier layer, 406: insulating layer, 407: insulating layer, 420: transistor, 422: transistor, 430: capacitor, 431: transistor, 432: insulating layer, 436: base insulating layer, 440: transistor, 441: oxide semiconductor film, 442: transistor, 451: oxygen, 452: conductive film, 453: resist mask, 455: resist mask, 456: resist mask, 457: resist mask, 460: transistor, 474a: wiring layer, 474b: wiring layer, 475: conductive film, 475A: conductive layer, 475B: conductive layer, 475a: barrier layer, 475b: barrier layer, 503: oxide semiconductor layer, 505a: low-resistance material layer, 505b: low-resistance material layer, 575a: barrier layer, 575b: barrier layer, 585a: wiring layer, 585b: wiring layer, 3000: substrate, 3001: transistor, 3003a: electrode, 3003b: electrode, 3003c: electrode, 3004: logic circuit, 3100a: wiring, 3100b: wiring, 3100c: wiring, 3100d: wiring, 3106: element isolation insulating layer, 3140a: insulating film, 3140b: insulating film, 3141a: insulating film, 3141b: insulating film, 3142a: insulating film, 3142b: insulating film, 3170a: memory cell, 3170b: memory cell, 3171a: transistor, 3171b: transistor, 3200: transistor, 3202: transistor, 3204: capacitor, 3208: electrode, 3210a: conductive layer, 3210b: conductive layer, 3212: electrode, 3216: wiring, 3220: insulating layer, 3222: insulating layer, 3224: insulating layer, 3303: electrode, 3400a: memory cell array, 3400b: memory cell array, 3400n: memory cell array, 3501a: electrode, 3501b: electrode, 3501c: electrode, 3502a: electrode, 3502b: electrode, 3502c: electrode, 3503a: electrode, 3503b: electrode, 3505: electrode, 9033: clasp, 9034: display mode switch, 9035: power switch, 9036: power saver switch, 9038: operation switch, 9630: housing, 9631: display portion, 9631a: display portion, 9631b: display portion, 9632a: region, 9632b: region, 9633: solar cell, 9634: charge and discharge control circuit, 9635: battery, 9636: DCDC converter, 9637: converter, 9638: operation key, and 9639: button.

This application is based on Japanese Patent Application serial no. 2011-264973 filed with Japan Patent Office on Dec. 2, 2011, Japanese Patent Application serial no. 2011-265036 filed with Japan Patent Office on Dec. 2, 2011, Japanese Patent Application serial no. 2011-265158 filed with Japan Patent Office on Dec. 2, 2011, and Japanese Patent Application serial no. 2011-283789 filed with Japan Patent Office on Dec. 26, 2011, the entire contents of which are hereby incorporated by reference.

The invention claimed is:

1. A method for manufacturing a semiconductor device, comprising steps of:
   forming a gate insulating layer over a gate electrode layer;
   forming an oxide semiconductor layer over the gate insulating layer;
   forming a first conductive film over and in contact with the oxide semiconductor layer;
   performing a light exposure using a photomask after forming the first conductive film;
   forming first masks over the first conductive film after performing the light exposure;
   forming a first conductive layer and a second conductive layer over the oxide semiconductor layer by selectively etching the first conductive film using the first masks;
   forming a second conductive film over the first conductive layer and the second conductive layer after removing the first masks;
   performing an electron beam exposure after forming the second conductive film;
   forming a second mask over the second conductive film after performing the electron beam exposure; and
   forming a third conductive layer over and in contact with the first conductive layer and a fourth conductive layer over and in contact with the second conductive layer by selectively etching the second conductive film using the second mask.

2. The method for manufacturing a semiconductor device according to claim 1, wherein a width of the oxide semiconductor layer in a channel length direction is larger than a width of the gate electrode layer in the channel length direction.

3. The method for manufacturing a semiconductor device according to claim 1,
   wherein a gap between the third conductive layer and the fourth conductive layer is determined by the electron beam exposure, and
   wherein a gap between the first conductive layer and the second conductive layer is determined by the photomask.

4. The method for manufacturing a semiconductor device according to claim 1, wherein a channel length of the semiconductor device is equal to a gap between the third conductive layer and the fourth conductive layer.

5. The method for manufacturing a semiconductor device according to claim 1, wherein the second mask has one of a slit-like groove and a ring-like groove.

6. The method for manufacturing a semiconductor device according to claim 1, wherein the first masks and the second mask are resist masks.

7. A method for manufacturing a semiconductor device, comprising steps of:
   forming a gate insulating layer over a gate electrode layer;
   forming an oxide semiconductor layer over the gate insulating layer;
   forming a first conductive film over and in contact with the oxide semiconductor layer;
   performing an electron beam exposure after forming the first conductive film;
   forming a first mask over the first conductive film after performing the electron beam exposure;
   forming a first conductive layer and a second conductive layer over the oxide semiconductor layer by selectively etching the first conductive film using the first mask;
   forming a second conductive film over the first conductive layer and the second conductive layer after removing the first mask;
   performing a light exposure using a photomask after forming the second conductive film;
   forming second masks over the second conductive film after performing the light exposure; and
   forming a third conductive layer over and in contact with the first conductive layer and a fourth conductive layer over and in contact with the second conductive layer by selectively etching the second conductive film using the second masks.

8. The method for manufacturing a semiconductor device according to claim 7, wherein a width of the oxide semiconductor layer in a channel length direction is larger than a width of the gate electrode layer in the channel length direction.

9. The method for manufacturing a semiconductor device according to claim 7,
   wherein a gap between the first conductive layer and the second conductive layer is determined by the electron beam exposure, and
   wherein a gap between the third conductive layer and the fourth conductive layer is determined by the photomask.

10. The method for manufacturing a semiconductor device according to claim 7, wherein an area of groove in the first mask is 5% of a total area of the first mask or less.

11. The method for manufacturing a semiconductor device according to claim 7, wherein the first mask has one of a slit-like groove and a ring-like groove.

12. The method for manufacturing a semiconductor device according to claim 7, wherein the first mask and the second masks are resist masks.

13. A method for manufacturing a semiconductor device, comprising steps of:
    forming a first conductive film;
    performing an electron beam exposure after forming the first conductive film;
    forming a first mask over the first conductive film after performing the electron beam exposure;
    forming a plurality of holes in the first conductive film by selectively etching the first conductive film using the first mask;
    forming a second conductive film over the first conductive film after removing the first mask;
    performing a light exposure using a photomask after forming the second conductive film;
    forming second masks over the second conductive film after performing the light exposure; and
    forming a first conductive layer and a second conductive layer by selectively etching the second conductive film using the second masks,
    wherein the first conductive layer and the second conductive layer are over and in contact with a third conductive layer and a fourth conductive layer, respectively, and
    wherein the third conductive layer and the fourth conductive layer are over and in contact with an oxide semiconductor layer.

14. The method for manufacturing a semiconductor device according to claim 13,
    wherein a second gap between the first conductive layer and the second conductive layer is determined by the photomask, and
    wherein a gap between the third conductive layer and the fourth conductive layer is determined by the electron beam exposure.

15. The method for manufacturing a semiconductor device according to claim 13, wherein an area where the electron beam exposure is performed is 5% of a total area of the first conductive film, or less.

16. The method for manufacturing a semiconductor device according to claim 13, wherein the first mask and the second masks are resist masks.

17. The method for manufacturing a semiconductor device according to claim 13,
wherein the first mask has a plurality of slit-like grooves,
wherein a narrow side of one of the plurality of slit-like grooves in the first mask has a first width, and
wherein the third conductive layer and the fourth conductive layer are separated with a gap substantially equal to the first width.

* * * * *